United States Patent
Ito et al.

(10) Patent No.: US 7,507,606 B2
(45) Date of Patent: Mar. 24, 2009

(54) SEMICONDUCTOR DEVICE AND METHOD OF MANUFACTURING THE SAME

(75) Inventors: Fujio Ito, Hanno (JP); Hiromicti Suzuki, Tokyo (JP)

(73) Assignees: Renesas Technology Corp., Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 143 days.

(21) Appl. No.: 11/474,332

(22) Filed: Jun. 26, 2006

(65) Prior Publication Data
US 2006/0240600 A1 Oct. 26, 2006

Related U.S. Application Data

(62) Division of application No. 10/878,269, filed on Jun. 29, 2004, now Pat. No. 7,160,759, which is a division of application No. 10/299,768, filed on Nov. 20, 2002, now Pat. No. 6,809,405.

(30) Foreign Application Priority Data

Dec. 14, 2001 (JP) ............... 2001-381427
Oct. 4, 2002 (JP) ............... 2002-291975

(51) Int. Cl.
*H01L 21/48* (2006.01)
*H01L 21/44* (2006.01)
*H01L 21/50* (2006.01)

(52) U.S. Cl. ............... 438/123; 438/124; 438/112; 438/106

(58) Field of Classification Search ............... 438/106, 438/112, 123, 124, 127
See application file for complete search history.

(56) References Cited

U.S. PATENT DOCUMENTS

| | | | |
|---|---|---|---|
| 6,081,978 A * | 7/2000 | Utsumi et al. | 29/25.01 |
| 6,284,565 B1 | 9/2001 | Tachibana et al. | |
| 6,399,423 B2 | 6/2002 | Matsuura et al. | |
| 6,501,161 B1 * | 12/2002 | Lee | 257/676 |
| 6,537,858 B1 * | 3/2003 | Shibata | 438/124 |
| 6,563,209 B1 | 5/2003 | Takahashi | |

(Continued)

FOREIGN PATENT DOCUMENTS

JP 08-139259 5/1996

(Continued)

*Primary Examiner*—Luan C Thai
(74) *Attorney, Agent, or Firm*—Antonelli, Terry, Stout & Kraus, LLP.

(57) ABSTRACT

As a means for promoting the increase of the number of pins in a QFN (Quad Non-leaded package), a semiconductor die mounted on a die pad is arranged at the center of a plastic package, and a plurality of leads made of the same metal as the die pad and die pad supports are arranged around the die pad so as to surround the die pad. Lead tips on one side near the semiconductor die are electrically connected to bonding pads on a main surface of the semiconductor die via gold wires, and lead tips on the other side are ended at a side surface of the plastic package. In order to reduce the length between the semiconductor die and the leads, the lead tips on the one side are extended to positions close to the die pad, and the intervals between adjoining leads on the one side are smaller than those on the other side.

10 Claims, 61 Drawing Sheets

U.S. PATENT DOCUMENTS

| | | | |
|---|---|---|---|
| 6,611,047 B2 * | 8/2003 | Hu et al. | 257/666 |
| 6,642,609 B1 | 11/2003 | Minamio et al. | |
| 2006/0125064 A1 * | 6/2006 | Ito et al. | 257/666 |

FOREIGN PATENT DOCUMENTS

| | | |
|---|---|---|
| JP | 10-242363 | 9/1998 |
| JP | 2000-100843 | 4/2000 |
| JP | 2000-3072291 | 5/2000 |
| JP | 2000-286372 | 10/2000 |
| JP | 2001-24135 | 1/2001 |
| JP | 2001-189410 | 7/2001 |

* cited by examiner

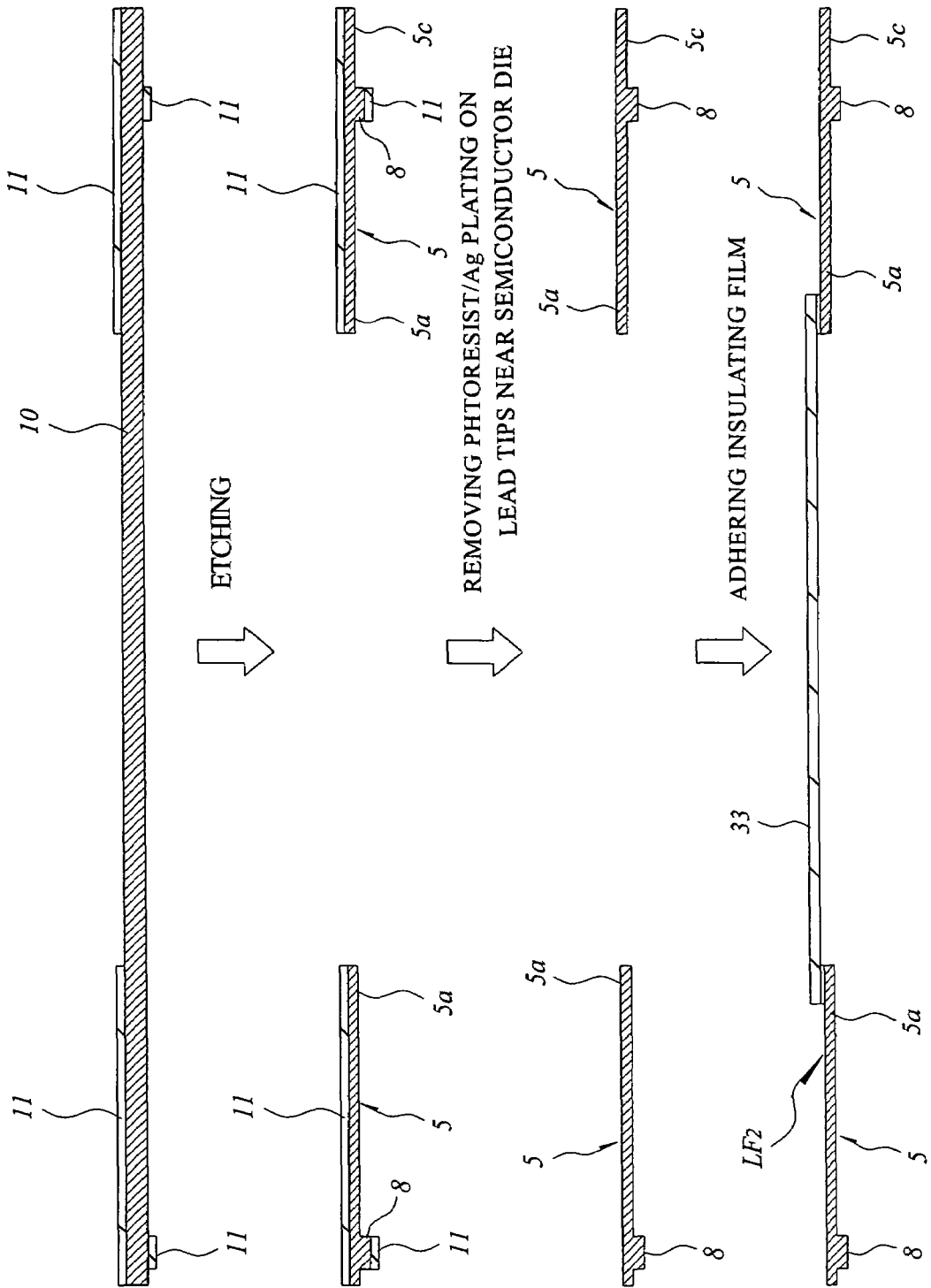

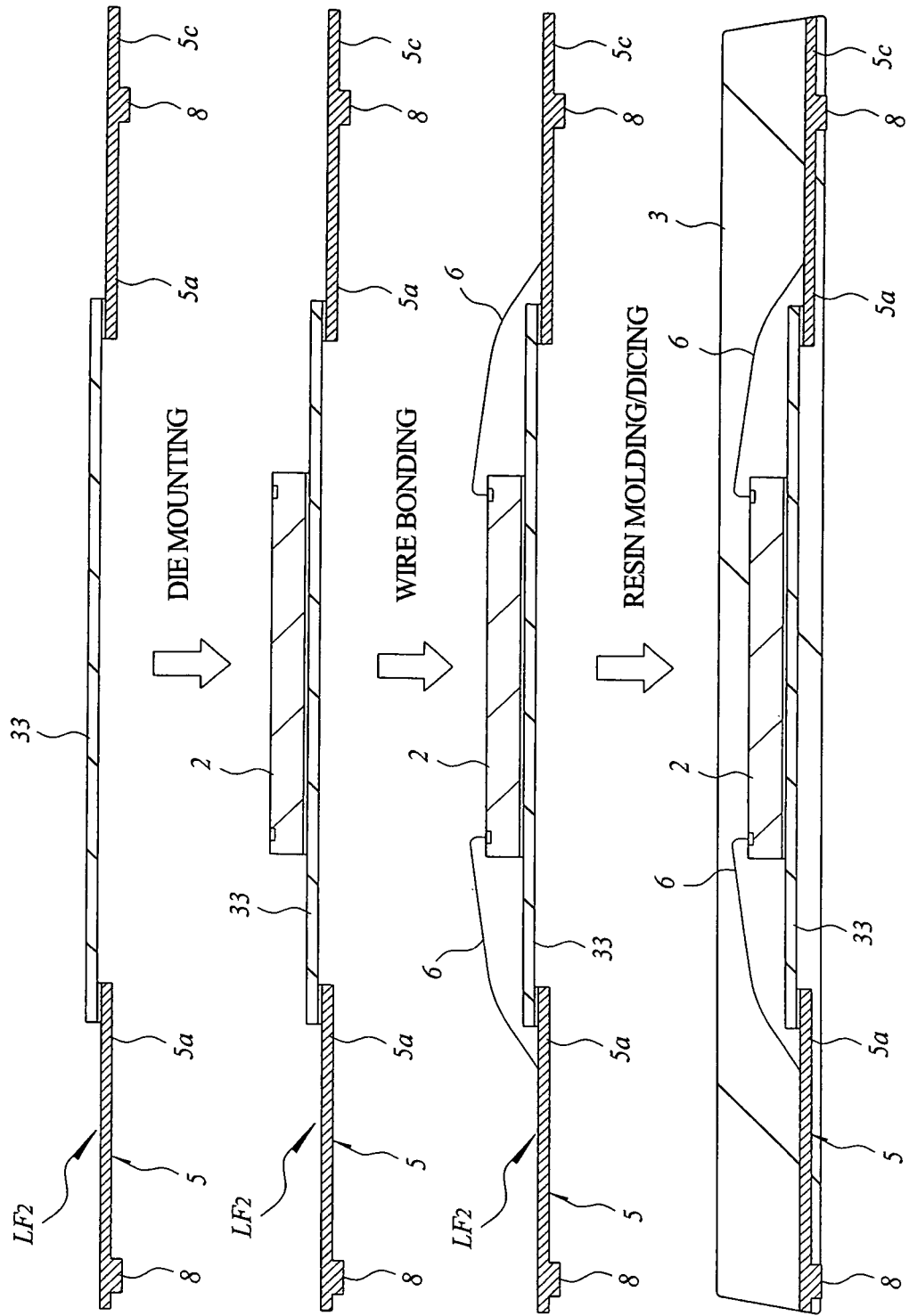

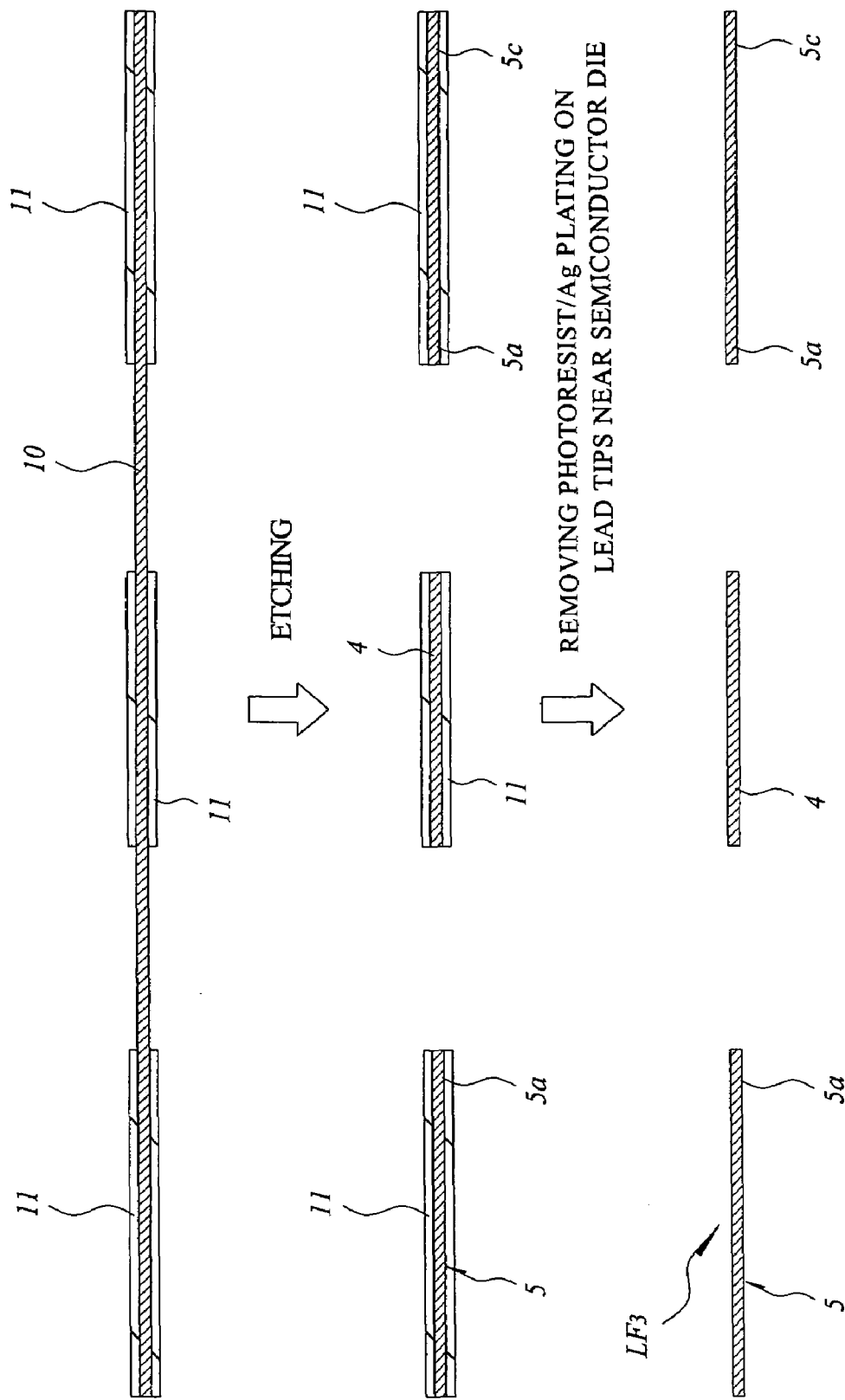

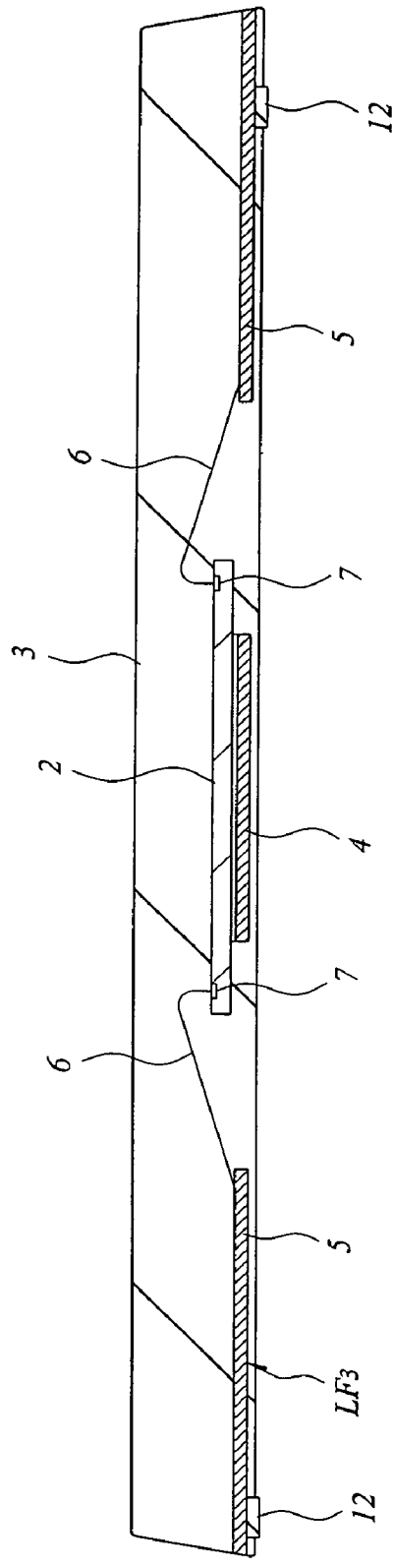
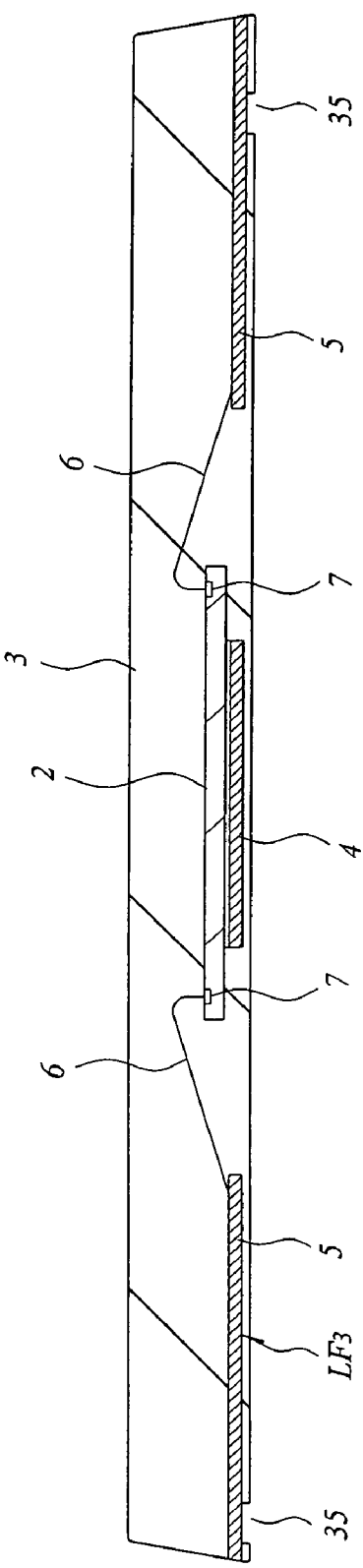
FIG. 27A
FIG. 27B

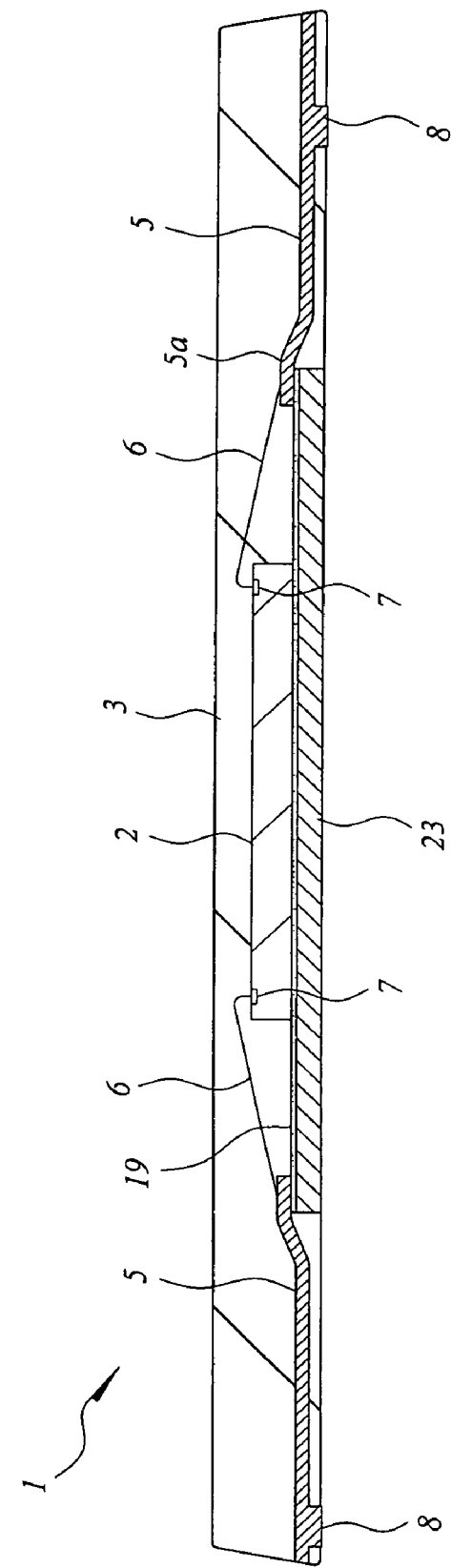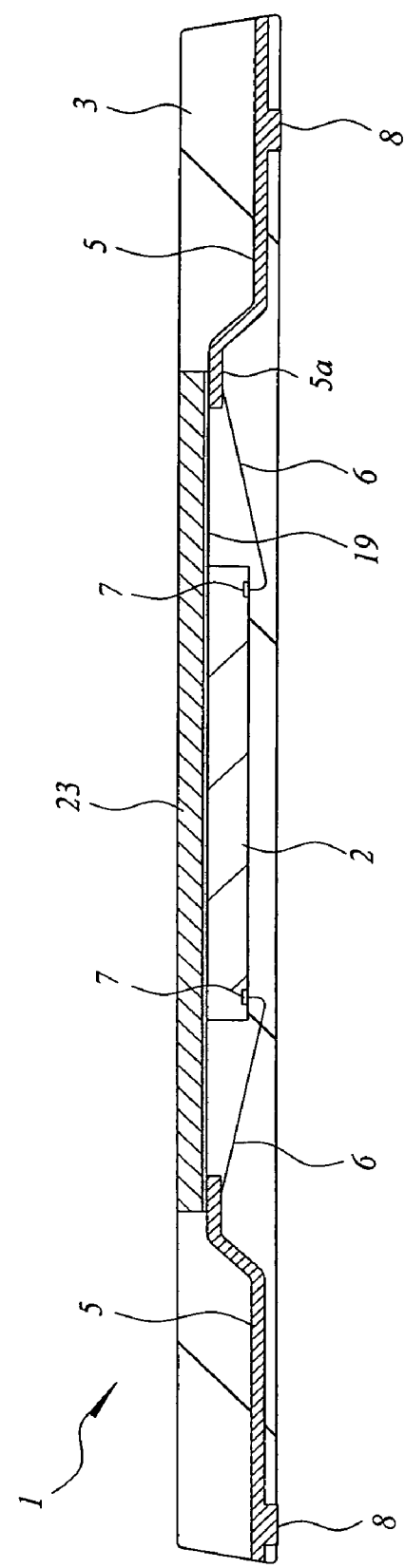

SEMICONDUCTOR DEVICE AND METHOD OF MANUFACTURING THE SAME

This application is a Divisional application of U.S. application Ser. No. 10/878,269, filed Jun. 29, 2004, now U.S. Pat. No. 7,160,759 which is, in turn, a Divisional application of U.S. application Ser. No. 10/299,768, filed Nov. 20, 2002; now U.S. Pat. No. 6,809,405 and the entire disclosures of which are hereby incorporated by reference.

TECHNICAL FIELD OF THE INVENTION

The present invention relates to a semiconductor device and a manufacturing method of the same. More particularly, the present invention relates to a technique effectively applicable to the increase of the number of pins used in a resin-encapsulated semiconductor device.

BACKGROUND OF THE INVENTION

A QFN (Quad Flat Non-leaded package) can be taken as an example of a resin package in which a semiconductor die mounted on a lead frame is encapsulated in a plastic package made of molding resin.

In the QFN, tip portions of a plurality of leads electrically connected to a semiconductor die via bonding wires are exposed from a rear surface (lower surface) of a peripheral part of a plastic package, by which terminals are formed. Also, bonding wires are connected to the surfaces opposite to the surfaces on which the terminals are exposed. More specifically, bonding wires are connected to the terminal surfaces inside the plastic package, by which the terminals and the semiconductor die are electrically connected to each other. The QFN is mounted on a wiring board by soldering these terminals to electrodes (footprint) on the wiring board. This structure of the QFN enables to obtain the advantage that the size of the mounting area can be reduced in comparison to a QFP (Quad Flat Package) in which the leads transversely extending from the side surfaces of a package (plastic package) constitute the terminals.

The descriptions of the QFN can be found in Japanese Patent Laid-Open No. 2001-189410 (corresponding U.S. Pat. No. 6,399,423) and Japanese Patent No. 3072291.

SUMMARY OF THE INVENTION

However, when the number of terminals is increased (increase of the number of pins) in accordance with the increasing advancement and higher performance of an LSI formed on the semiconductor die, the following problems arise in the QFN.

That is, since the bonding wires are connected to the surfaces opposite to terminal surfaces exposed on the rear surface of the plastic package as described above, the interval between the terminals is equal to the interval between the tip portions of the leads at which the bonding wires are connected. In addition, since a predetermined size of the terminal is necessary to ensure the reliability of the mounting, it is impossible to reduce the size too much.

Therefore, when it is intended to increase the number of pins without changing the size of the package, it is impossible to largely increase the number of terminals. Thus, it is impossible to largely increase the number of pins. Meanwhile, in the case where the size of the package is increased in order to increase the number of pins, the length between the semiconductor die and the position at which the bonding wire is connected becomes wider, and thus, the length of the bonding wire becomes longer. Therefore, the problem arises, that is, the adjoining wires are short-circuited in the wire bonding process and the resin molding process. As a result, the manufacturing yield is lowered.

Moreover, in the case where the semiconductor die is shrunk with an aim to reduce the manufacturing cost, the length between the semiconductor die and the position at which the bonding wire is connected becomes greater. As a result, a problem arises in that the connection by the use of the bonding wire cannot be made.

An object of the present invention is to provide a technique capable of achieving the increase of the number of pins in a QFN.

Another object of the present invention is to provide a technique to obtain a QFN which is adapted to deal with a reduction in die size.

The above and other objects and novel characteristics of the present invention will be apparent from the description and the accompanying drawings of this specification.

Typical ones of the inventive aspects disclosed in this application will be briefly described as follows.

A semiconductor device according to the present invention includes: a semiconductor die; a die pad on which the semiconductor die is mounted; a plurality of leads arranged around the semiconductor die; a plurality of wires for electrically connecting the semiconductor die and the leads; and a plastic package for encapsulating the semiconductor die, the die pad, the plurality of leads, and the plurality of wires, wherein the plurality of leads are formed so that intervals between lead tips on one side near the semiconductor die are narrower than those between leads tips on the other side opposite to the one side, and a terminal protruded from a rear surface of the plastic package to the outside is selectively provided to each of the plurality of leads.

A method of manufacturing a semiconductor device according to the present invention includes the steps of:

(a) preparing a lead frame on which patterns including the die pad and the plurality of leads are successively formed, and a terminal protruded in a direction perpendicular to a surface of the lead is formed on each surface of the plurality of leads;

(b) mounting a semiconductor die on each of the plurality of die pads formed on the lead frame, and connecting the semiconductor die and the parts of the leads by the use of wires;

(c) preparing a molding die having an upper die and a lower die, coating a surface of the lower die with a resin film, and then, mounting the lead frame on the resin film, thereby bringing the terminal formed on the surface of the lead into contact with the resin film;

(d) pressing the resin film and the lead frame with the upper die and the lower die to push tip portions of the terminals into the resin film;

(e) injecting resin into spaces between the upper and lower dies, thereby encapsulating the semiconductor die, the die pad, the leads, and the wires, and separating the lead frame from the molding die after forming a plurality of plastic packages in which the tip portions of the terminals are protruded to the outside; and (f) dicing the lead frame to obtain pieces of plastic packages.

BRIEF DESCRIPTIONS OF THE DRAWINGS

FIG. 23 is a sectional view of the principal part of a lead frame for illustrating the manufacturing method of a lead frame used in the manufacture of a semiconductor device according to another embodiment of the present invention;

FIG. 24 is a sectional view for illustrating the manufacturing method of a semiconductor device by the use of the lead frame shown in FIGS. 21 and 22;

FIG. 25 is a sectional view of the principal part in the manufacturing method of a semiconductor device according to another embodiment of the present invention;

FIG. 27A is a sectional view of the principal part in the manufacturing method of a semiconductor device according to another embodiment of the present invention;

FIG. 27B is a sectional view of the principal part in the manufacturing method of a semiconductor device according to another embodiment of the present invention;

FIG. 50A is a sectional view of a semiconductor device according to another embodiment of the present invention;

FIG. 50B is a sectional view of a semiconductor device according to another embodiment of the present invention;

DESCRIPTION OF THE PREFERRED EMBODIMENTS

Hereinafter, embodiments of the present invention will be described with reference to the accompanying drawings. Note that components having the same function are denoted by the same reference symbols throughout the drawings for describing the embodiments, and the repetitive description thereof is omitted.

First Embodiment

Figure 1:
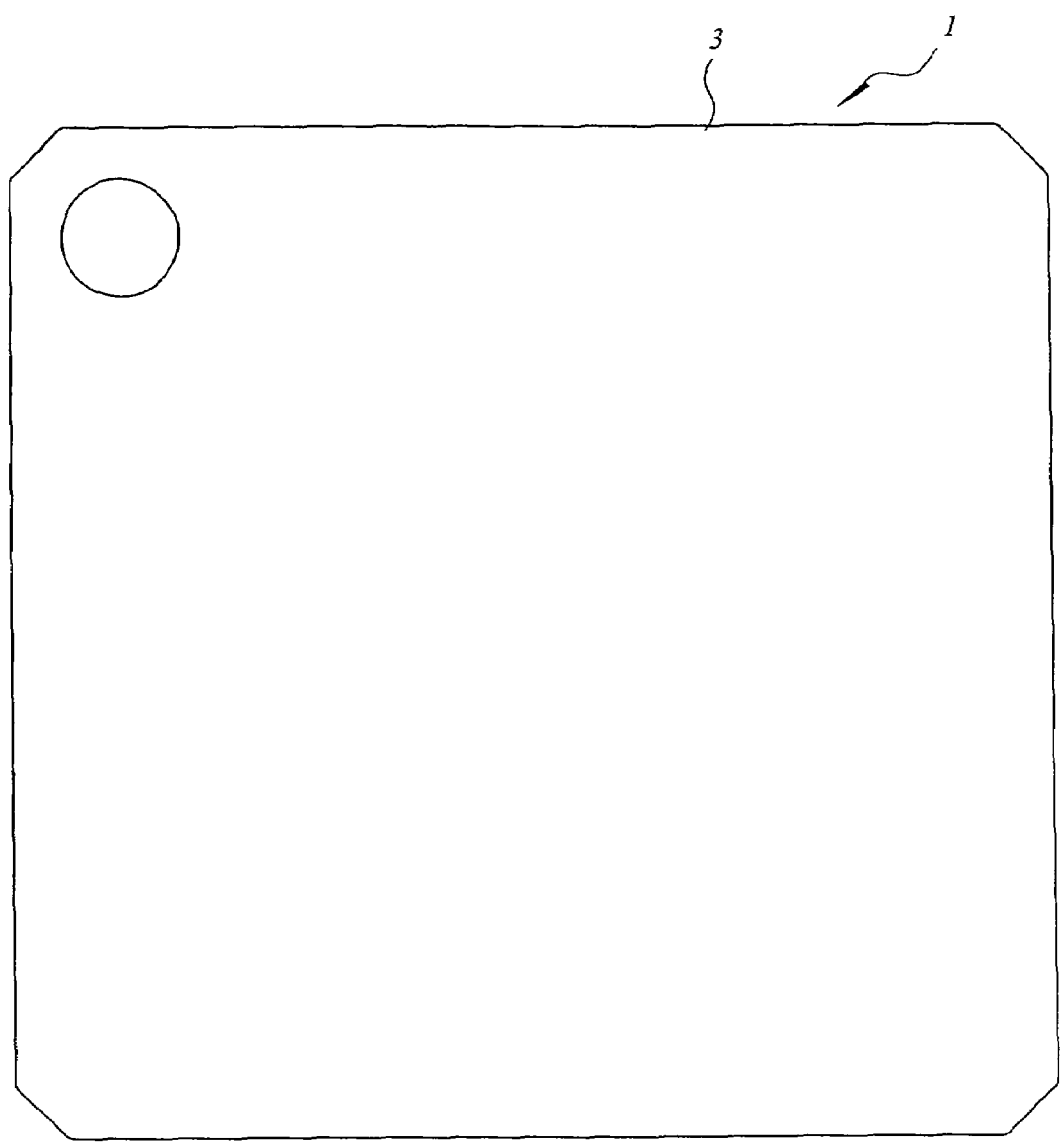
FIG. 1 is a plan view of an outward appearance (main surface side) of a semiconductor device according to an embodiment of the present invention.
Figure 2:
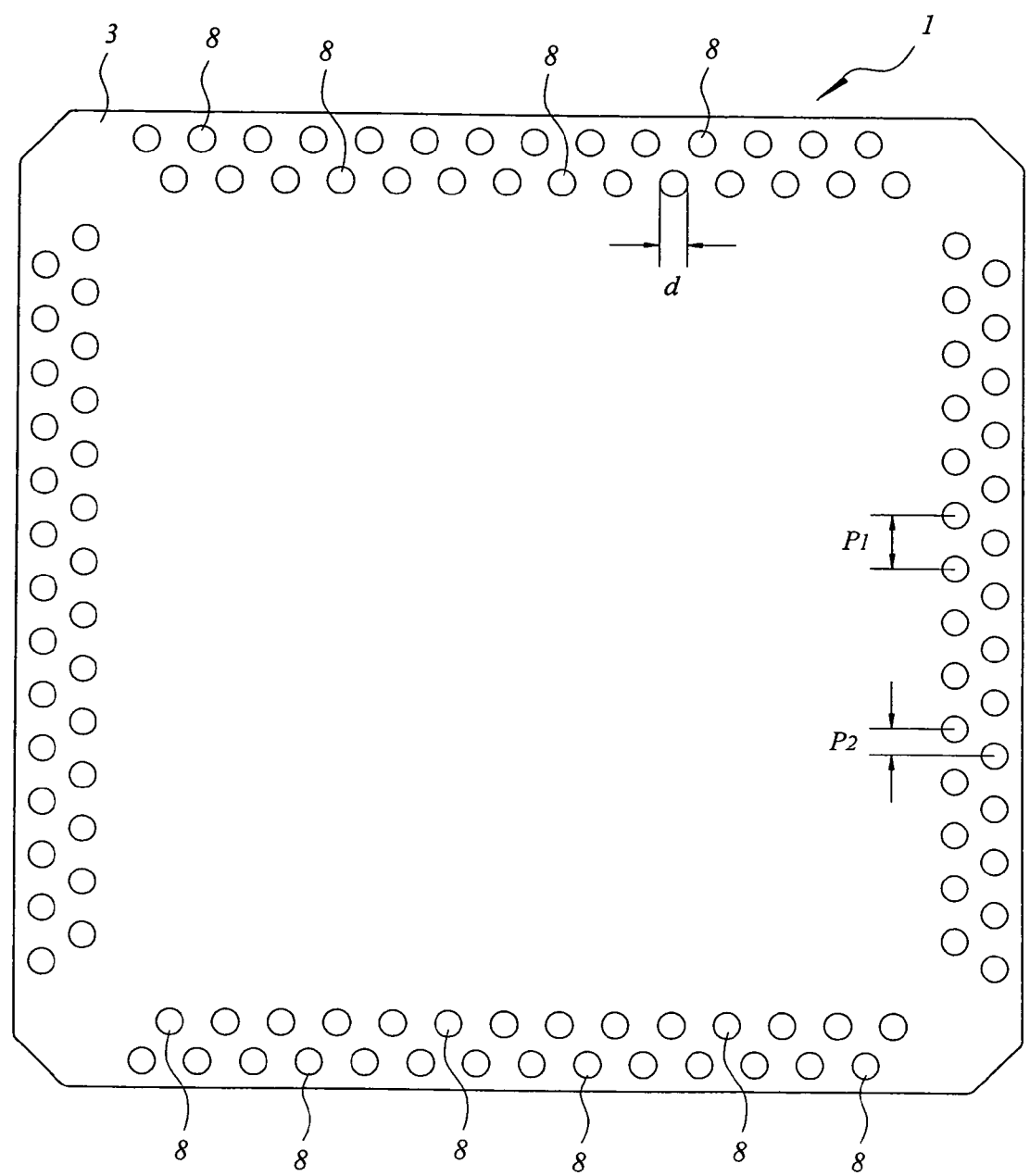
FIG. 2 is a plan view of an outward appearance (rear surface side) of a semiconductor device according to an embodiment of the present invention.
Figure 3:
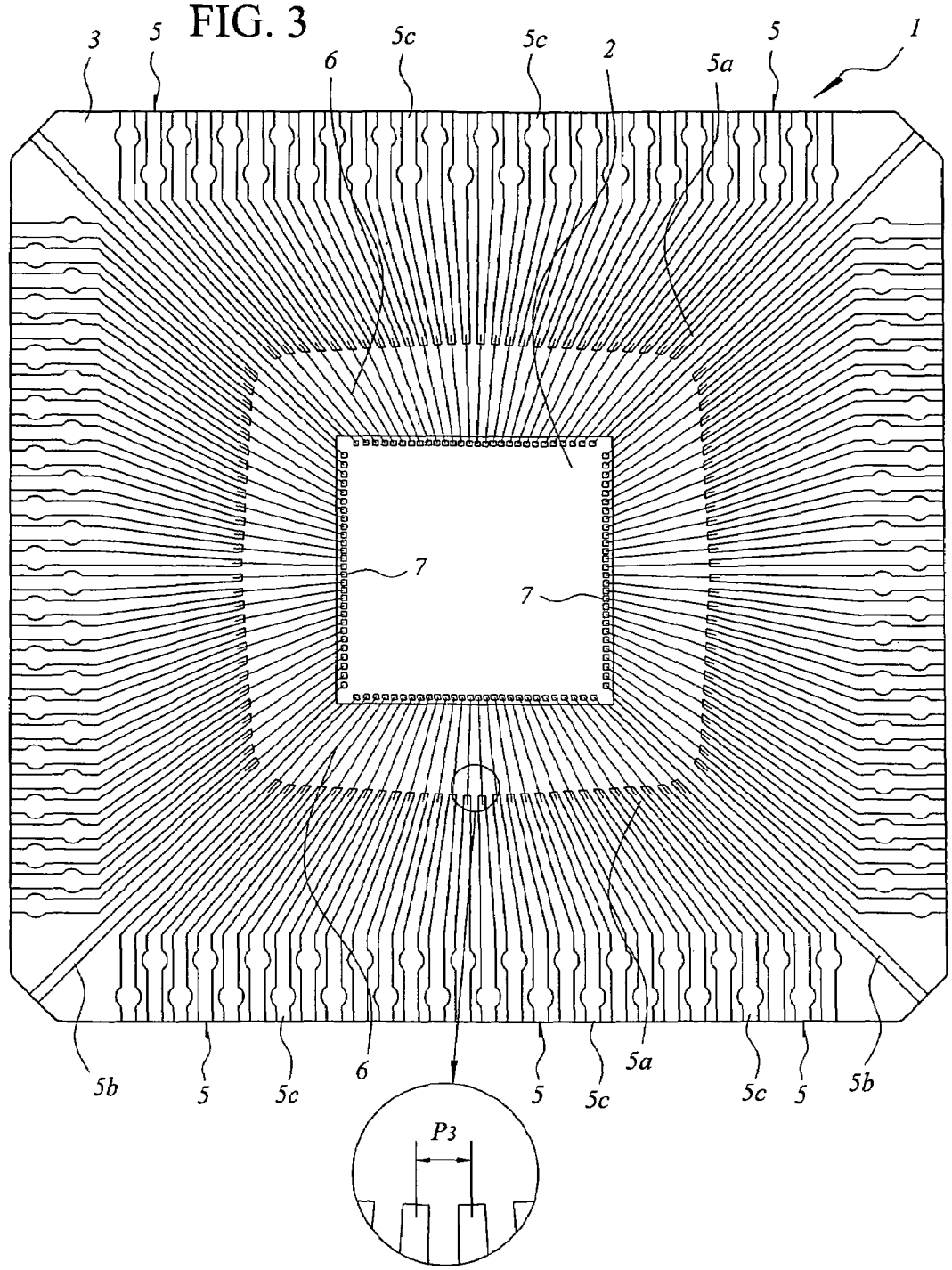
FIG. 3 is a plan view of an internal structure (main surface side) of a semiconductor device according to an embodiment of the present invention.
Figure 4:
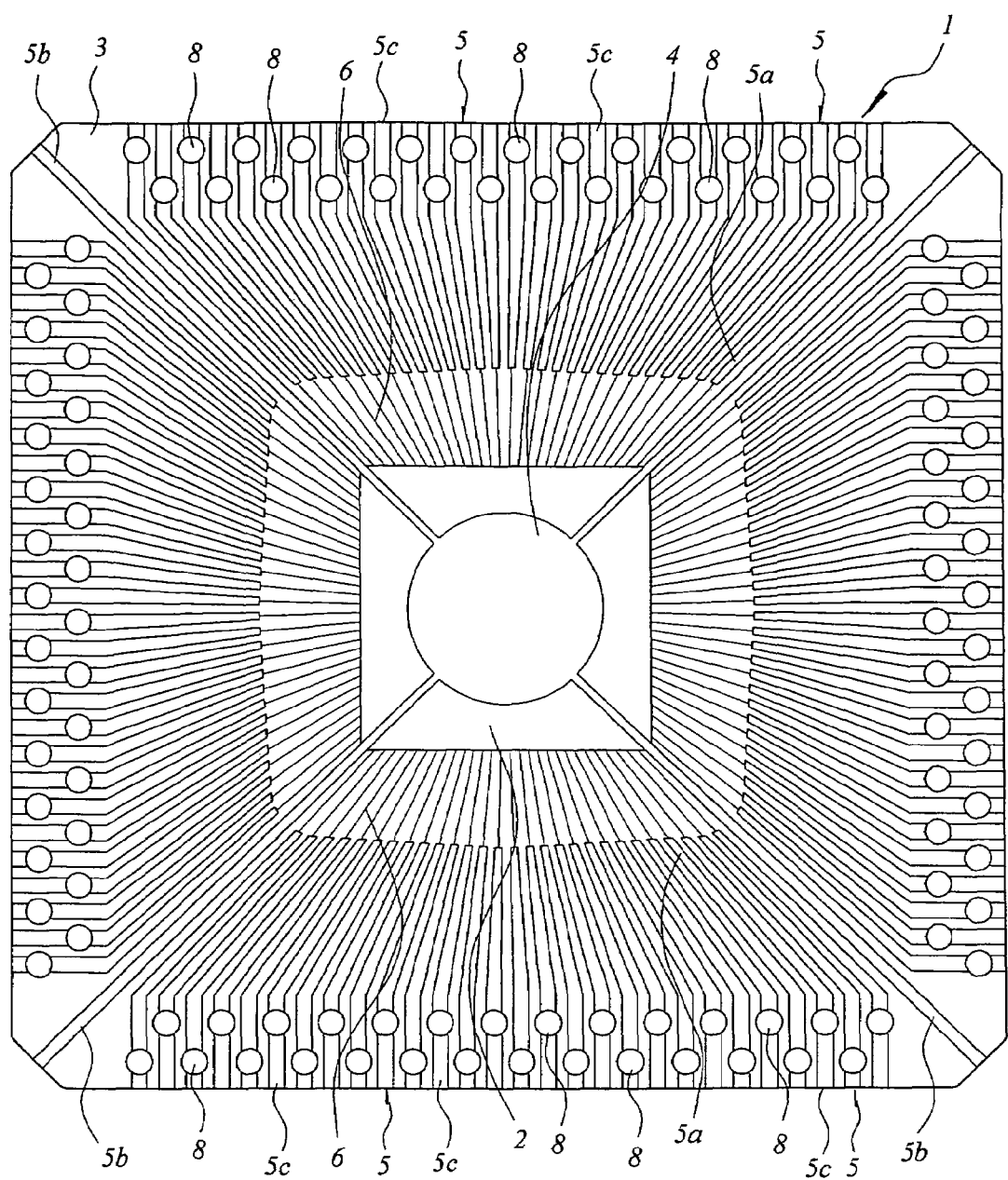
FIG. 4 is a plan view of an internal structure (rear surface side) of a semiconductor device according to an embodiment of the present invention.
Figure 5:
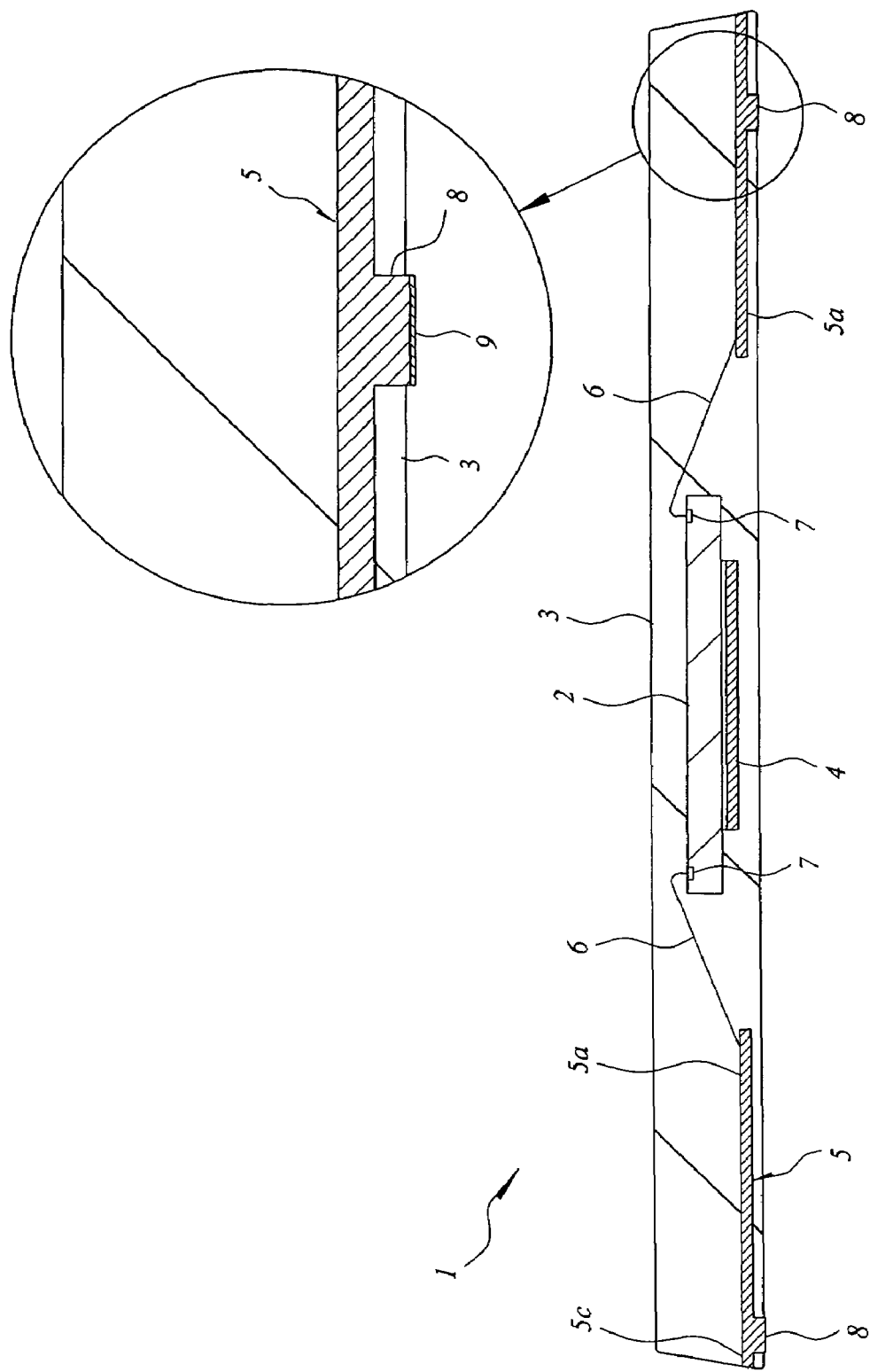
FIG. 5 is a sectional view of a semiconductor device according to an embodiment of the present invention.

FIG. 1 is a plan view showing an outward appearance (main surface side) of a QFN according to this embodiment, FIG. 2 is a plan view showing an outward appearance (rear surface side) of the QFN, FIG. 3 is a plan view showing an internal structure (main surface side) of the QFN, FIG. 4 is a plan view showing an internal structure (rear surface side) of the QFN, and FIG. 5 is a sectional view of the QFN.

The QFN 1 according to this embodiment is a surface mounting type package in which one semiconductor die 2 is encapsulated in a plastic package 3, and has dimensions of, for example, length 12 mm, width 12 mm, and thickness 1.0 mm.

The semiconductor die 2 is mounted on a metal die pad 4 and is arranged at the center of the plastic package 3. The semiconductor die 2 has a size of 4 mm on a side. The die pad 4 has a diameter smaller than that of the semiconductor die 2 (so called small tab structure) so as to enable the mounting of various types of semiconductor dies 2 with a size of 4 to 7 mm on a side. In this embodiment, the diameter of the die pad 4 is 3 mm. The die pad 4 is supported by four die pad supports 5*b* extending to the four corners of the plastic package 3. The die pad supports 5*b* are formed integrally with the die pad 4.

A plurality of (for example, 116) leads 5 made of the same metal as the die pad 4 and the die pad supports 5*b* are arranged around the die pad 4 so as to surround the same. Lead tip 5*a* of the lead 5 (on the side near the semiconductor die 2) is electrically connected to a bonding pad 7 on the main surface of the semiconductor die 2 via a gold wire 6, and lead tip 5*c* of the lead 5 (near the package edge) is ended at a side surface of the plastic package 3.

Each of the lead tips 5*a* near the semiconductor die is extended to a position close to the die pad 4 so as to reduce the length between the semiconductor die 2 and the leads 5, and the interval ($P_3$) between the tip portions of the leads 5 is narrow (0.18 mm to 0.2 mm). Therefore, the interval between adjoining lead tips 5*a* near the semiconductor die is smaller than the interval between adjoining lead tips 5*c* near the package edge. The leads 5 formed in the above-described shape make it possible to reduce the length of the gold wires 6 that connect the lead tips 5*a* near the semiconductor die and the bonding pads 7 (in this embodiment, 3 mm or shorter). Therefore, even if the number of pins in use is increased, and even if the interval between the leads 5 or the interval between the gold wires 6 is narrowed with the increase of the number of pins in use, it is possible to reduce the occurrence of defects such as a short-circuit between the gold wires 6 in the manufacturing process of the QFN 1 (for example, wire bonding process and resin molding process).

As shown in FIG. 2, a plurality of (for example, 116) external connection terminals 8 are provided on a rear surface (substrate mounting surface) of the QFN 1. These terminals 8 are arranged in two lines along each of the sides of the plastic package 3 in a zigzag pattern, and each of the tip portions of the terminals 8 is exposed from the rear surface of the plastic package 3 and protruded to the outside. The diameter (d) of the terminal 8 is 0.3 mm. The interval ($P_1$) between the adjoining terminals 8 in the same line is 0.65 mm, and the interval ($P_2$) between the interstitial terminals in different lines is 0.325 mm.

The terminal 8 in this embodiment is formed integrally with the lead 5, and the thickness of the terminal 8 is about 125 to 150 μm. In addition, the thickness of the part of the lead 5 other than the terminal 8, more specifically, the thickness of the lead tip 5*a* near the semiconductor die and that of the lead tip 5*c* near the package edge are about 65 to 75 μm. Also, at a tip portion of the terminal 8 protruded to the outside of the plastic package 3, a solder layer 9 is deposited by an electroplating method or a printing method. The QFN 1 in this embodiment is mounted by soldering the terminals 8 to electrodes (footprint) on a wiring board.

Figure 6:
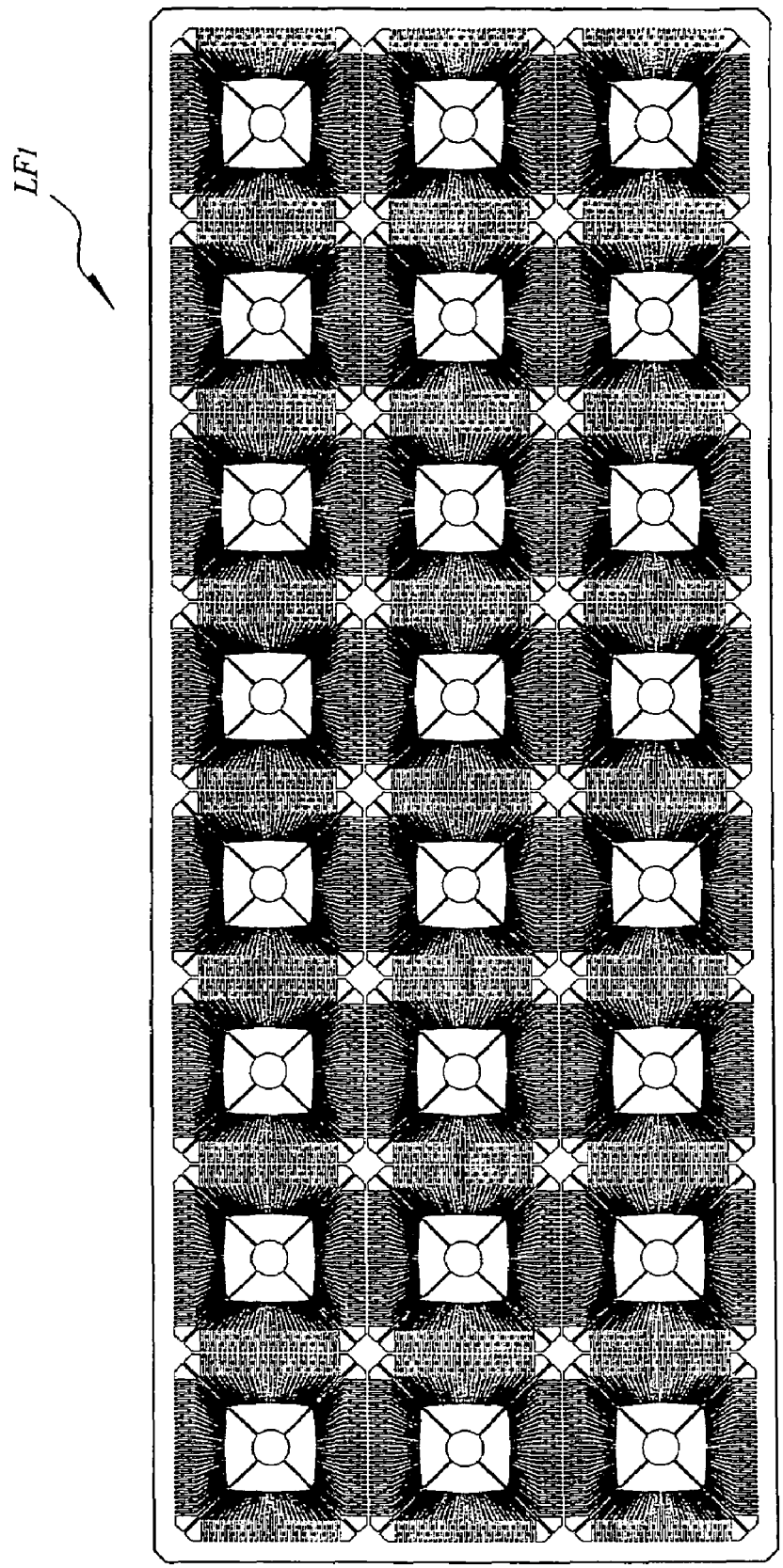
FIG. 6 is a plan view showing the entire lead frame used in the manufacture of a semiconductor device according to an embodiment of the present invention.

Next, the method of manufacturing the above-described QFN 1 will be described. First, a lead frame $LF_1$ as shown in FIG. 6 is prepared. The lead frame $LF_1$ is a metal sheet made of Cu, Cu alloy, or Fe—Ni alloy, in which above-described patterns such as die pads 4, leads 5, die pad supports 5*b*, and the like are successively formed laterally and longitudinally. More specifically, the lead frame $LF_1$ has a structure in which a plurality of (for example, 24) semiconductor dies are successively mounted.

Figure 7:
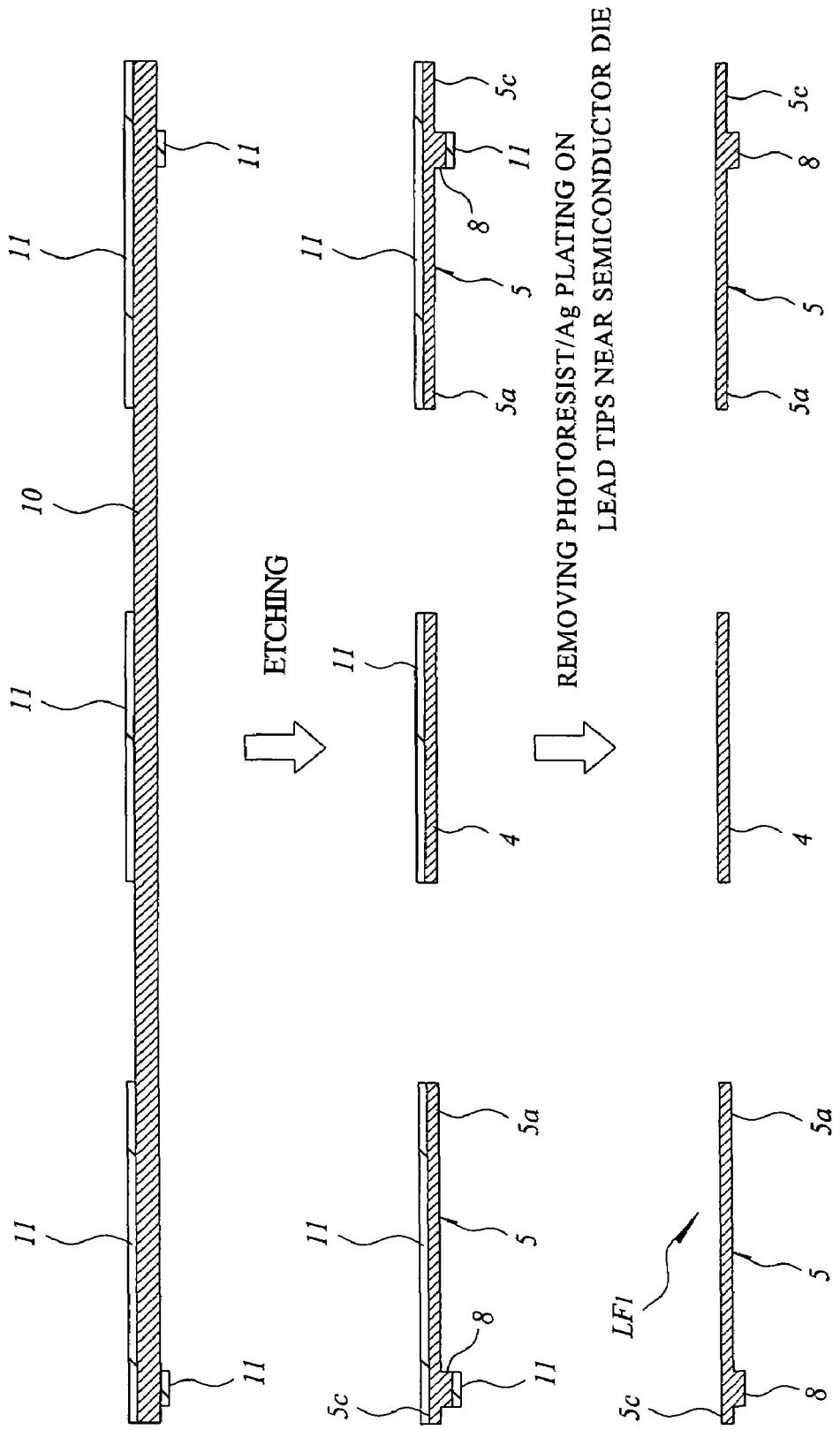
FIG. 7 is a sectional view of the principal part of the lead frame shown in FIG. 6 for illustrating the manufacturing method of the same.

The lead frame $LF_1$ is manufactured in the following manner. That is, a metal sheet 10 made of Cu, Cu alloy, or Fe—Ni alloy with a thickness of about 125 to 150 μm as shown in FIG. 7 is prepared, and one surface of the parts on the metal sheet 10 where the die pad 4, the leads 5, and the die pad supports 5*b* are formed is coated with a photoresist film 11. Also, both surfaces of the parts on the metal sheet 10 where the external connection terminals 8 are formed are coated with the photoresist film 11. Then, the metal sheet 10 in this state is etched by the use of etching solution, and the thickness of the metal sheet 10 whose one surface is coated with the photoresist film 11 is reduced to about a half (65 to 75 μm) (half etching). By the etching performed in this manner, the parts of the metal sheet 10 not coated with the photoresist film 11 on both faces are completely removed, and the die pad 4, the leads 5, and the die pad supports 5*b* each having a thickness of about 65 to 75 μm are formed on the parts of the metal sheet 10 whose one surface is coated with the photoresist film 11. Also, since the portions of the metal sheet 10 whose both surfaces are coated with the photoresist film 11 are not etched by the etching solution, protrusions to be the terminals 8 with the same thickness (125 to 150 μm) as that before the etching are formed in the parts.

Subsequently, the photoresist film 11 is removed, and then, the surfaces of the lead tips 5*a* near the semiconductor die are plated with silver. By doing so, the lead frame $LF_1$ shown in FIG. 6 is completed. Note that, instead of the silver plating to the lead tips 5*a* near the semiconductor die, the palladium (Pd) plating to the entire surface of the lead frame $LF_1$ is also available. Since a thickness of a plated layer by the palladium plating is thinner in comparison to that by the silver plating, it is possible to improve the bondability between the leads 5 and the gold wires 6. In addition, the plating on the entire surface of the lead frame $LF_1$ forms a plated layer also on the surface of the terminals 8. Therefore, it is possible to reduce the number of the plating processes.

As described above, the half etching is performed after coating, with the photoresist film 11, one surface of the parts of the metal sheet 10 to be a base material of the lead frame $LF_1$, and the thickness of the lead 5 is reduced to about half of the thickness of the metal sheet 10. In this manner, the leads 5 in which intervals between the lead tips 5*a* on one side are extremely narrow (in this embodiment, 0.18 to 0.2 mm interval) can be processed with high accuracy. In addition, by coating both surfaces of the parts of the metal sheet 10 with the photoresist film 11, it is possible to form the terminals 8 simultaneously with the formation of the die pad 4, the leads 5, and the die pad supports 5*b*.

Figure 8:
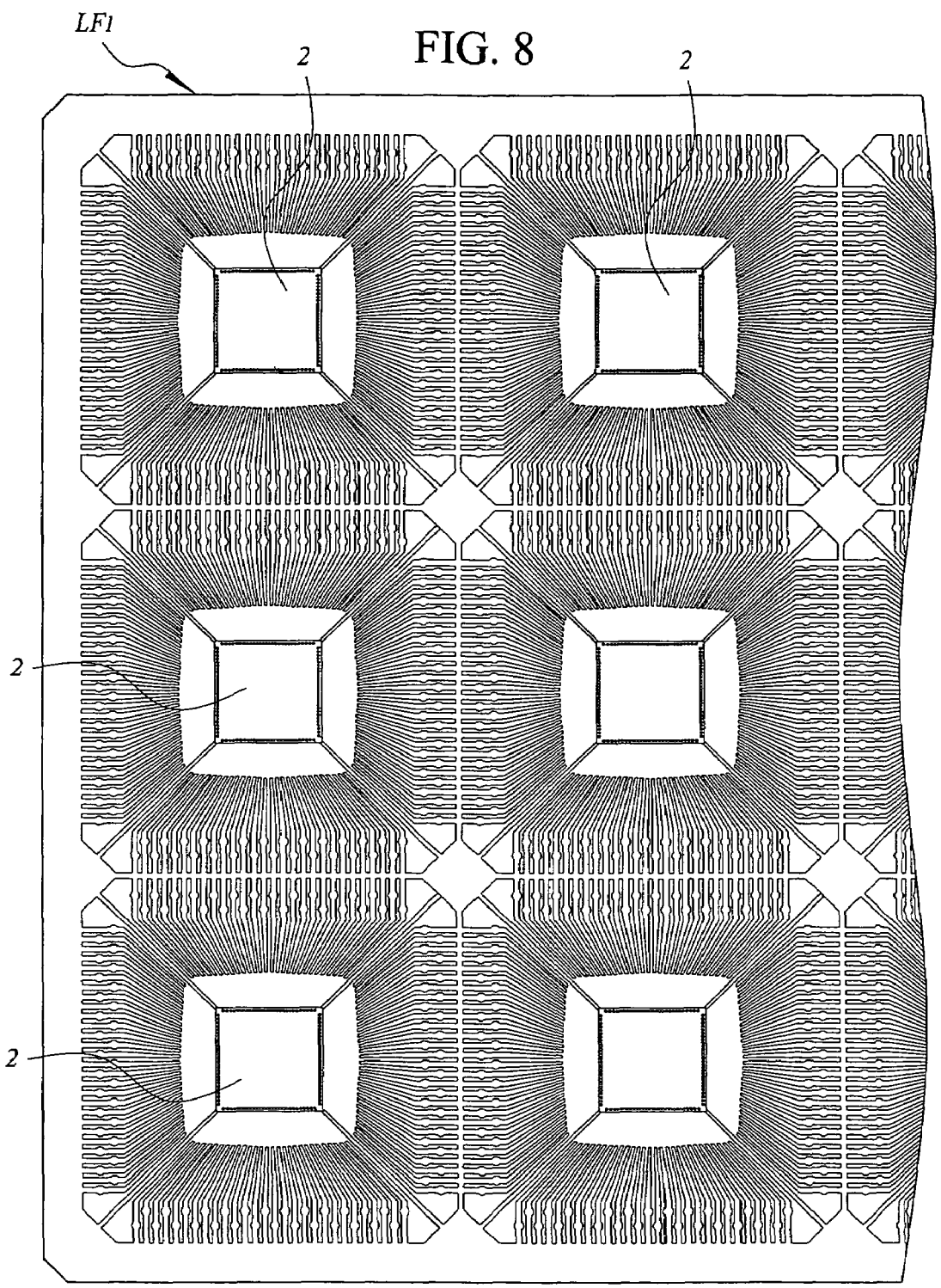
FIG. 8 is a plan view of the principal part of a lead frame for illustrating the manufacturing method of a semiconductor device according to an embodiment of the present invention.

Next, the manufacturing process of the QFN 1 using the lead frame $LF_1$ described above proceeds in the following manner. First, as shown in FIGS. 8 and 9, the semiconductor die 2 is mounted on the die pad 4, with a device forming surface of the semiconductor die 2 facing upward, and the semiconductor die 2 and the die pad 4 are adhered to each other by the use of adhesives such as gold paste and epoxy adhesive.

Figure 9:
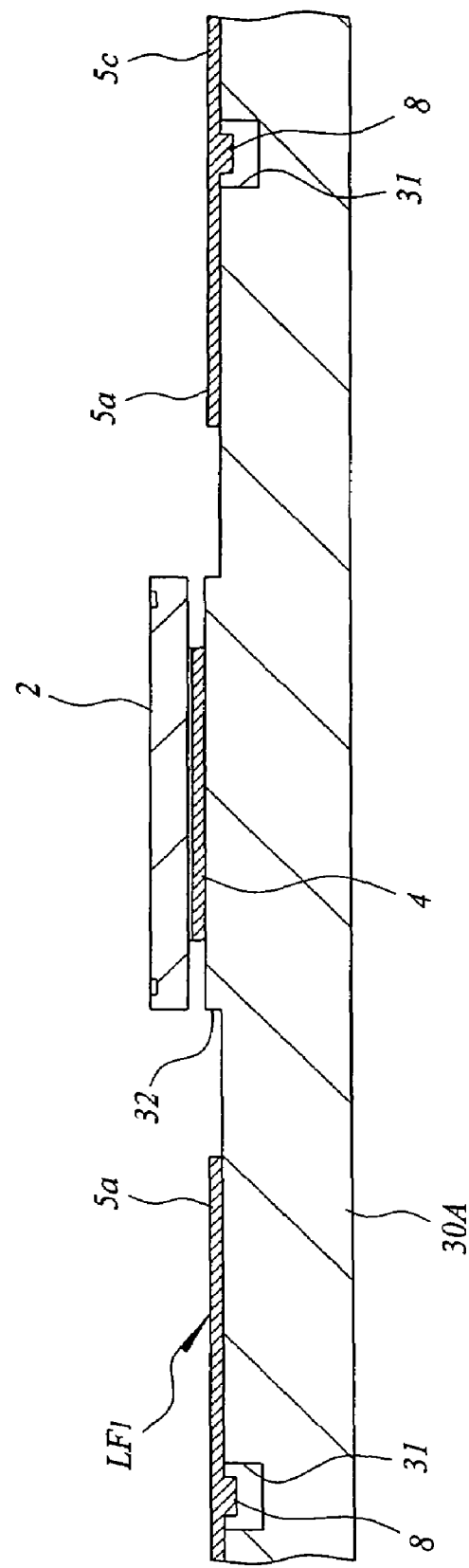
FIG. 9 is a sectional view of the principal part of a lead frame for illustrating the manufacturing method of a semiconductor device according to an embodiment of the present invention.

In this process, since there are protrusions of terminals 8 on the rear surface of the lead frame $LF_1$, it is preferable to form grooves 31 in a jig 30A that supports the lead frame $LF_1$ at positions corresponding to the protrusions of the terminals 8 as shown in FIG. 9. By doing so, it is possible to stably support the lead frame $LF_1$. Therefore, it is possible to prevent the occurrence of defects such as deformation of the lead frame $LF_1$ and misalignment between the die pad 4 and the semiconductor die 2 when mounting the semiconductor die 2 on the die pad 4.

Also, in order to allow the resin to flow uniformly in both the upper surface side and the lower surface side of the semiconductor die 2 mounted on a molding die during the resin molding, the QFN 1 in this embodiment has a structure in which the die pad 4 is located at a position higher than those of the leads 5 by partially bending the die pad supports 5*b* (tab-lifted structure). Accordingly, as shown in FIG. 9, a protrusion 32 is formed on the jig 30A at a position corresponding to the die pad 4, which makes it possible to stably support the lead frame $LF_1$. Therefore, it is possible to prevent the occurrence of defects such as deformation of the lead frame LF₁ and misalignment between the die pad 4 and the semiconductor die 2 when mounting the semiconductor die 2 on the die pad 4.

Figure 10:
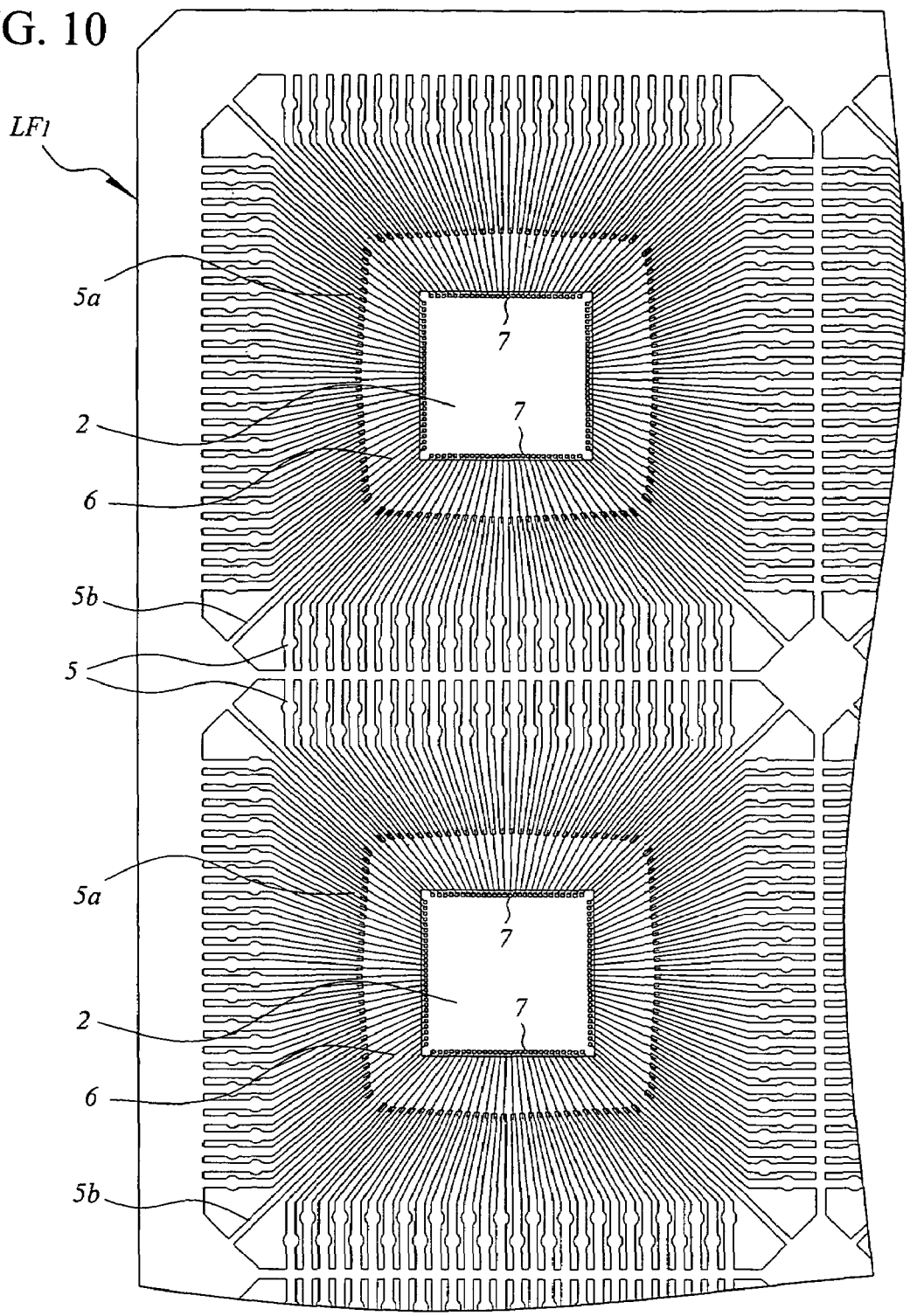
FIG. 10 is a plan view of the principal part of a lead frame for illustrating the manufacturing method of a semiconductor device according to an embodiment of the present invention.
Figure 11:
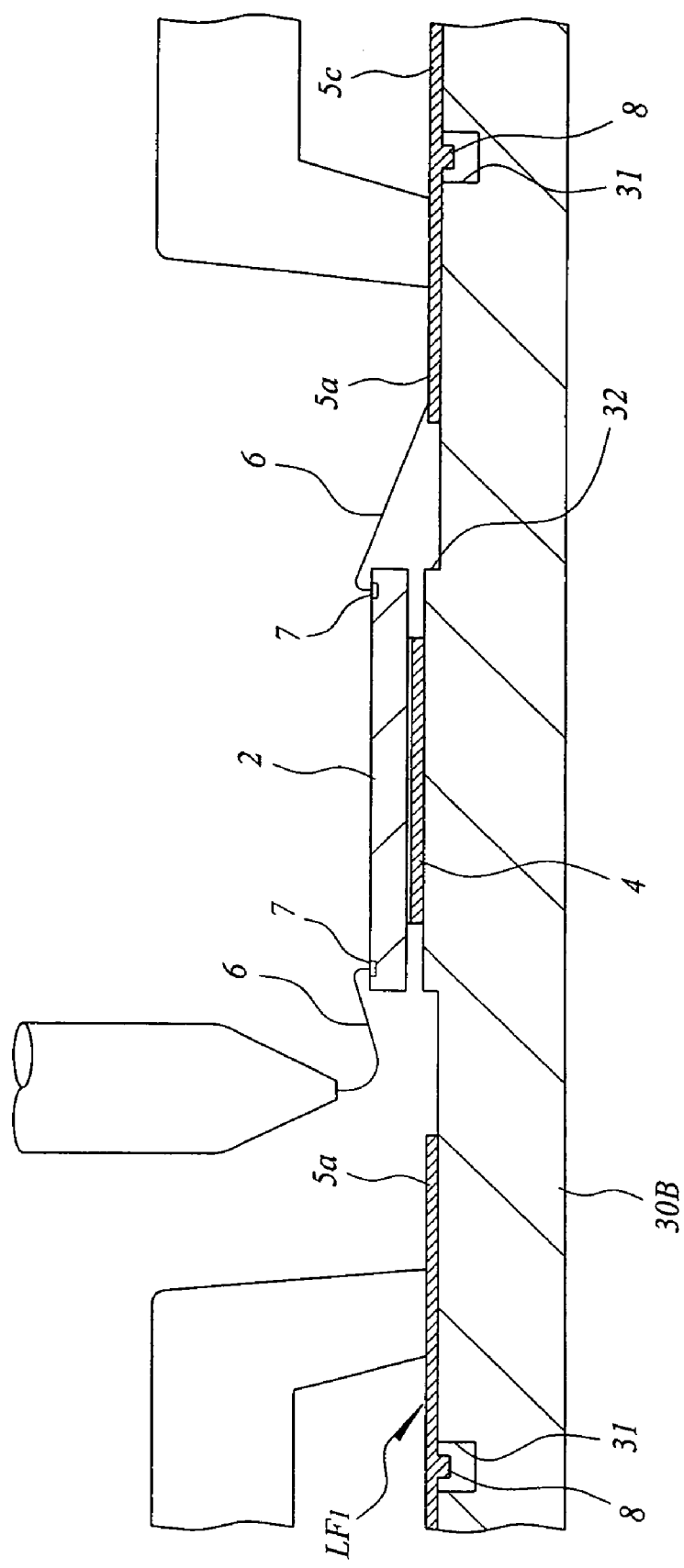
FIG. 11 is a sectional view of the principal part of a lead frame for illustrating the manufacturing method of a semiconductor device according to an embodiment of the present invention.

Next, as shown in FIGS. 10 and 11, the bonding pads 7 on the semiconductor die 2 and the lead tips 5a in one side of the leads 5 are connected by the gold wires 6 by the use of a well-known ball bonding apparatus. Also in this case, as shown in FIG. 11, the stable support of the lead frame LF₁ can be achieved by forming the grooves 31 in a jig 30B that supports the lead frame LF₁ at positions corresponding to the terminals 8 and forming the protrusion 32 on the jig 30B at a position corresponding to the die pad 4. Therefore, the misalignment between the gold wires 6 and the leads 5 and the misalignment between the gold wires 6 and the boding pads 7 can be prevented.

Figure 12:
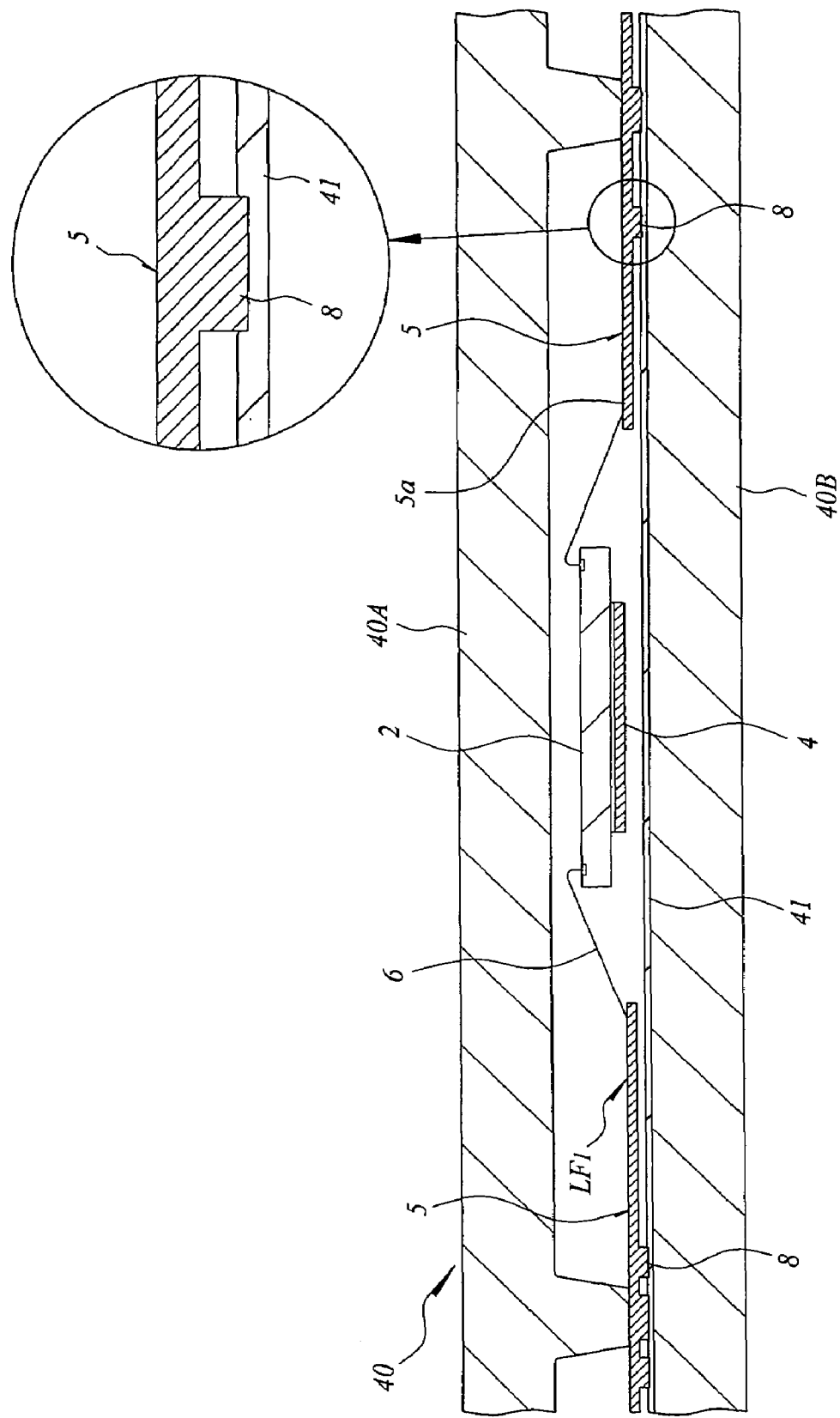
FIG. 12 is a sectional view of the principal part of a lead frame and a molding die for illustrating the manufacturing method of a semiconductor device according to an embodiment of the present invention.

Subsequently, the lead frame LF₁ is mounted on a molding die 40 shown in FIG. 12, and then, the semiconductor die 2 is resin-encapsulated. FIG. 12 is a sectional view showing a part of the molding die 40 (area in which one QFN is formed).

In this resin encapsulation of the semiconductor die 2 using the molding die 40, a thin resin film 41 is first laid on a surface of a lower die 40B, and the lead frame LF₁ is placed on the resin film 41. In this case, the surface of the lead frame LF₁ on which the protrusions of the terminals 8 are formed is faced downward, and then, the lead frame LF₁ is placed to contact the terminals 8 and the resin film 41. In this state, the resin film 41 and the lead frame LF₁ are pressed by the upper die 40A and the lower die 40B. By doing so, as shown in FIG. 12, the terminals 8 on the lower surface of the leads 5 are pressed to the resin film 41 by the pressing force of the molding die 40 (upper die 40A and lower die 40B), and the tip portions of the terminals 8 are pushed into the resin film 41.

Figure 13:
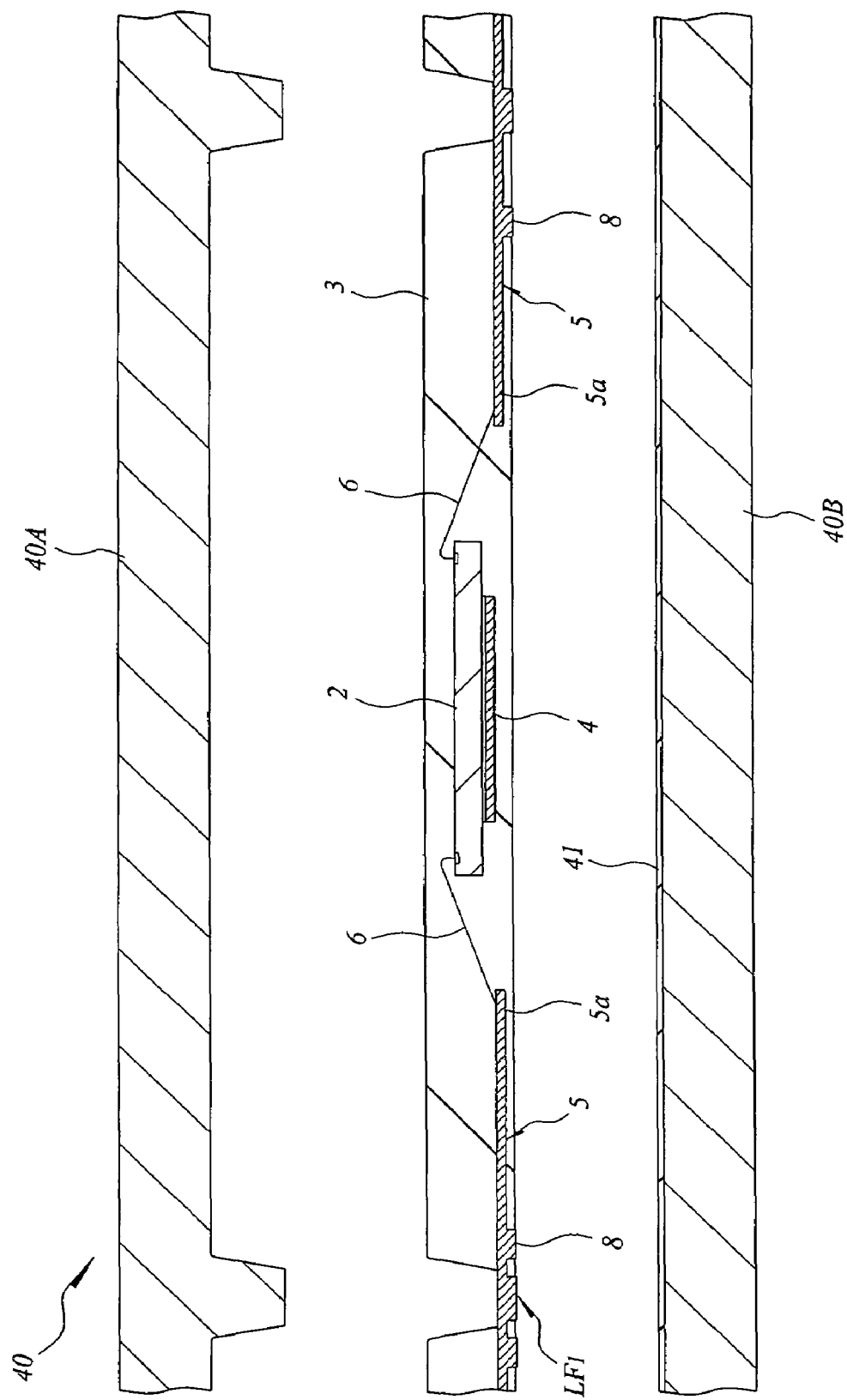
FIG. 13 is a sectional view of the principal part of a lead frame and a molding die for illustrating the manufacturing method of a semiconductor device according to an embodiment of the present invention.

Subsequently, as shown in FIG. 13, molten resin is injected into a space (cavity) between the upper die 40A and the lower die 40B to cast the molding resin, thereby forming the plastic package 3. Thereafter, the upper die 40A and the lower die 40B are separated from each other, and the tip portions of the terminals 8 pushed into the resin film 41 protrude to the outside from the rear surface of the plastic package 3.

Note that, when pressing the upper surface of the lead frame LF₁ by the upper die 40A, an upward force works on the lead tips 5a, which are tip portions on one side of the leads 5, due to the spring force of the metal sheet that constitutes the lead frame LF₁. Therefore, if the terminals 8 are arranged in two lines like in the lead frame LF₁ in this embodiment, the force of the terminal 8 to press the resin film 41 differs between the lead 5 in which the terminal 8 is formed near the lead tip 5a and the lead 5 in which the terminal 8 is formed apart from the lead tip 5a. More specifically, the force to press the resin film 41 of the terminal 8 formed near the lead tip 5a is weaker in comparison that of the terminal 8 formed apart form the lead tip 5a (=near the contact portion between the upper die 40A and the lead 5). As a result, there is a difference in height between the terminal 8 formed near the lead tip 5a and protruded from the rear surface of the plastic package 3 and the terminal 8 formed apart from the lead tip 5a. If these terminals 8 are soldered to the electrodes (footprint) on the wiring board, the difference in height may cause the open defect in which some terminals 8 and the electrodes are not contacted.

Figure 14:
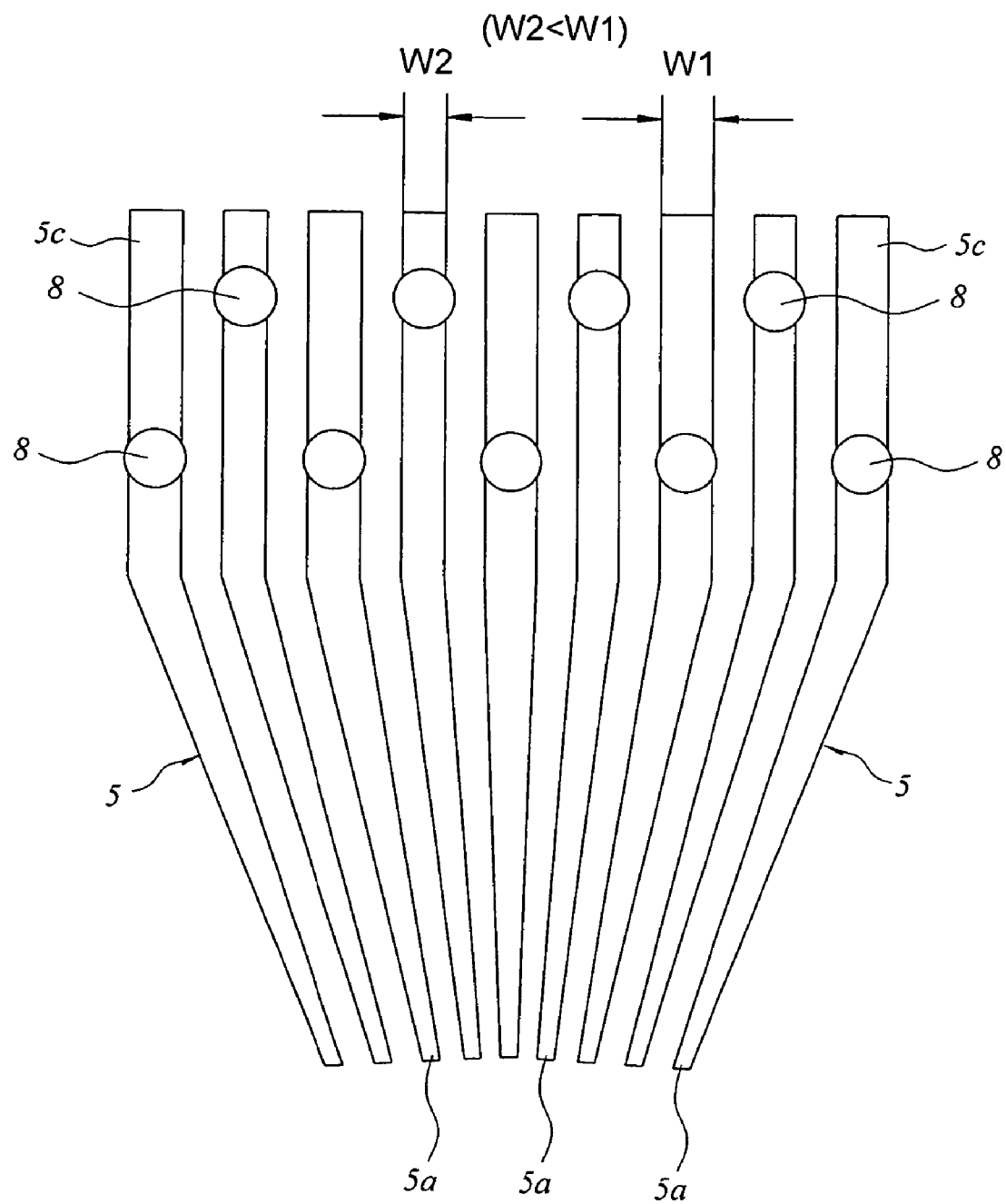
FIG. 14 is a plan view of the principal part of a lead frame for illustrating the manufacturing method of a semiconductor device according to an embodiment of the present invention.

For the solution of the problem, as shown in FIG. 14, the width (W₁) of the lead 5 on which the terminal 8 is formed near the lead tip 5a is made larger than the width (W₂) of the lead 5 on which the terminal 8 is formed apart form the lead tip 5a (W₂<W₁). By doing so, the forces of the terminals 8 to press the resin film 41 become almost equal to each other in all of the leads 5. Therefore, the lengths of the terminals 8 pushed into the resin film 41, in other words, the heights of the tip portions of the terminals 8 protruded to the outside from the rear surface of the plastic package 3 become almost equal to each other in all of the leads 5.

Also, as described above, since the patterns (die pad 4, lead 5, die pad support 5b and the like) in the lead frame LF₁ used in this embodiment are formed by the half etching, the thickness of the lead 5 is reduced to about the half of the normal lead frame 5. Therefore, the force of the molding die 40 (upper die 40A and lower die 40B) to press the lead frame LF₁ is weaker than that in the case where a normal lead frame is used. Accordingly, the force of the terminal 8 to press the resin film 41 is weaker, and thus, the height of the terminal 8 protruded to the outside of the plastic package 3 is reduced.

Figure 15:
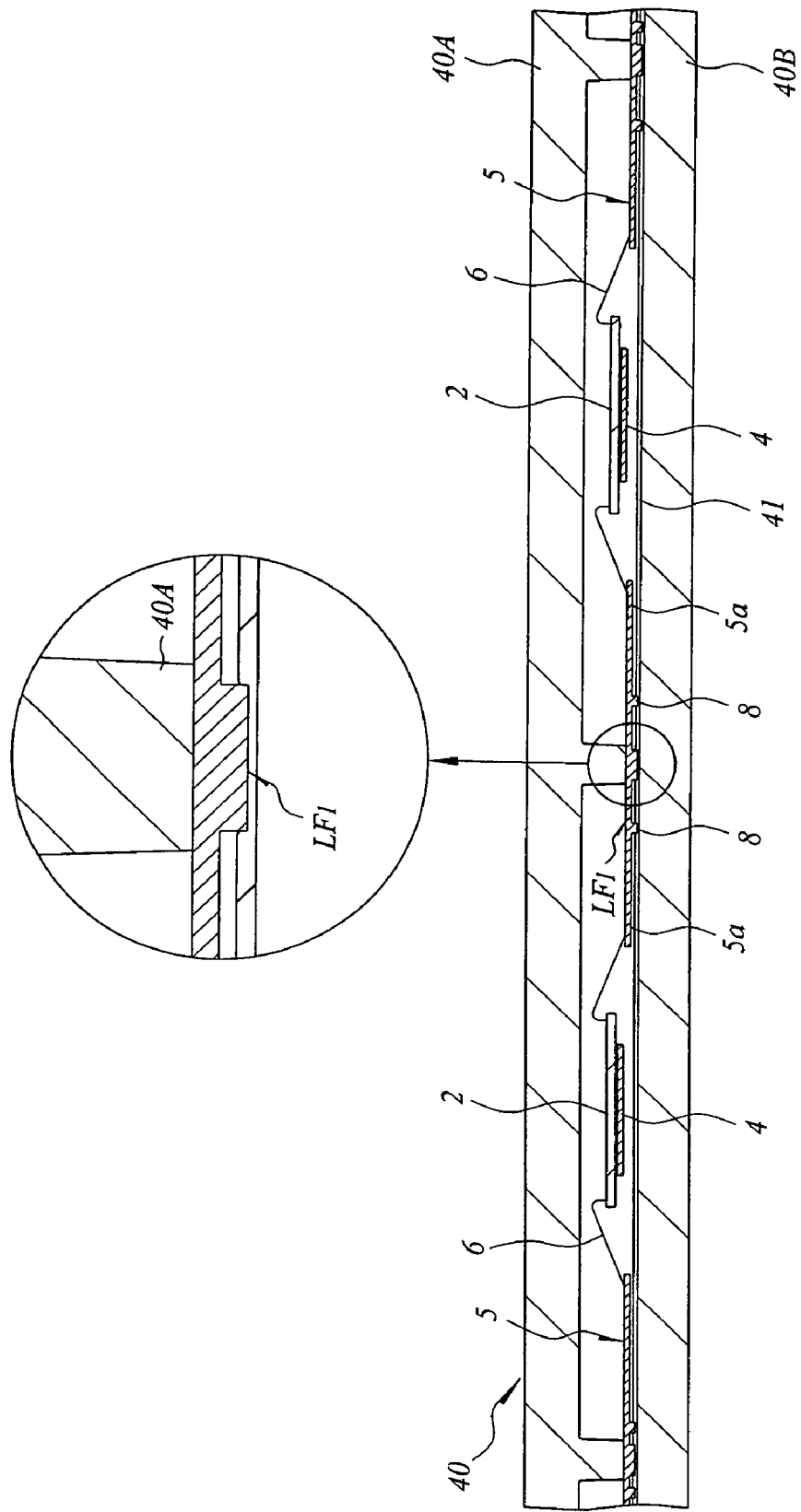
FIG. 15 is a sectional view of the principal part of a lead frame and a molding die for illustrating the manufacturing method of a semiconductor device according to an embodiment of the present invention.

When it is intended to increase the height of the terminal 8 protruded to the outside of the plastic package 3, the half etching is not performed to the part of the lead frame LF₁ that contacts to the upper die 40A (enclosed by a circle in FIG. 15) so as to keep the thickness of the part equal to that of the terminal 8.

Figure 16:
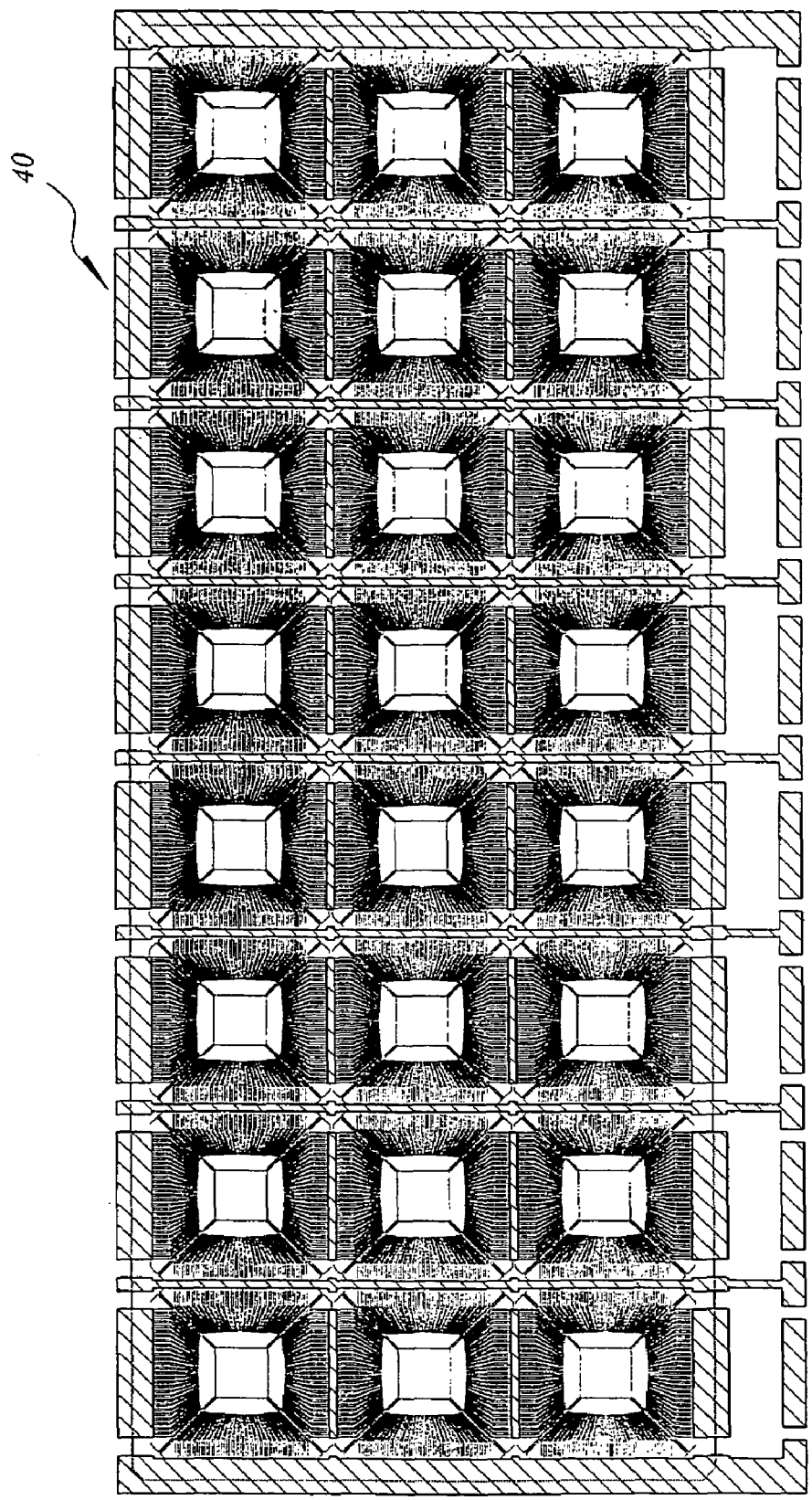
FIG. 16 is a plan view showing the positions where the lead frame contacts to an upper die of the molding die used in the manufacture of a semiconductor device according to an embodiment of the present invention.

FIG. 16 is a plan view in which the positions where the upper die 40A of the molding die 40 and the lead frame LF₁ are contacted are marked with diagonal lines. Also, FIG. 17 is a plan view schematically showing the positions of gates of the molding die 40 and showing the directions of the resin flow injected into cavities.

As shown in FIG. 16, the upper die 40A of the molding die 40 contacts only to the outer frame of the lead frame LF₁ and the connection parts between the leads 5, and other areas are effectively used as cavities in which the resin is injected.

Figure 17:
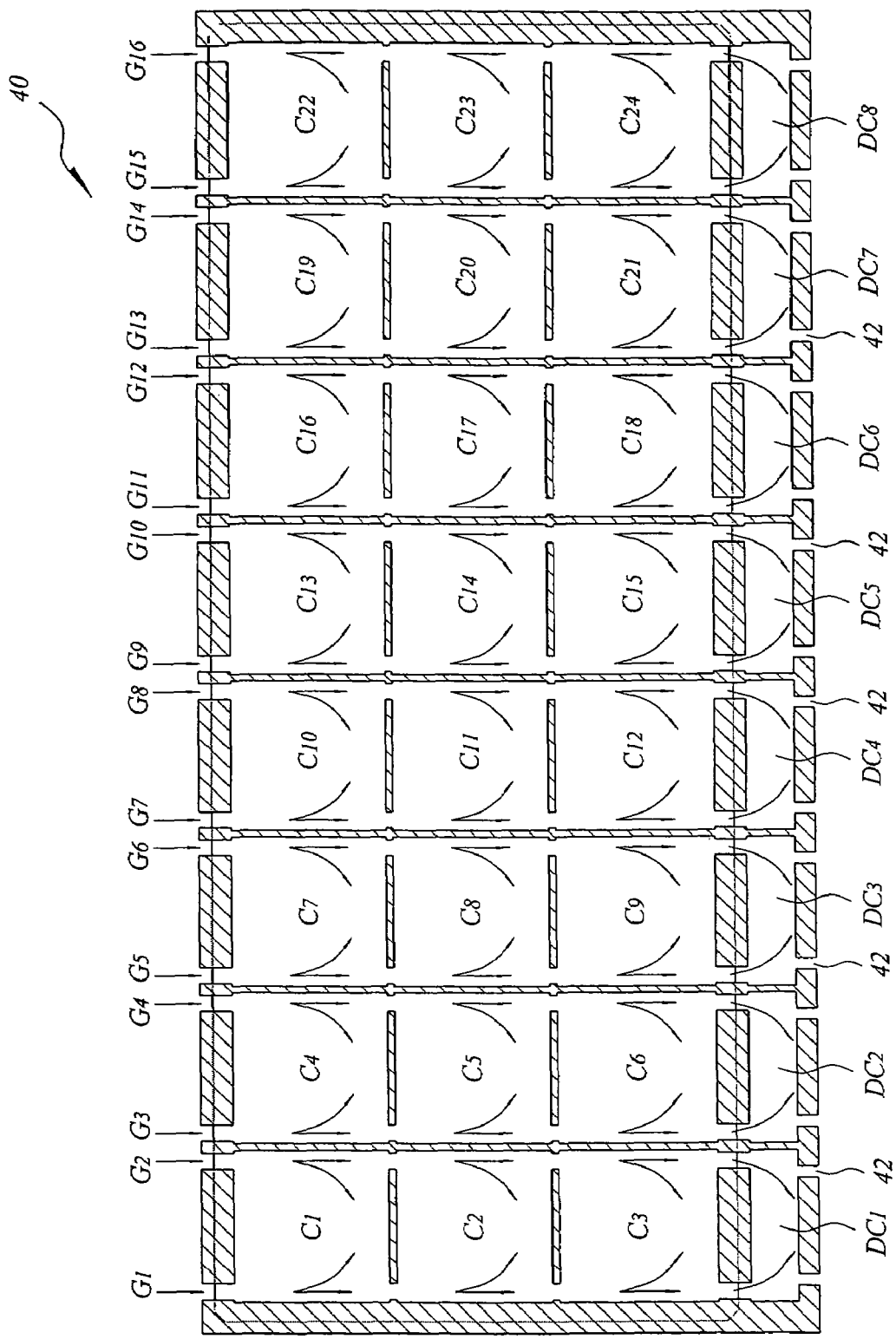
FIG. 17 is a plan view schematically showing the flowing directions of resin injected in cavities and the positions of gates of the molding die used in the manufacture of a semiconductor device according to an embodiment of the present invention.

In addition, as shown in FIG. 17, a plurality of gates $G_1$ to $G_{16}$ are provided on one side of the molding die 40, and, for example, the resin is injected through the gates $G_1$ and $G_2$ into the longitudinally arranged three cavities $C_1$ to $C_3$ on the left side of FIG. 17. The resin is injected through the gates $G_3$ and $G_4$ into the three cavities $C_4$ to $C_6$ adjoining the cavities $C_1$ to $C_3$. Meanwhile, on the side opposite to the gates $G_1$ to $G_{16}$, dummy cavities $DC_1$ to $DC_8$ and air vents 42 are provided. For example, when the resin is injected through the gates $G_1$ and $G_2$ into the cavities $C_1$ to $C_3$, the air in the cavities $C_1$ to $C_3$ is flown to the dummy cavity $DC_1$, which makes it possible to prevent the void created in the resin in the cavity $C_3$.

Figure 18:
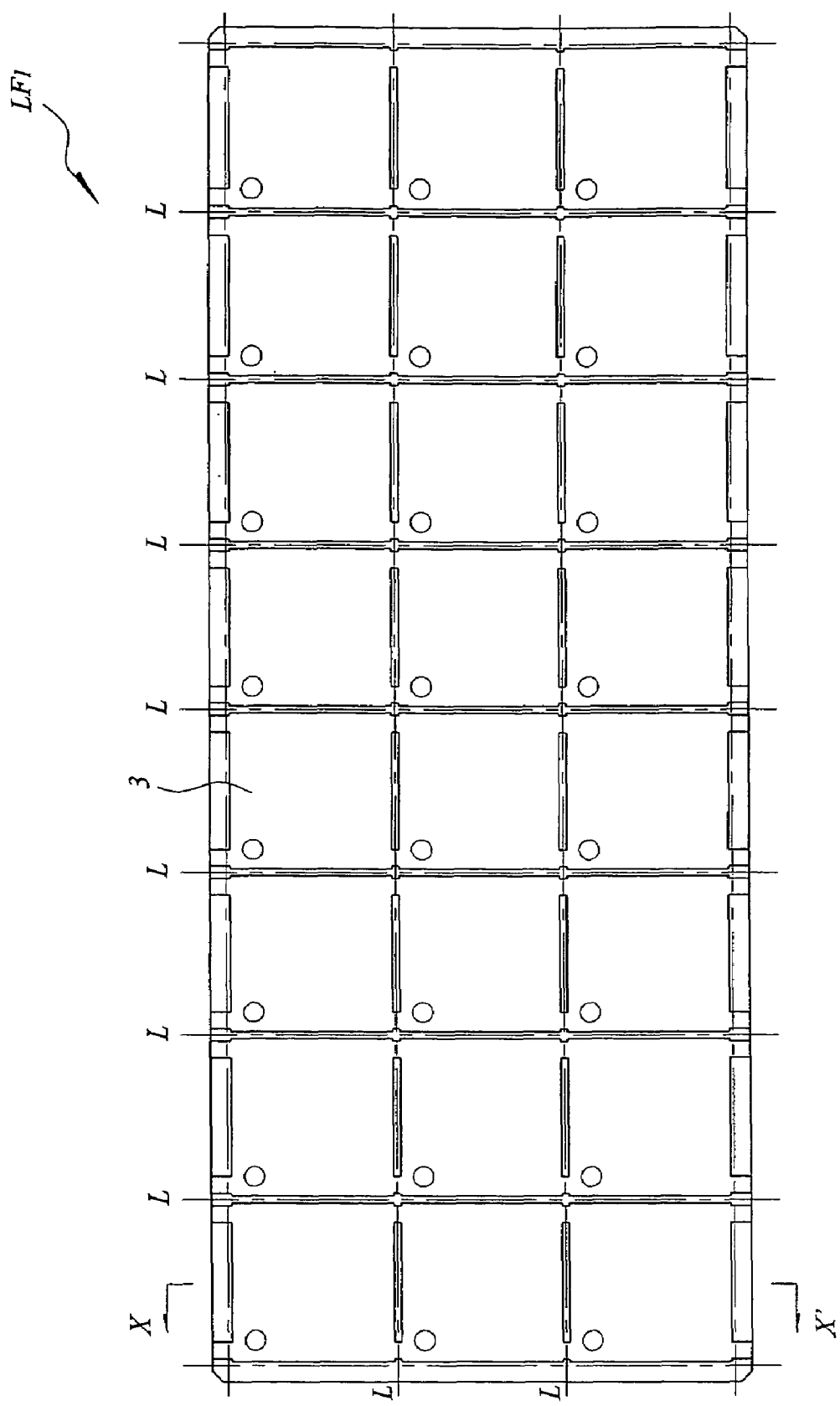
FIG. 18 is a plan view (main surface side) showing the entire lead frame for illustrating the manufacturing method of a semiconductor device according to an embodiment of the present invention.
Figure 19:
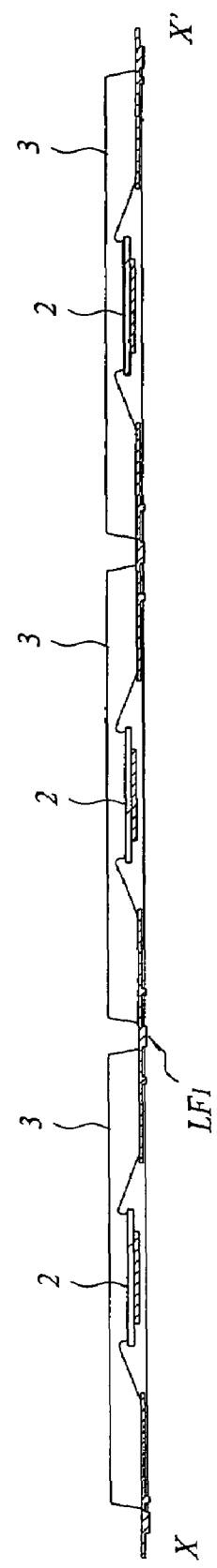
FIG. 19 is a sectional view of a lead frame for illustrating the manufacturing method of a semiconductor device according to an embodiment of the present invention.
Figure 20:
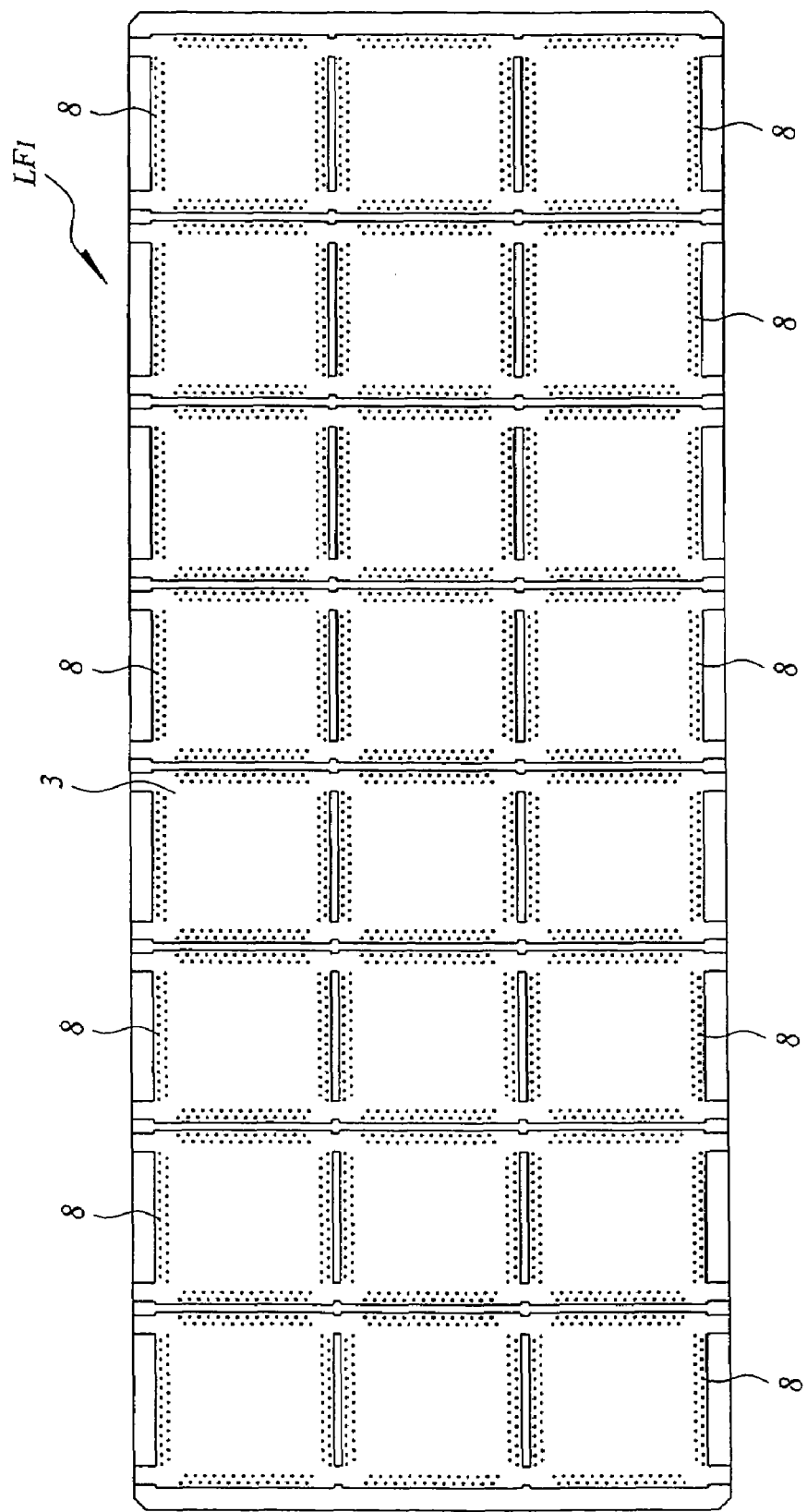
FIG. 20 is a plan view (rear surface side) showing the entire lead frame for illustrating the manufacturing method of a semiconductor device according to an embodiment of the present invention.

FIG. 18 is a plan view of the lead frame LF₁ separated from the molding die 40 after forming the plastic packages 3 by injecting the resin into the cavities $C_1$ to $C_{18}$ to cast the molding resin. FIG. 19 is a sectional view taken along the line X-X' in FIG. 18. FIG. 20 is a plan view of the rear surface of the lead frame LF₁.

Next, a solder layer (9) is formed on the surface of the terminal 8 exposed in the rear surface of the lead frame LF₁, and then, marks such as product names and the like are printed on the surface of the plastic package 3. Thereafter, the lead frame LF₁ and the some parts of the molding resin are cut along the dicing lines L shown in FIG. 18. In this manner, 24 pieces of QFN 1 according to this embodiment shown in FIGS. 1 to 5 are completed. Note that, in the case where it is desired to increase the space between the QFN 1 and the wiring board when mounting the QFN 1 on the wiring board, more specifically, in the case where it is desired to increase the standoff of the QFN 1, the thickness of the solder layer 9 formed on the surface of the terminal 8 is increased to about 50 μm. Such a thick solder layer 9 is formed by, for example, printing a solder paste on a surface of the terminal 8 by the use of a metal mask.

As described above, in the QFN 1 according to this embodiment, the lead tip 5a near the semiconductor die is extended to a position close to the die pad 4. Therefore, it is possible to reduce the length between the lead tip 5a near the semiconductor die and the semiconductor die 2, and it is also possible to reduce the length of the gold wire 6 used to connect the lead tip 5a and the semiconductor die 2. Also, even if the terminals 8 are arranged in a zigzag pattern, the lengths of the lead tips 5a near the semiconductor die are almost equal to each other. Therefore, the edge portions of the lead tips 5a are substantially arranged in a row along with each of the sides of the semiconductor die 2. Accordingly, the lengths of the gold wires 6 for connecting the lead tips 5a near the semiconductor die and the semiconductor die 2 can be made almost equal to each other, and the gold wires 6 can have the loop forms almost equal to each other.

As a result, it is possible to prevent the defects that the adjoining gold wires 6 are short circuited and that the adjoining gold wires 6 are crossed to each other in the vicinity of the four corners of the semiconductor die 2. Therefore, the workability in the wire bonding process can be improved. In addition, since it is possible to reduce the intervals between the adjoining gold wires 6, the number of pins used in the QFN 1 can be increased.

Also, since the lead tip 5a near the semiconductor die is extended to a position close to the die pad 4, the length between the terminal 8 and the lead tip 5a is increased. Therefore, since moisture getting into the plastic package 3 through the terminal 8 exposed to the outside of the plastic package 3 cannot easily reach the semiconductor die 2, corrosion of the bonding pad 7 due to the moisture can be prevented. As a result, the reliability of the QFN 1 is improved.

Also, since the lead tip 5a near the semiconductor die is extended to a position close to the die pad 4, even if the semiconductor die 2 is shrunk, the increase in length of the gold wires 6 is extremely small (for example, even if the semiconductor die 2 is shrunk from 4 mm square to 3 mm square, the increase in length of the gold wires 6 is about 0.7 mm on average). Therefore, it is possible to prevent the deterioration of the workability in the wire bonding process caused from the shrinkage of the semiconductor die 2.

Second Embodiment

Figure 21:
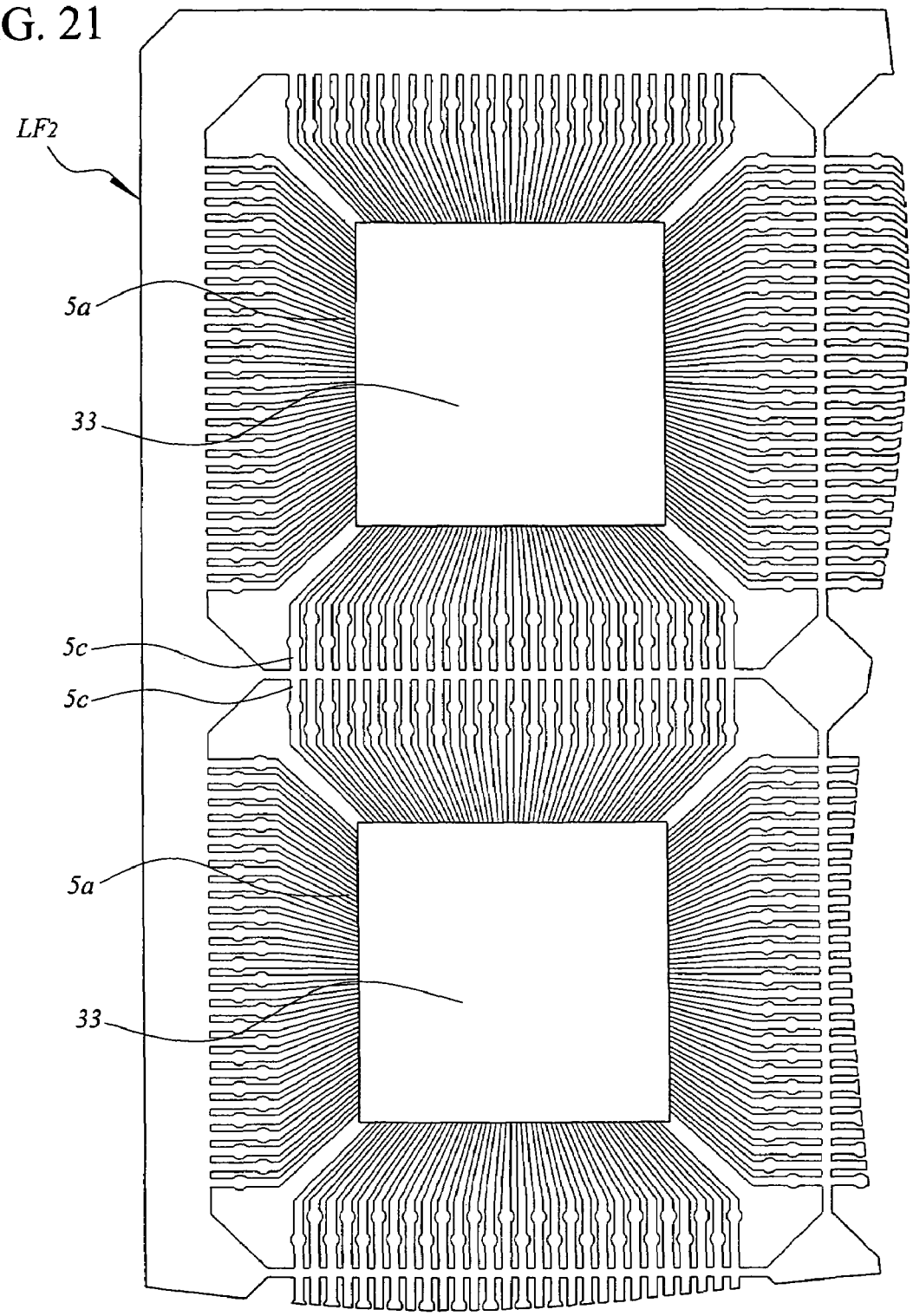
FIG. 21 is a plan view of the principal part of a lead frame used in the manufacture of a semiconductor device according to another embodiment of the present invention.
Figure 22:
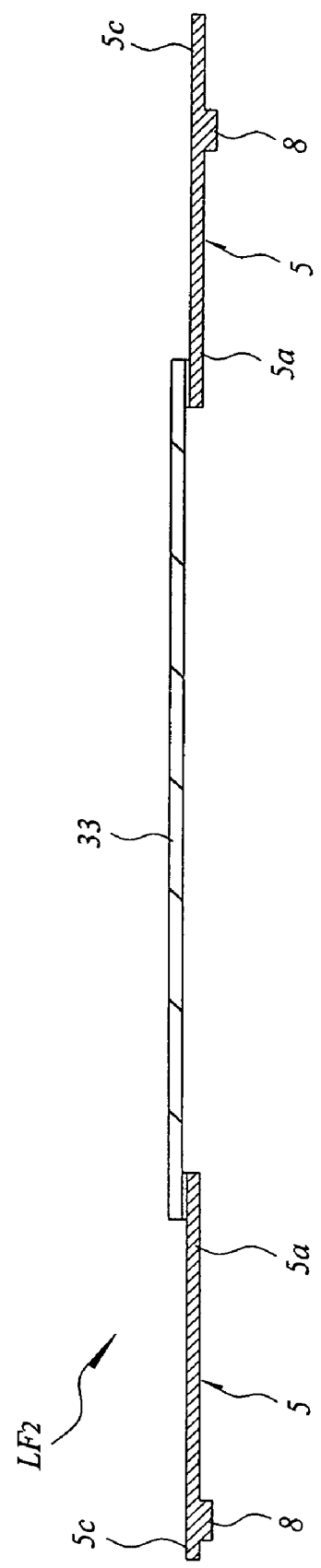
FIG. 22 is a sectional view of the principal part of a lead frame used in the manufacture of a semiconductor device according to another embodiment of the present invention.

The QFN manufactured by the use of the $LF_1$ having the small tab structure has been described in the first embodiment. However, it is also possible to manufacture the QFN by the use of a lead frame $LF_2$ in which a film-shaped die support 33 is adhered to the lead tips 5a near the semiconductor die as shown in FIGS. 21 and 22. In this embodiment, the die support 33 is made of an insulating film.

The lead frame $LF_2$ used in the second embodiment can be manufactured in the manner similar to that of the lead frame $LF_1$ in the first embodiment. More specifically, a metal sheet 10 with a thickness of about 125 to 150 μm as shown in FIG. 23 is prepared, and one surface of the parts of the metal sheet 10 where the leads 5 are formed is coated with the photoresist film 11. Also, both surfaces of the parts of the metal sheet 10, where the external connection terminals 8 are formed, are coated with the photoresist film 11. Then, the metal sheet 10 is subjected to the half etching in the same manner as described in the first embodiment, thereby forming the leads 5 with a thickness of about 65 to 75 μm and the terminals 8 with a thickness of about 125 to 150 μm simultaneously. Thereafter, the surfaces of the lead tips 5a near the semiconductor die are plated with silver, and finally, an insulating film 33 is adhered to an upper surface of the lead tips 5a. Note that, instead of the insulating film, a conductive material such as a thin metal sheet can be used to constitute the chip support 33. In this case, an insulation adhesive is preferably used to adhere the conductive material to the leads 5 in order to prevent the short circuit between the leads 5. Furthermore, it is also possible to constitute the chip support 33 by the use of a sheet obtained by coating an insulation resin on a surface of a metal foil.

In the case of using the lead frame $LF_2$ as described above, the thickness of the lead 5 can be reduced to about the half of the thickness of the metal sheet 10 by performing the half etching after coating one surface of the parts on the metal sheet 10 with the photoresist film 11. Therefore, the leads 5 in which intervals between the lead tips 5a near the semiconductor die are extremely narrow (for example, 0.18 to 0.2 mm interval) can be processed with high accuracy. In addition, by coating both surfaces of the parts on the metal sheet 10 with the photoresist film 11, it is possible to form the protrusions of the terminals 8 simultaneously with the formation of the leads 5.

The lead frame $LF_2$ described above is different from the lead frame $LF_1$ used in the first embodiment in that the die pad supports 5b for supporting the die pad 4 are unnecessary. Therefore, it is possible to give more margin for the interval between the lead tips 5a near the semiconductor die.

Also, since the leads 5 are supported by the chip support 33, the length between the lead tip 5a near the semiconductor die and the semiconductor die 2 is reduced. Therefore, it is possible to further reduce the length of the gold wires 6. Moreover, the chip support 33 can be supported more surely than the case where the die pad 4 is supported by the four die pad supports 5b. Therefore, it is possible to inhibit the displacement of the chip support 33 and to prevent the short circuit between the gold wires 6 in the molding process where molten resin is injected in the molding die.

As shown in FIG. 24, the method of manufacturing the QFN 1 by the use of the lead frame $LF_2$ is almost the same as that described in the first embodiment.

Third Embodiment

In the first and second embodiments, the external connection terminal 8 is constituted of the lead frame material. However, it is also possible to form the terminal in the following manner.

First, a metal sheet 10 with a thickness of about 75 μm as shown in FIG. 25 is prepared, and both surfaces of the parts on the metal sheet 10, where the die pad 4, the leads 5, and the die pad supports 5b are formed, are coated with the photoresist film 11. Then, the metal sheet 10 in this state is etched to form the die pad 4, the leads 5, and the die supports 5b. Subsequently, the photoresist film 11 is removed, and the surfaces of the lead tips 5a near the semiconductor die are plated with silver. In this manner, a lead frame $LF_3$ is fabricated. This lead frame $LF_3$ has the same configuration as that of the lead frame $LF_1$ in the first embodiment except that the lead frame $LF_3$ does not have the external connection terminals 8. Note that it is possible to use the die support 33 to form the die pad of the lead frame $LF_3$ similar to that of the lead frame $LF_2$ in the second embodiment. In addition, it is also possible to form the die pad 4, the leads 5, and the die pad supports 5b of the lead frame $LF_3$ by pressing the metal sheet 10.

Next, as shown in FIG. 26, dummy terminals 12 which are not used as actual terminals are formed on some parts of the lead frame $LF_3$. The dummy terminals 12 are formed in the following manner. First, a screen-printing mask 15 is laminated on the rear surface of the lead frame $LF_3$, and polyimide 12a is printed on some parts where external connection terminals are to be formed in the later process. Thereafter, the polyimide 12a is baked (FIGS. 26B to 26D). The dummy terminal 12 is designed to have approximately the same size as that of the actual terminal formed in the later process. Note that the case where the dummy terminal 12 is formed by printing the polyimide 12a on the surface of the lead 5 has been described here. However, the dummy terminal 12 is not limited to this, and any materials and forming methods of the dummy terminal are available as long as it can be removed from the surface of the lead 5 in the later process.

Figure 26A:
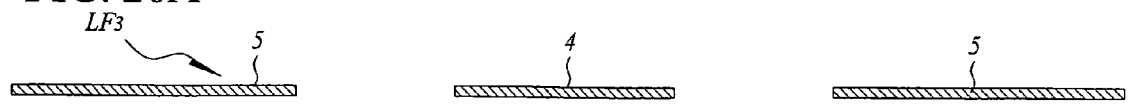
FIG. 26A is a sectional view of the principal part in the manufacturing method of a semiconductor device according to another embodiment of the present invention.
Figure 26B:
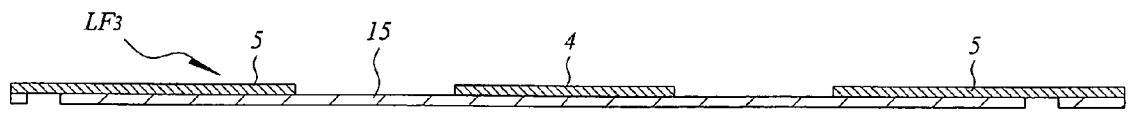
FIG. 26B is a sectional view of the principal part in the manufacturing method of a semiconductor device according to another embodiment of the present invention.
Figure 26C:
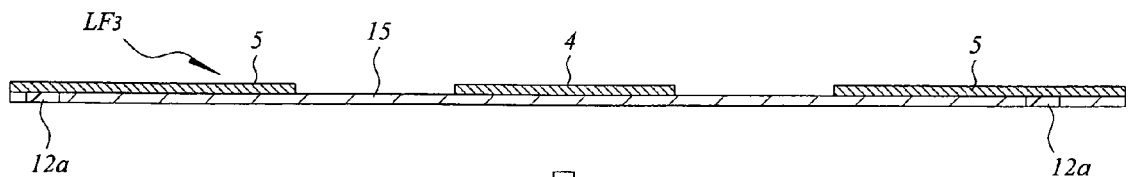
FIG. 26C is a sectional view of the principal part in the manufacturing method of a semiconductor device according to another embodiment of the present invention.
Figure 26D:
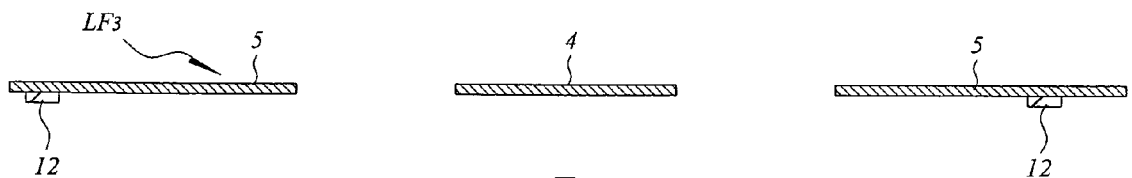
FIG. 26D is a sectional view of the principal part in the manufacturing method of a semiconductor device according to another embodiment of the present invention.
Figure 26E:
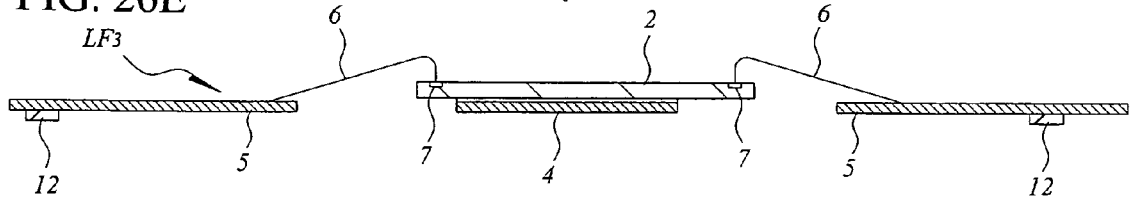
FIG. 26E is a sectional view of the principal part in the manufacturing method of a semiconductor device according to another embodiment of the present invention.

Next, the semiconductor die 2 is mounted on the die pad 4 in accordance with the method described in the first embodiment, and the bonding pads 7 and the leads 5 are connected by the gold wires 6 (FIG. 26E).

Next, as shown in FIG. 27A, the semiconductor die 2 is encapsulated in the formed molding resin, thereby forming the plastic package 3 in accordance with the method described in the first embodiment. At this time, the tip portions of the dummy terminals 12 formed on one surface of the leads 5 are protruded to the outside from the rear surface of the plastic package 3.

Next, as shown in FIG. 27B, the dummy terminals 12 are removed from the surface of the leads 5. In the case where the dummy terminals 12 are formed of polyimide, the dummy terminals 12 can be removed by dissolving it by the use of organic solution such as hydrazine. After the removal of the dummy terminals 12, holes 35 are formed in the rear surface of the plastic package 3, and parts of the surface of the leads 5 are exposed.

Figures 28A, 28B:
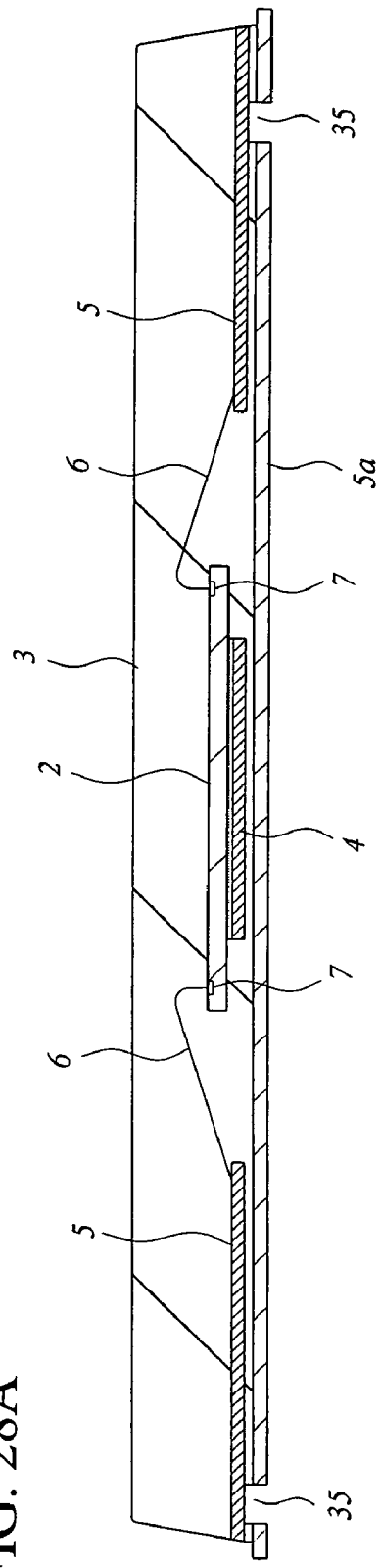
FIG. 28A is a sectional view of the principal part in the manufacturing method of a semiconductor device according to another embodiment of the present invention.
FIG. 28B is a sectional view of the principal part in the manufacturing method of a semiconductor device according to another embodiment of the present invention.

Next, as shown in FIG. 28A, a screen-printing mask 16 is laminated on the rear surface of the plastic package 3. Thereafter, solder paste 13a is supplied to the inside of the holes 35 as shown in FIG. 28B.

Figure 29:
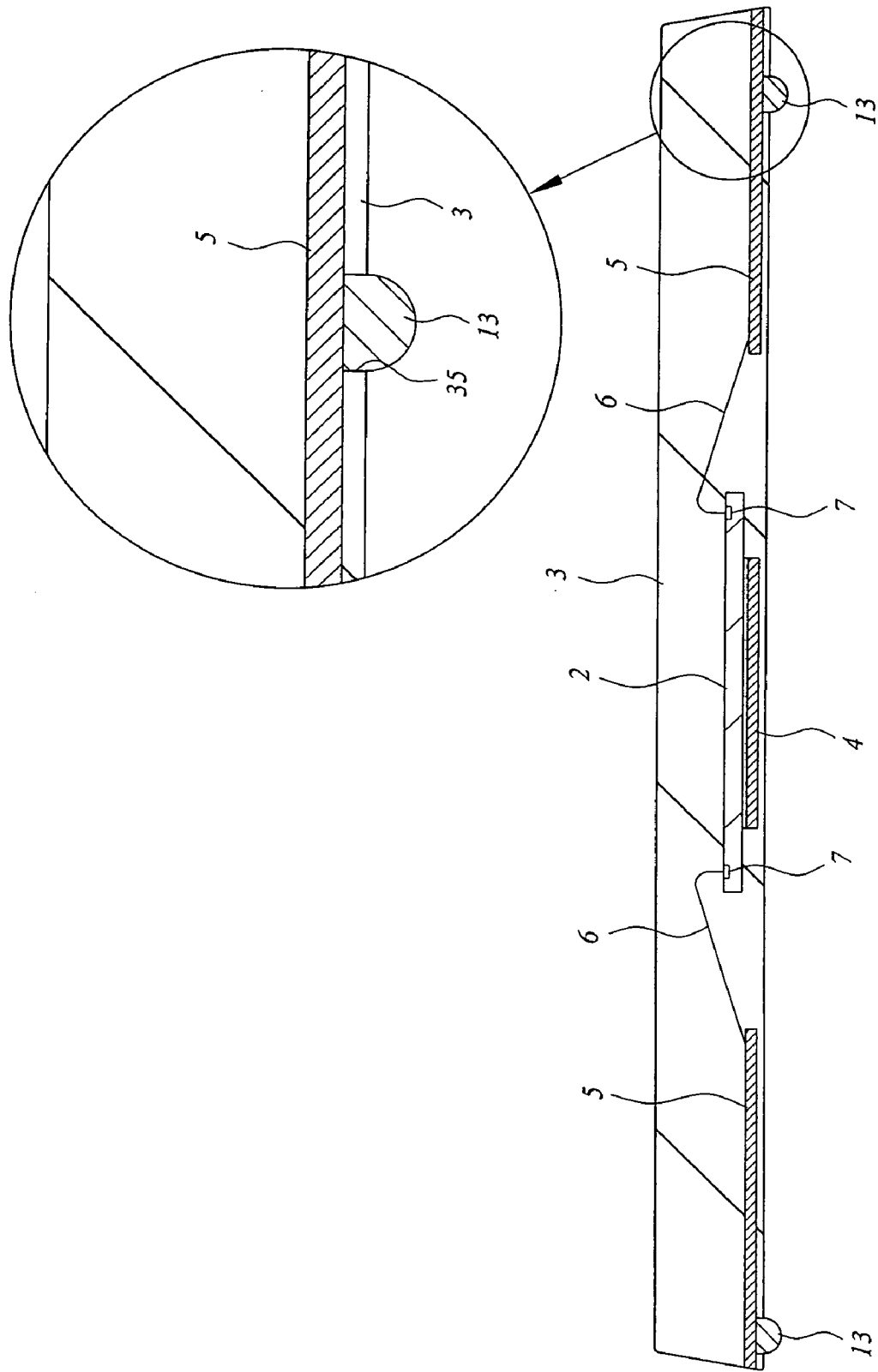
FIG. 29 is a sectional view of the principal part of a semiconductor device for illustrating the manufacturing method of a semiconductor device according to another embodiment of the present invention.

Next, after the removal of the mask 16, the solder paste 13a is melted in a heating furnace. By doing so, solder bumps 13 are formed as shown in FIG. 29. The solder bumps 13 are electrically connected to the leads 5 exposed in the holes 35, and the tip portions of the solder bumps 13 protrude to the outside from the rear surface of the plastic package 3.

Note that the case where the solder bumps 13 are formed by printing the solder paste 13a on the surface of the lead 5 has been described here. However, it is also possible to form the solder bumps 13 by supplying solder balls formed in a spherical shape into the holes 35 and then performing the reflow of the solder balls.

Note that the process of forming the solder bumps 13 by removing the dummy terminals 12 is usually performed immediately after the completion of casting the molding resin. Thereafter, the lead frame $LF_3$ is cut to obtain the pieces of the QFN 1. However, it is also possible to remove the dummy terminals 12 and form the solder bumps 13 after cutting the lead frame $LF_3$ into pieces of the QFN 1.

In the above-described manufacturing method according to this embodiment, it is possible to form the terminals with a material suitable for the application of the QFN 1 and the types of the mounting substrates in contrast to the method in which the terminals (8) are formed by the half etching of the lead frame ($LF_1$).

Fourth Embodiment

Figure 30:
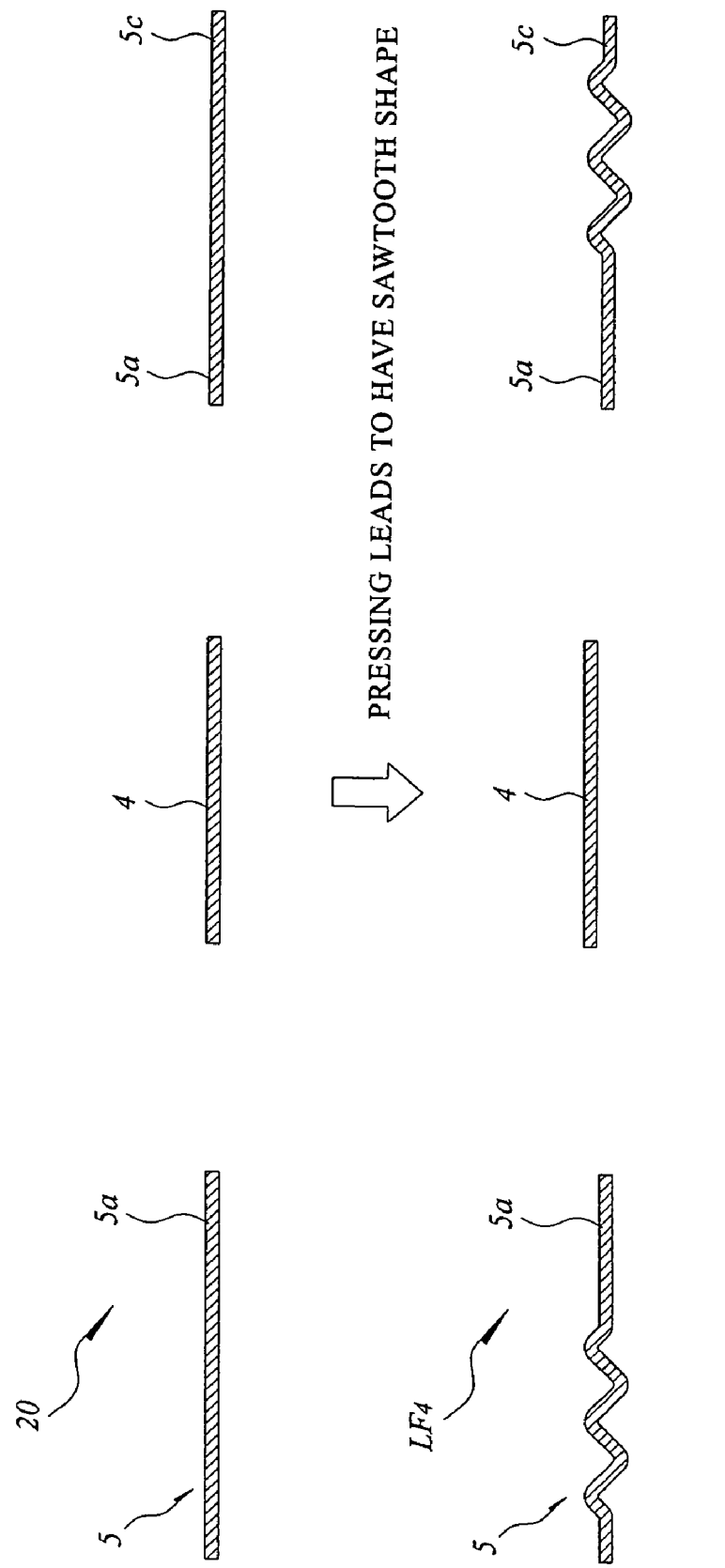
FIG. 30 is a sectional view of the principal part of a semiconductor device for illustrating the manufacturing method of a semiconductor device according to another embodiment of the present invention.

The external connection terminals can also be formed in the following manner. That is, as shown in FIG. 30, a thin metal sheet 20 with a thickness of about 75 µm is prepared, and the metal sheet 20 is etched in the same manner as that of the third embodiment, thereby fabricating a lead frame $LF_4$ having the die pad 4, the leads 5 and the die pad supports 5b (not shown in FIG. 30). Thereafter, a middle portion of each lead 5 is press-molded so as to have a sawtooth shape in cross section. When it is intended to adopt the structure in which a part of the die pad support 5b is bent upward (tab-lifted structure), the bending of the die pad support 5b and the formation of the lead 5 are preferably performed simultaneously. Note that it is also possible to form the die pad 4, the leads 5, and the die pad supports 5b can be formed by the half etching or the press-molding of the thick metal sheet 10 like that used in the first embodiment.

Figure 31:
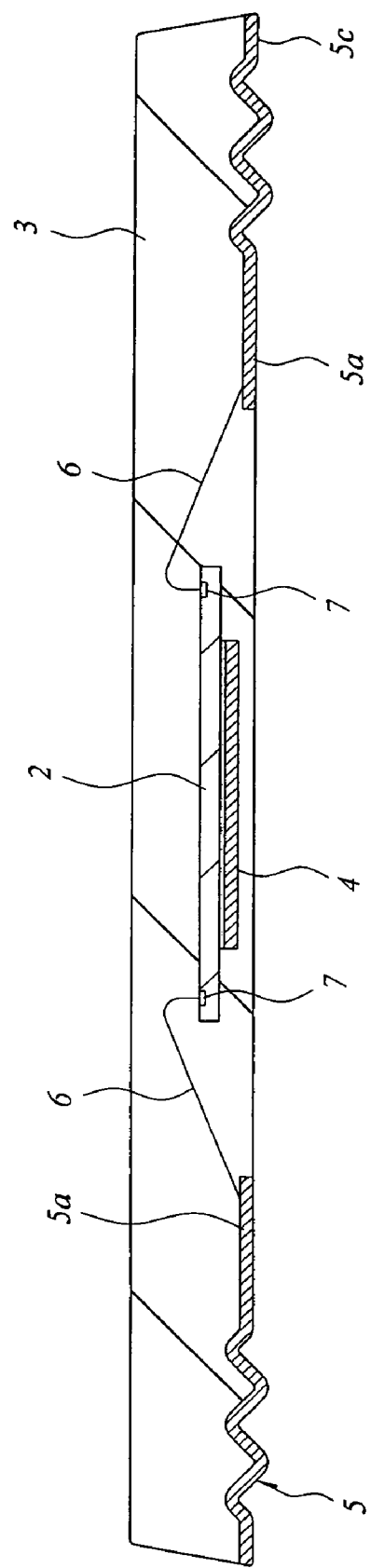
FIG. 31 is a sectional view of the principal part of a semiconductor device for illustrating the manufacturing method of a semiconductor device according to another embodiment of the present invention.

Next, as shown in FIG. 31, the semiconductor die 2 is mounted on the die pad 4 of the lead frame $LF_4$, and the bonding pads 7 and the lead tips 5a near the semiconductor die are connected by the gold wires 6. Thereafter, the semiconductor die 2 is encapsulated in the molding resin, thereby forming the plastic package 3. Consequently, convex portions of the leads 5 having a sawtooth shape are exposed on the rear surface of the plastic package 3.

Figure 32:
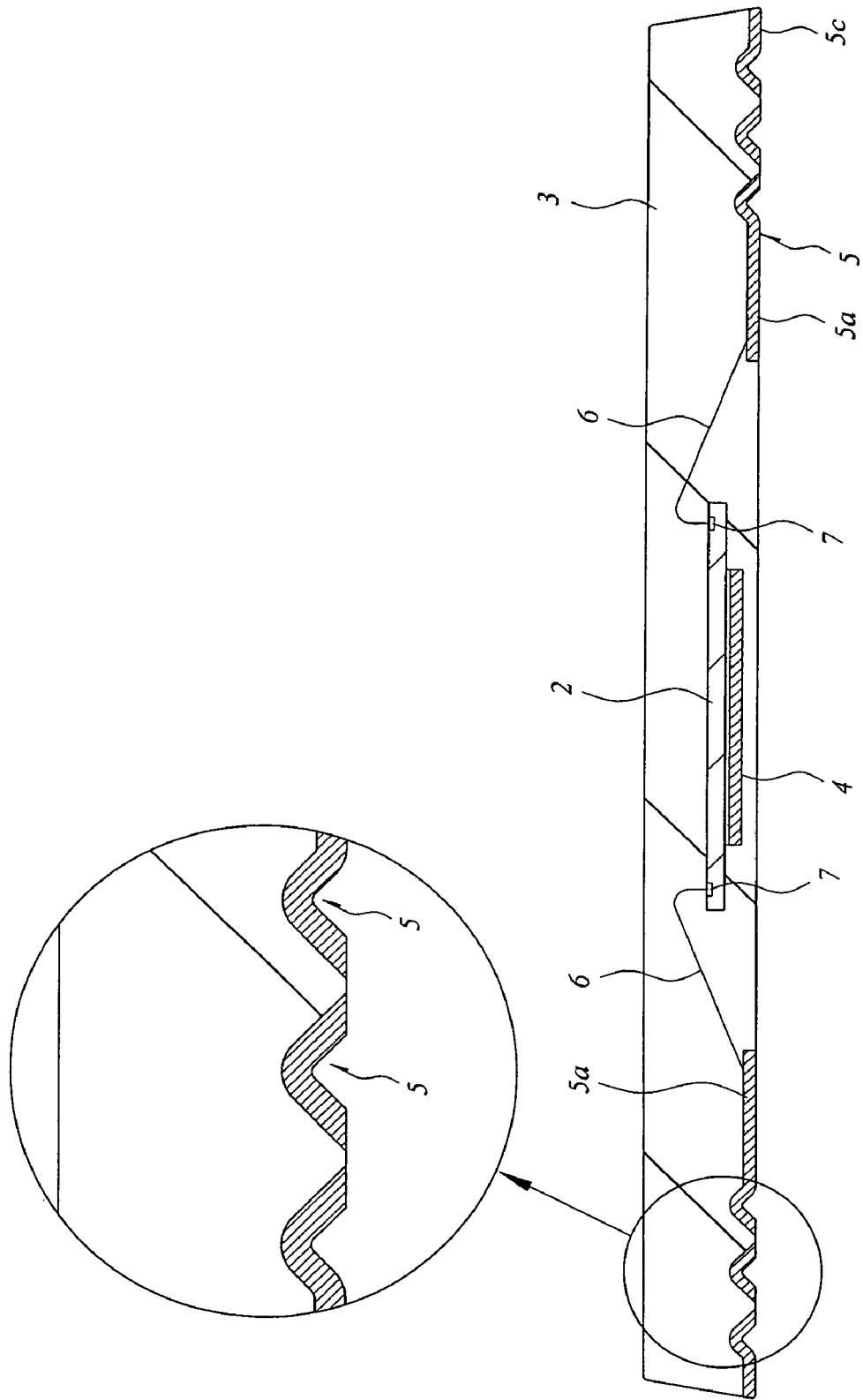
FIG. 32 is a sectional view of the principal part of a semiconductor device for illustrating the manufacturing method of a semiconductor device according to another embodiment of the present invention.

Next, as shown in FIG. 32, the lower end portion of the leads 5 exposed on the rear surface of the plastic package 3 is polished with a device such as a grinder to cut the middle portions of the leads 5, thereby dividing one lead 5 into several leads 5 and 5.

Figure 33:
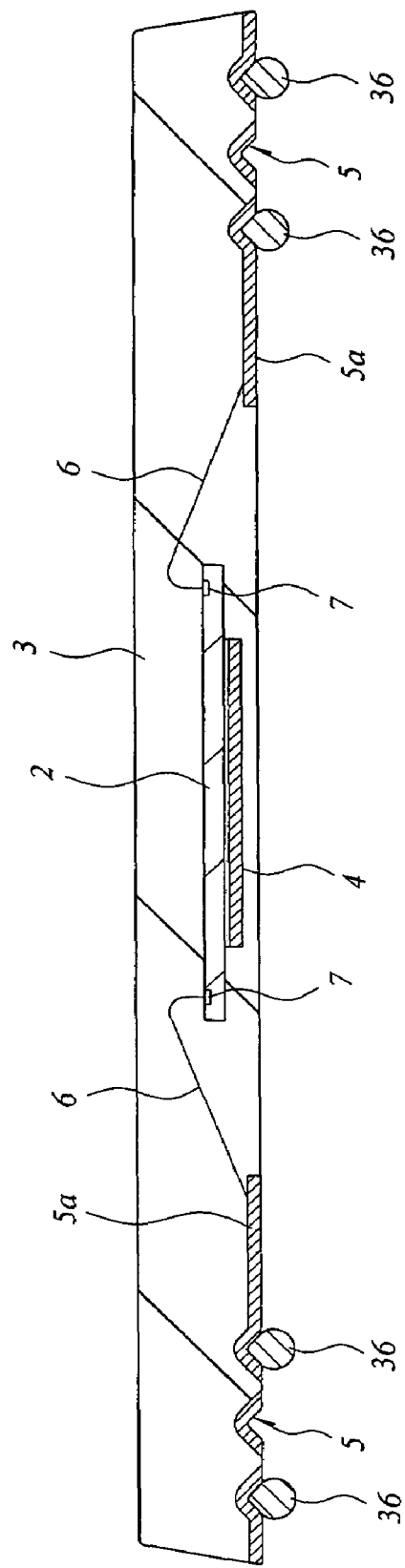
FIG. 33 is a sectional view of the principal part of a semiconductor device for illustrating the manufacturing method of a semiconductor device according to another embodiment of the present invention.

Next, as shown in FIG. 33, a terminal 36 is formed in each of the leads 5 and 5 obtained by dividing one lead 5. The terminal 36 can be formed by the use of the printing of the conductive paste, the solder ball supply method, and the plating method. In addition, the process for forming the terminals 36 is usually performed immediately after the completion of the plastic package 3 by casting the molding resin. Thereafter, the lead frame $LF_4$ is cut to obtain the pieces of the QFN 1. However, it is also possible to form the solder terminals 36 after cutting the lead frame $LF_4$ into pieces of the QFN 1.

Figure 34:
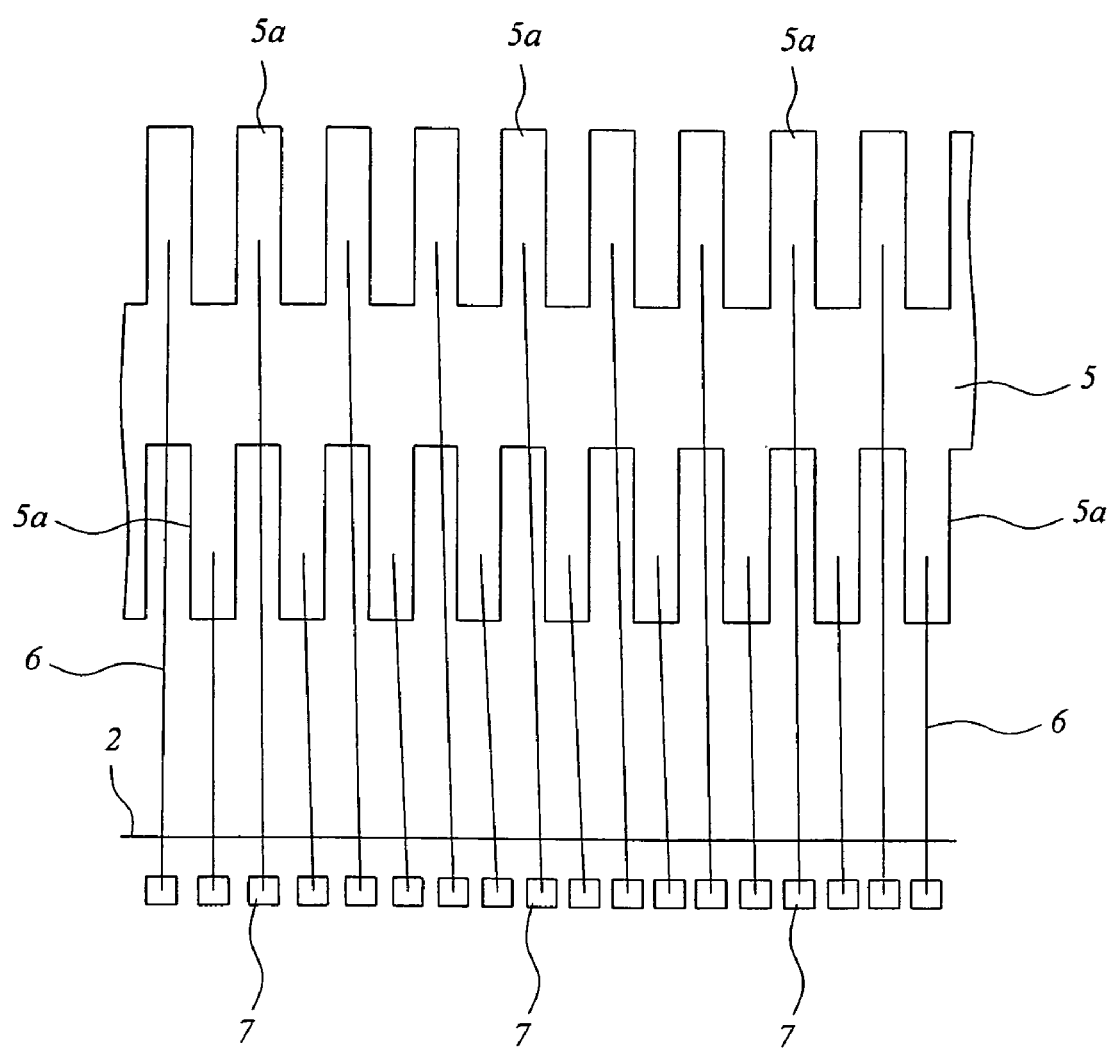
FIG. 34 is a plan view of the principal part of a lead frame for illustrating the manufacturing method of a semiconductor device according to another embodiment of the present invention.
Figure 35:
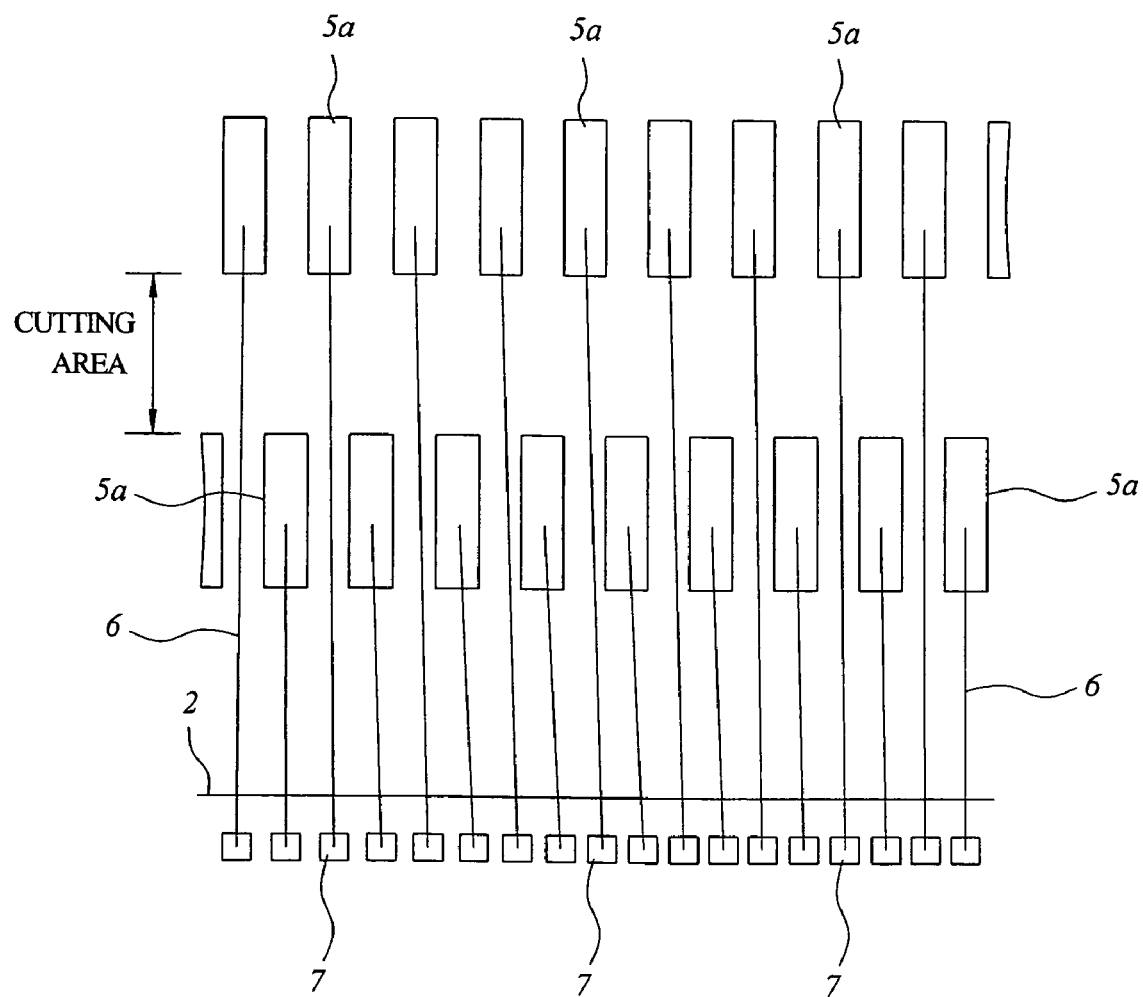
FIG. 35 is a plan view of the principal part of a lead frame for illustrating the manufacturing method of a semiconductor device according to another embodiment of the present invention.

Also, when using the method of forming a terminal according to this embodiment, it is possible to form a plurality of lead tips by cutting the lead 5 in the following manner. That is, a wide lead 5 as shown in FIG. 34 provided with lead tips 5a at alternate positions apart from the semiconductor die 2 and near the semiconductor die 2 is formed, and the gold wires are bonded to the lead tips 5a of the lead 5. Thereafter, the middle portion of the lead 5 is polished and cut as shown in FIG. 35. According to this method, the intervals between the adjoining lead tips 5a can be substantially eliminated. Therefore, it is possible to greatly increase the number of terminals in the QFN 1.

Fifth Embodiment

Figure 36:
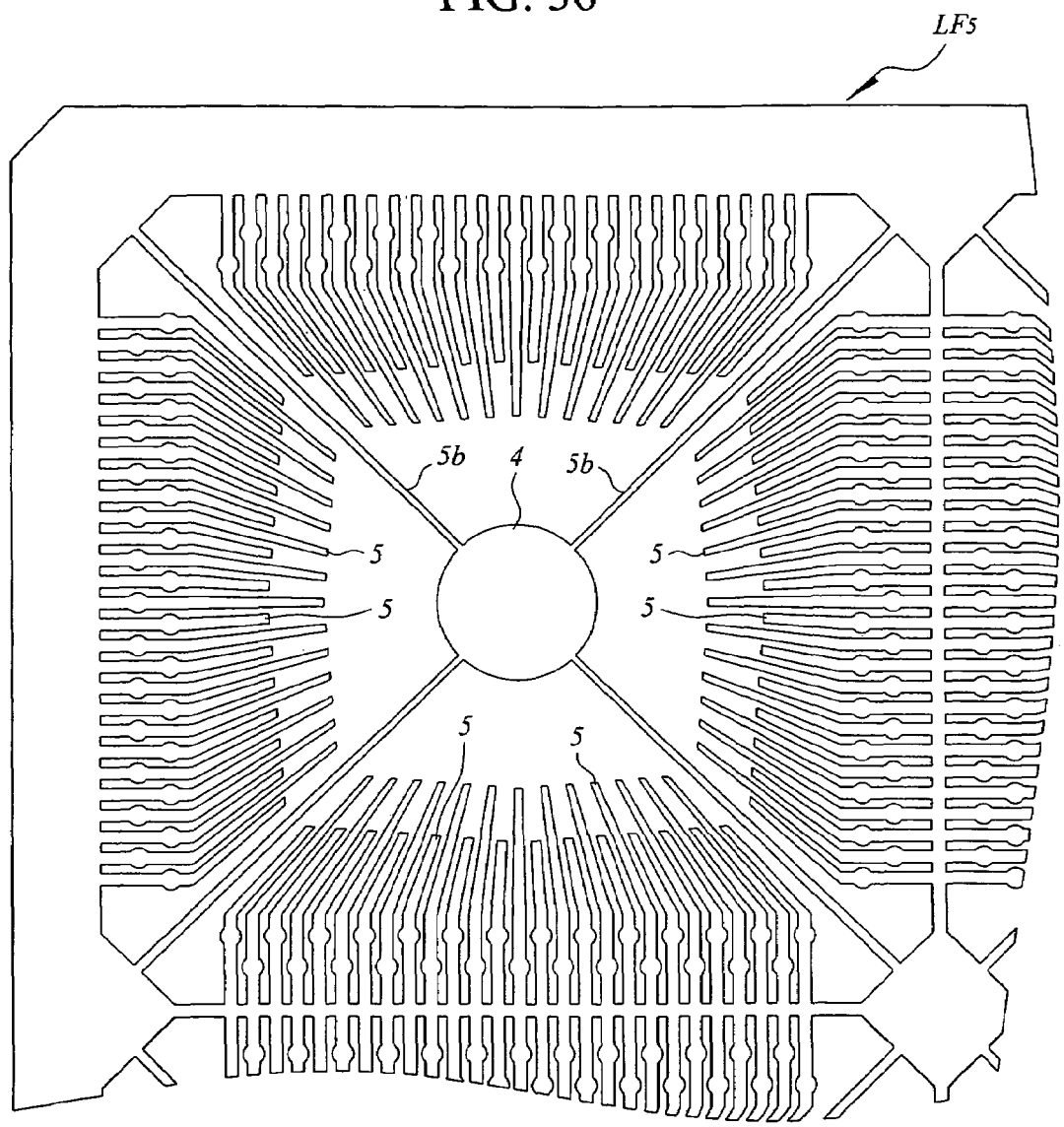
FIG. 36 is a plan view of the principal part of a lead frame used in the manufacturing method of a semiconductor device according to another embodiment of the present invention.
Figure 37:
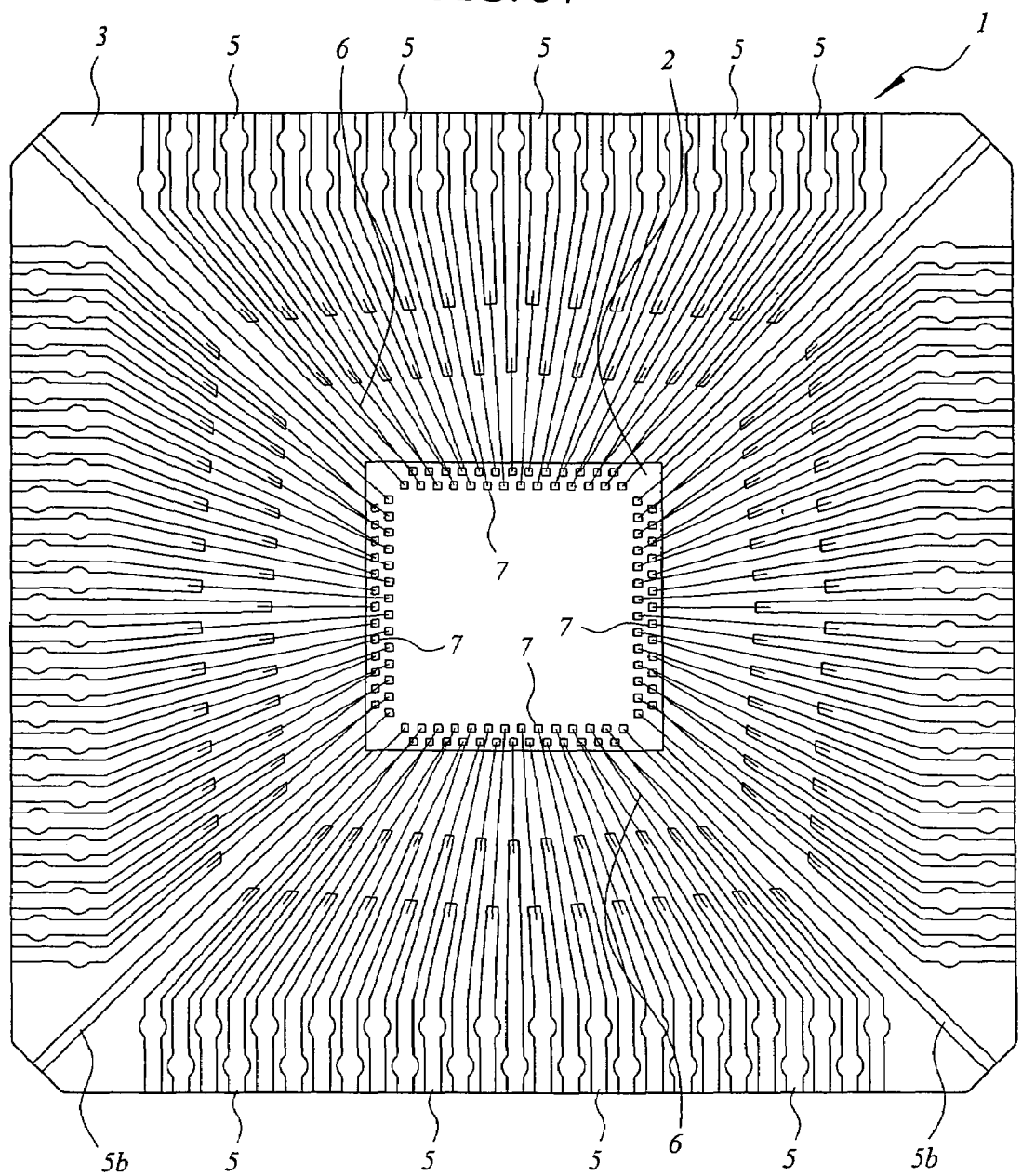
FIG. 37 is a plan view of an internal structure (main surface side) of a semiconductor device according to another embodiment of the present invention.

FIG. 36 is a plan view of a part of a lead frame $LF_5$ used in the manufacture of the QFN. FIG. 37 is a plan view of an internal structure (main surface side) of the QFN manufactured by the use of the lead frame $LF_5$.

The lead frame $LF_5$ in this embodiment has a structure in which lengths of a plurality of tips of the leads 5 (lead tips 5a) surrounding the die pad 4 are alternately changed. Also, in the case of using this lead frame $LF_5$, a semiconductor die 2 on which two lines of the bonding pads 7 are arranged along each of the sides of the main surface thereof in a zigzag pattern is used as the semiconductor die 2 to be mounted on the die pad 4.

Figure 38:
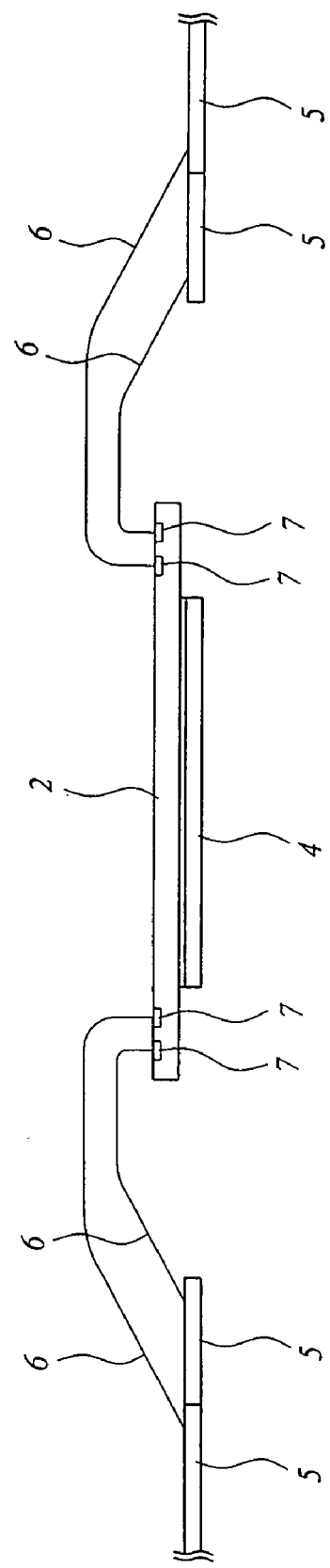
FIG. 38 is an explanatory diagram for illustrating the manufacturing method of a semiconductor device according to another embodiment of the present invention.

In the case where the lengths of the tips of the leads 5 of the lead frame $LF_5$ are alternately changed and the bonding pads 7 of the semiconductor die 2 are arranged in a zigzag pattern as described above, the bonding pad 7 in a line closer to the edge of the semiconductor die 2 is connected to the lead 5 having longer tip portion by the shorter gold wire 6 having a lower loop, and the bonding pad 7 in an inner line of the semiconductor die 2 is connected to the lead 5 having shorter tip portion by the longer gold wire 6 having a higher loop as shown in FIG. 38.

By doing so, even if the interval between the leads 5 or the interval between the gold wires 6 is reduced with the increase of the number of pins used in the semiconductor die 2, the interference between adjoining gold wires 6 can be prevented. Therefore, it is possible to effectively prevent the occurrence of defects such as a short circuit between the gold wires 6 in the manufacturing process of the QFN (for example, wire bonding process and resin molding process).

Figure 39:
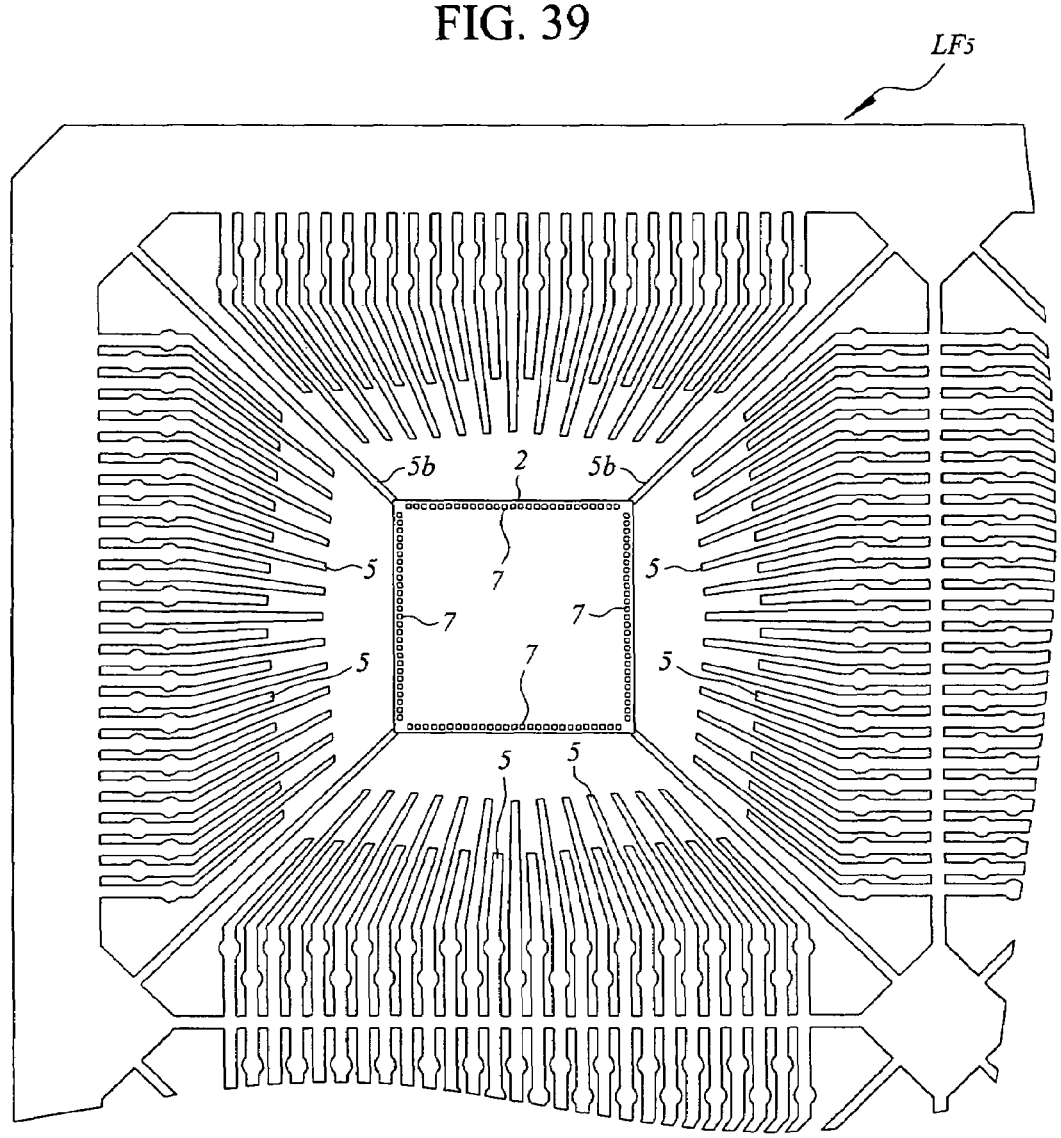
FIG. 39 is a plan view of the principal part of a lead frame for illustrating the manufacturing method of a semiconductor device according to another embodiment of the present invention.
Figure 40:
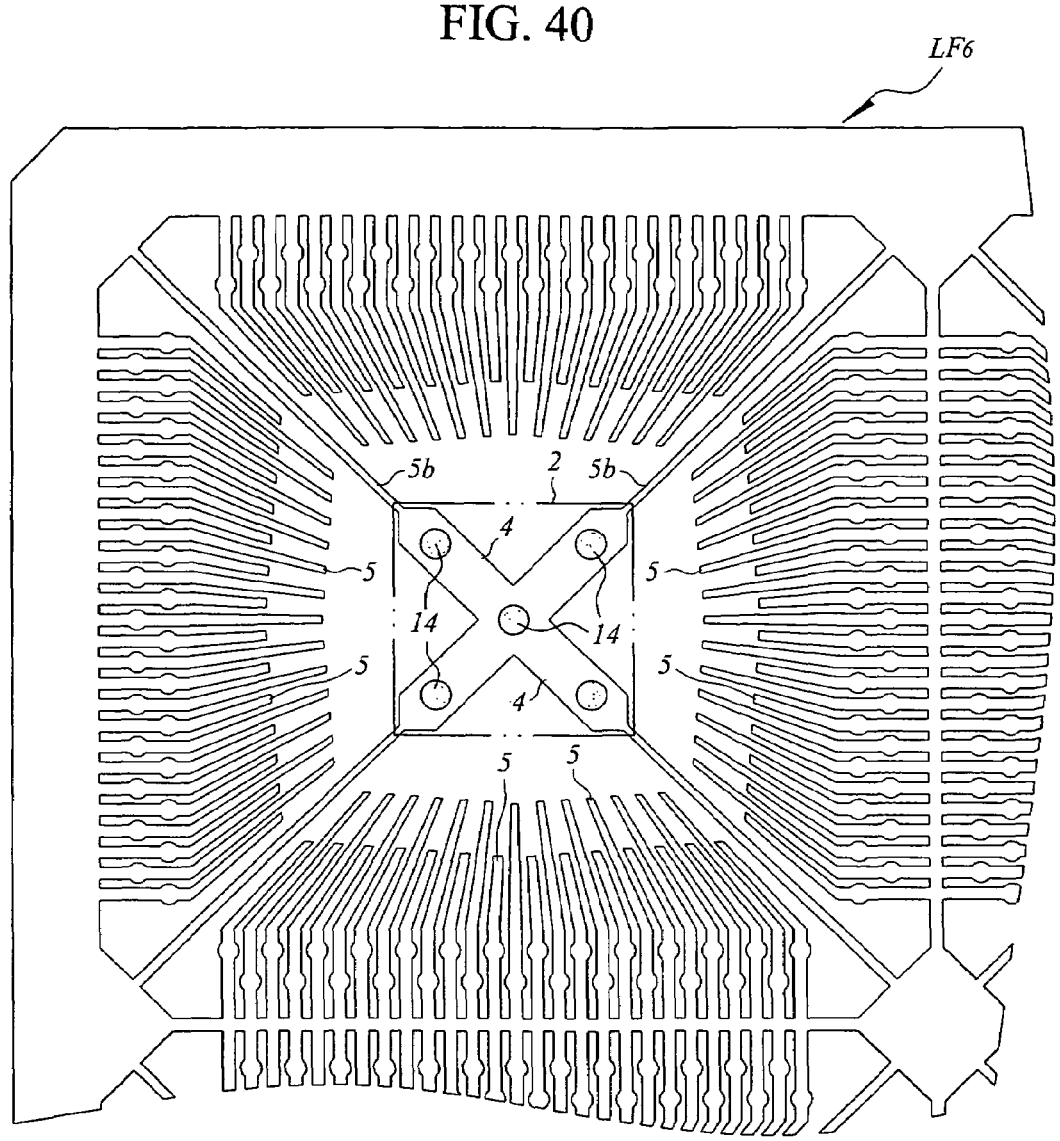
FIG. 40 is a plan view of the principal part of a lead frame used in the manufacturing method of a semiconductor device according to another embodiment of the present invention.
Figure 41:
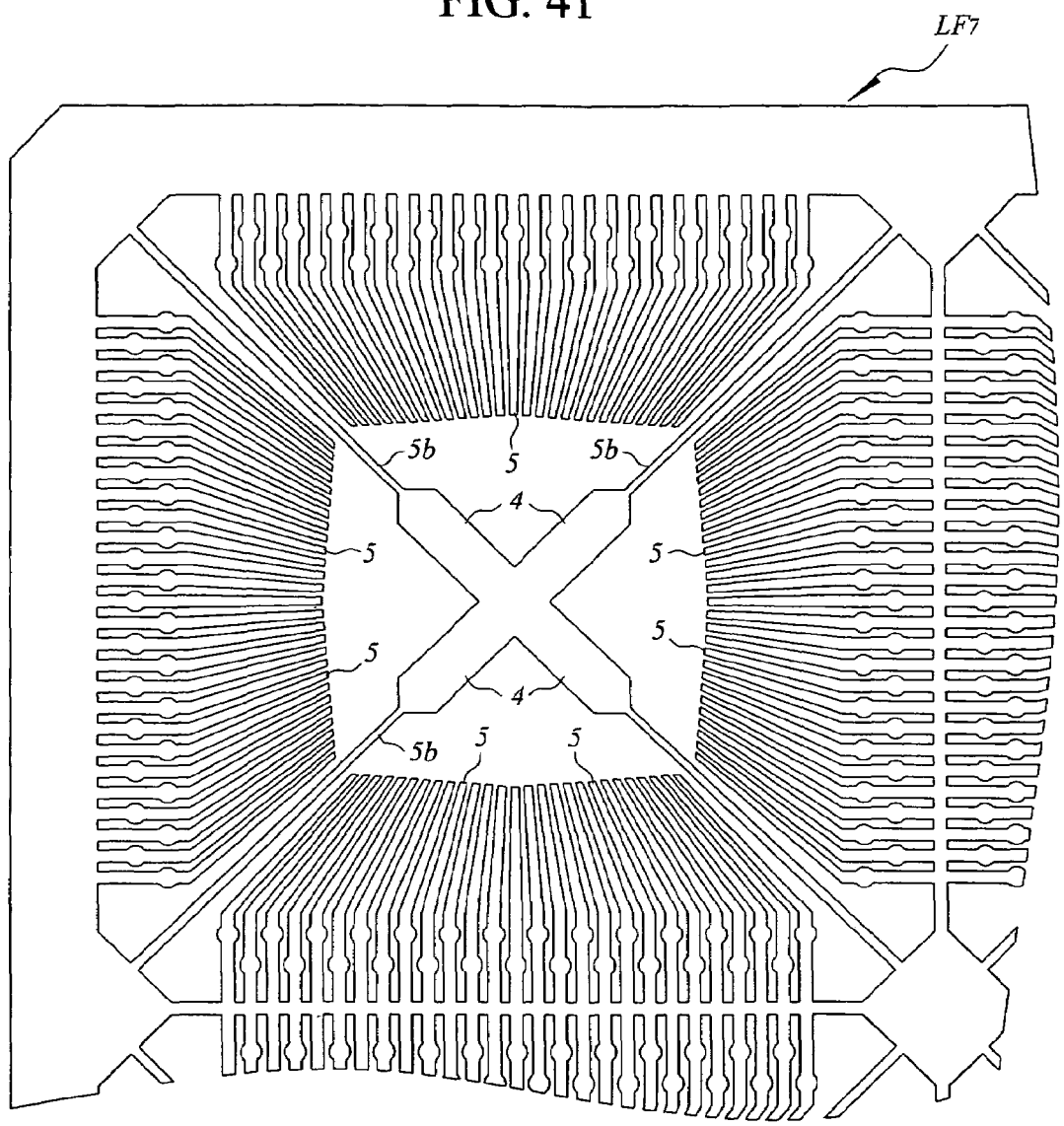
FIG. 41 is a plan view of the principal part of a lead frame used in the manufacturing method of a semiconductor device according to another embodiment of the present invention.

As shown in FIG. 39, the above-described lead frame $LF_5$ can be used even in the case where the semiconductor chip 2 on which the bonding pads 7 are arranged in a line is mounted. In addition, the shape of the die pad 4 on which the semiconductor die 2 is mounted is not limited to a circular shape, and it is possible to use the die pad 4 having a structure in which the width of the die pad 4 is larger than that of the die pad supports 5b (so-called cross tab structure) like in a lead frame $LF_6$ shown in FIG. 40 and a lead frame $LF_7$ shown in FIG. 41. In this case, as shown in FIG. 40, adhesive 14 is applied to several parts on the die pad 4 and the semiconductor die 2 is adhered thereon, by which the displacement in the rotating direction of the semiconductor die 2 can be effectively prevented. As a result, the relative location accuracy between the die pad 4 and the semiconductor die 2 is improved. In addition, since the width of the die pad 4 substantially functioning as a part of the die pad support 5b is large, the advantage of the improvement in the strength of the die pad support 5b can be obtained. Note that it is needless to say that the die pad 4 of the cross tab structure can mount several types of semiconductor dies 2 with different sizes.

Sixth Embodiment

Figure 42A:
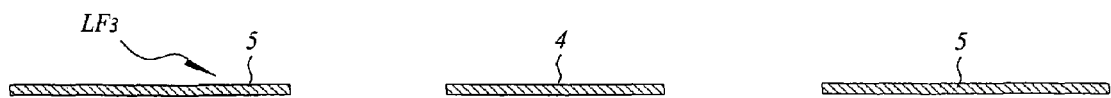
FIG. 42A is a sectional view of the principal part of a semiconductor device for illustrating the manufacturing method of a semiconductor device according to another embodiment of the present invention.
Figure 42B:
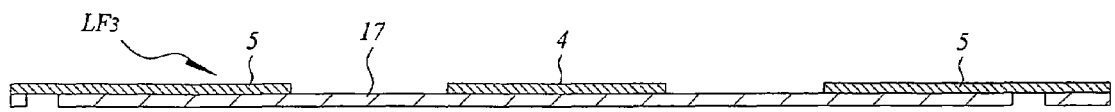
FIG. 42B is a sectional view of the principal part of a semiconductor device for illustrating the manufacturing method of a semiconductor device according to another embodiment of the present invention.
Figure 42C:
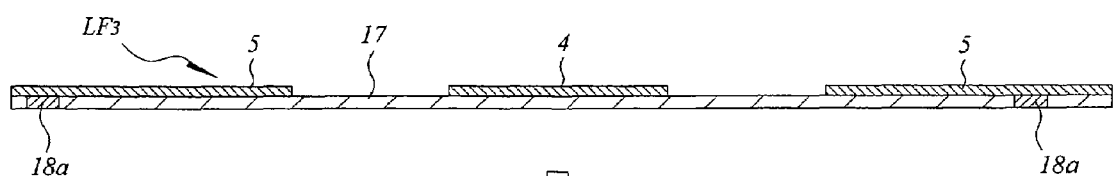
FIG. 42C is a sectional view of the principal part of a semiconductor device for illustrating the manufacturing method of a semiconductor device according to another embodiment of the present invention.
Figure 42D:
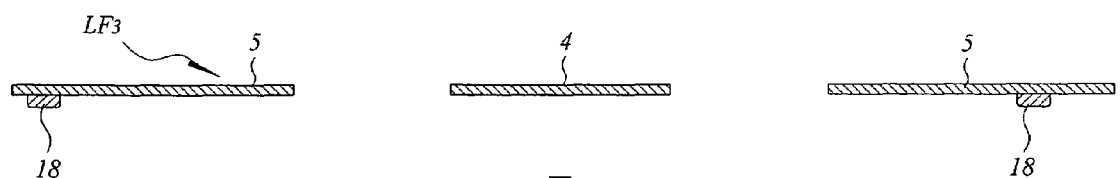
FIG. 42D is a sectional view of the principal part of a semiconductor device for illustrating the manufacturing method of a semiconductor device according to another embodiment of the present invention.

The terminals of the QFN can be formed in the following manner. First, as shown in FIG. 42A, the lead frame $LF_3$, for example, fabricated in the same manner as described in the third embodiment shown in FIG. 25 is prepared. Subsequently, as shown in FIGS. 42B to 42D, a screen-printing mask 17 is laminated on a rear surface of the lead frame $LF_3$, and copper paste 18 is printed on the parts where the terminals are to be formed. Then, the copper paste 18a are baked. In this manner, copper terminals 18 are formed.

Figure 42E:
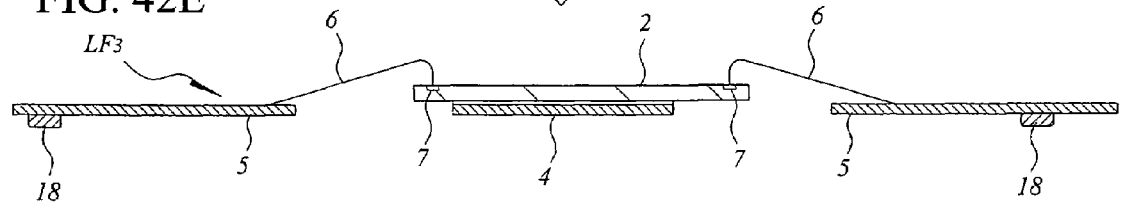
FIG. 42E is a sectional view of the principal part of a semiconductor device for illustrating the manufacturing method of a semiconductor device according to another embodiment of the present invention.

Next, as shown in FIG. 42E, the semiconductor die 2 is mounted on the die pad 4 in accordance with the method described in the first embodiment, and the bonding pads 7 and the leads 5 are connected by the gold wires 6.

Figure 43:
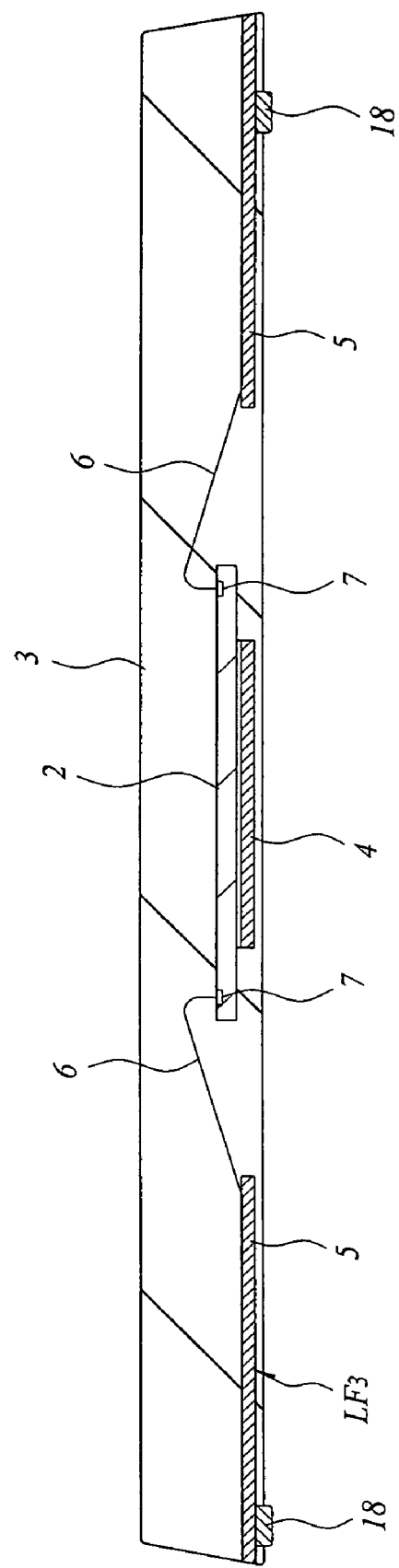
FIG. 43 is a sectional view for illustrating the manufacturing method of a semiconductor device according to another embodiment of the present invention.

Subsequently, as shown in FIG. 43, the semiconductor die 2 is encapsulated in the formed molding resin, thereby forming the plastic package 3 in accordance with the method described in the first embodiment. Consequently, tip portions of the copper terminals 18 formed on one surface of the leads 5 are protruded to the outside from the rear surface of the plastic package 3.

Thereafter, plating of tin and gold may be performed on the surface of the copper terminals 18 by the use of the electroless plating method if necessary.

In the manufacturing method according to this embodiment, it is possible to simplify the terminal forming process in comparison to that of the third embodiment in which dummy terminals 12 are formed on one surface of the leads 5 and the solder bumps 13 are formed after the removal of the dummy terminals 12.

Seventh Embodiment

Figure 44:
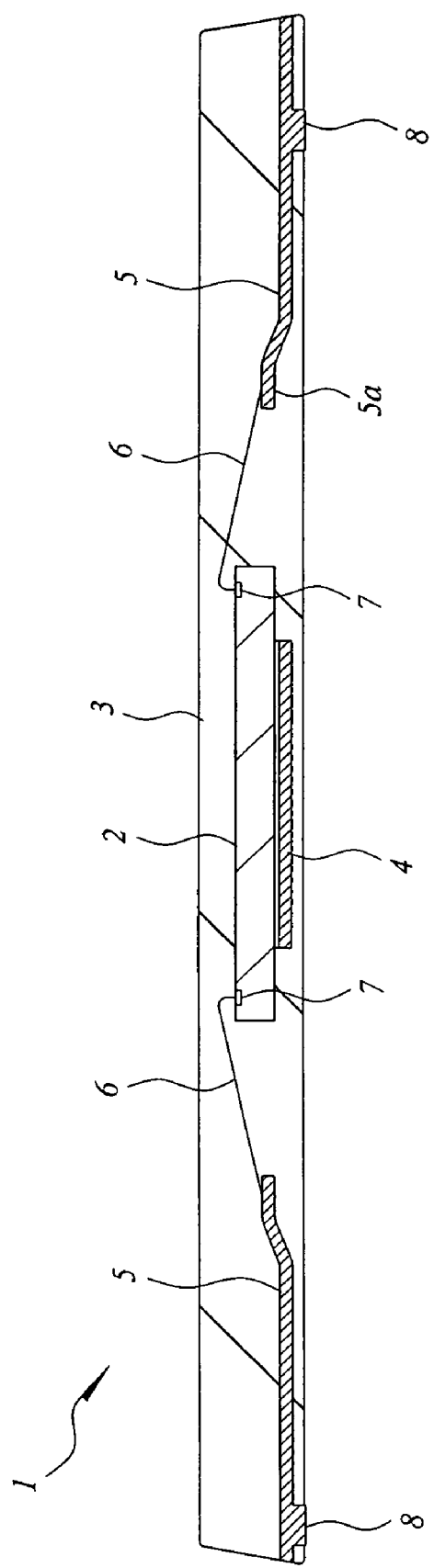
FIG. 44 is a sectional view of a semiconductor device according to another embodiment of the present invention.

FIG. 44 shows an example of the QFN 1 in which the lead tips 5a of the leads 5 (near the semiconductor die 2) are bent upward. In this structure, the difference in height between the lead tips 5a of the leads 5 and the main surface of the semiconductor die 2 is reduced, and the loop height of the gold wires 6 that connect the leads 5 and the bonding pads 7 can be lowered. Therefore, it is possible to reduce the thickness of the plastic package 3 in proportion to the reduction.

Figure 45:
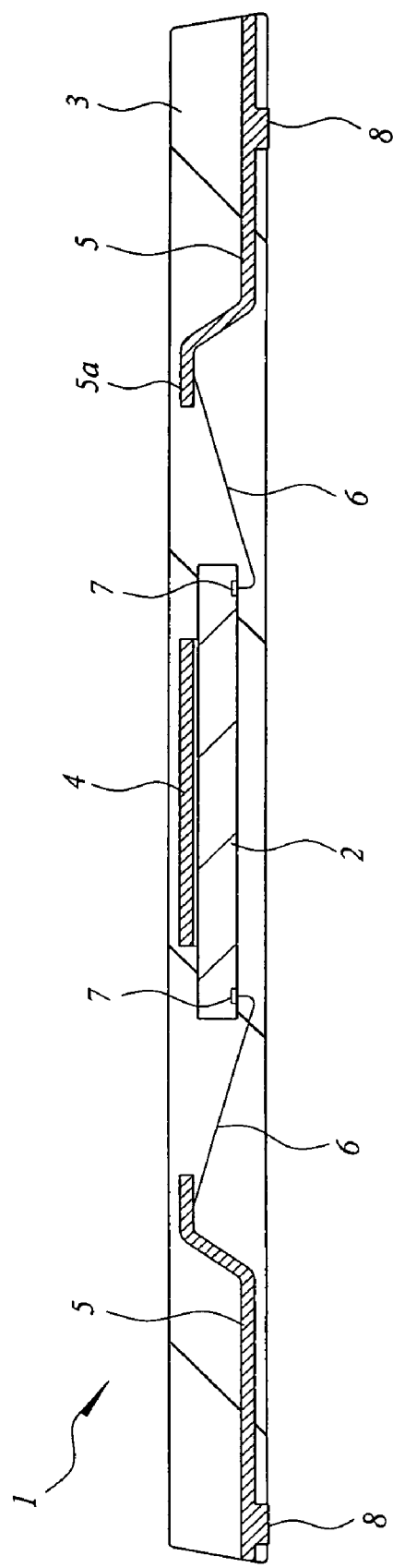
FIG. 45 is a sectional view of a semiconductor device according to another embodiment of the present invention.

FIG. 45 shows an example of the QFN 1 in which the lead tips 5a of the leads 5 are bent upward so that the height of the die pad 4 is made equal to those of the lead tips 5a of the leads 5, and the semiconductor die 2 is mounted on the lower surface of the die pad 4 by using the face down bonding. In this structure, the thickness of the resin between the upper surfaces of the lead tips 5a of the leads 5 and the die pad 4 and that of the plastic package 3 can be made extremely thin. Therefore, an ultra-thin type QFN having the plastic package 3 with a thickness of 0.5 mm can be realized.

Figure 46:
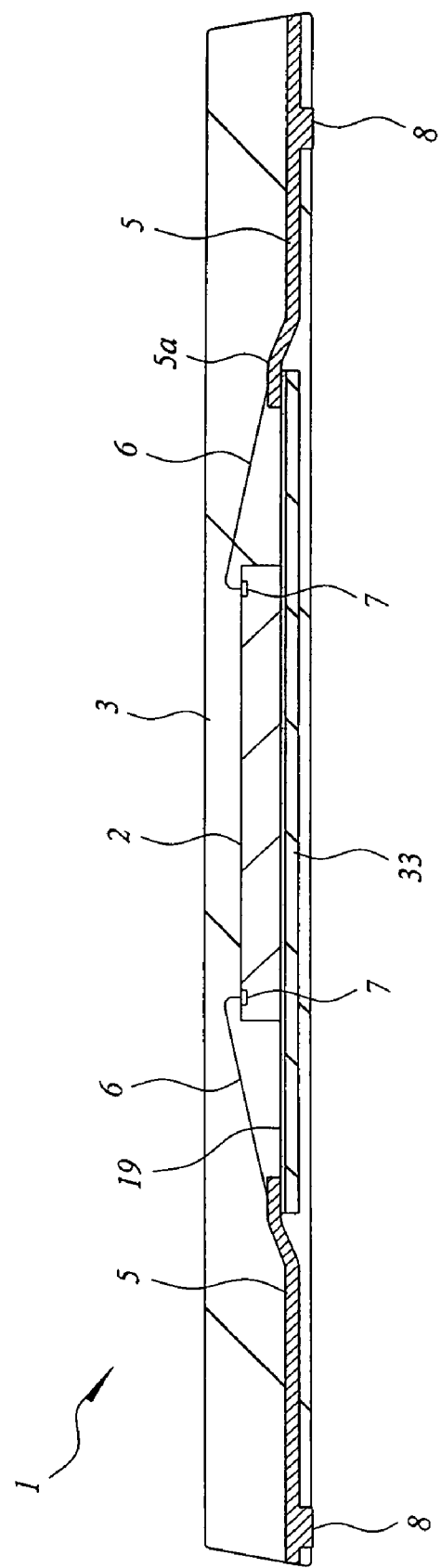
FIG. 46 is a sectional view of a semiconductor device according to another embodiment of the present invention.
Figure 47:
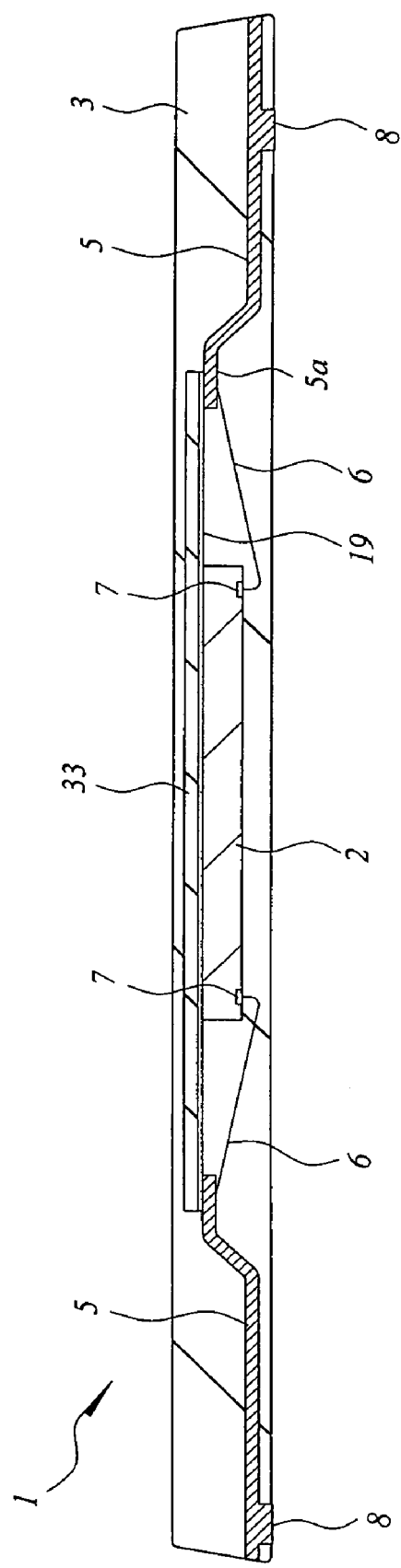
FIG. 47 is a sectional view of a semiconductor device according to another embodiment of the present invention.

As shown in FIGS. 46 and 47, the above-described method in which the lead tips 5a of the leads 5 are bent upward can be applied to the case where the lead frame $LF_2$ in which the die support 33 made from an insulating film is adhered to the lead tips 5a of the leads 5 is used. The die support 33 and the semiconductor die 2 are adhered via an adhesive 19 formed on, for example, one surface of the die support 33. Also in this case, it is possible to reduce the thickness of the plastic package 3 because of the reasons described above.

Figure 48:
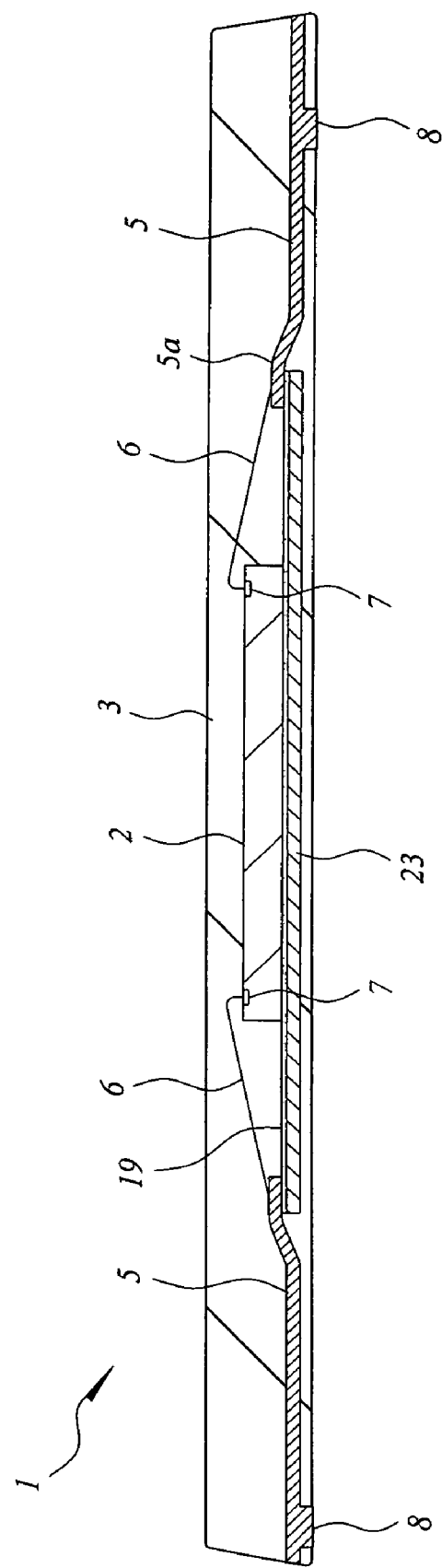
FIG. 48 is a sectional view of a semiconductor device according to another embodiment of the present invention.
Figure 49:
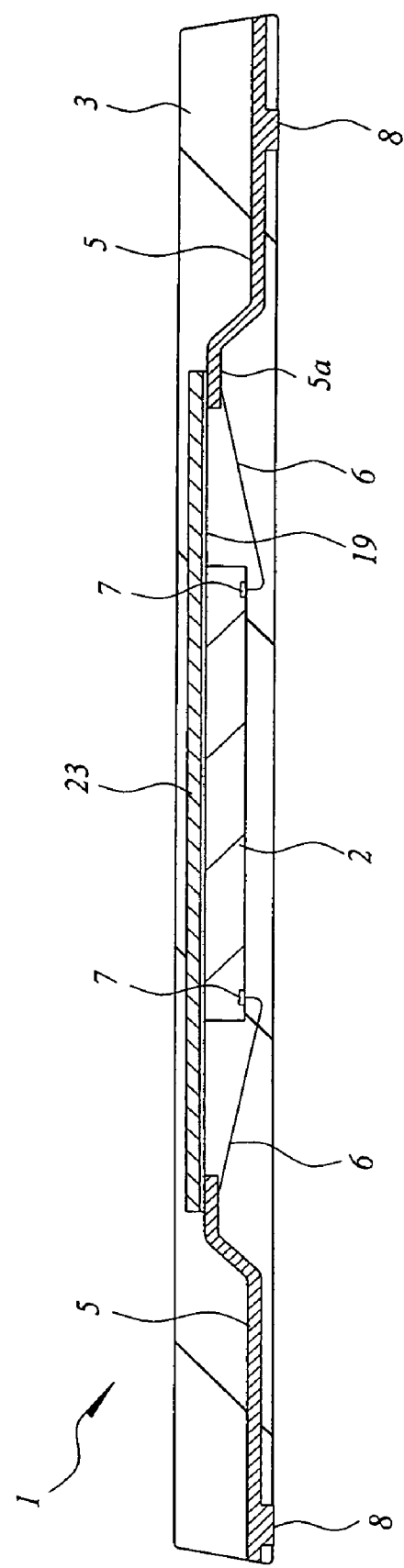
FIG. 49 is a sectional view of a semiconductor device according to another embodiment of the present invention.

FIGS. 48 and 49 show an example in which the die support is constituted by the use of a heat spreader 23 made of a material with high heat conductivity such as Cu and Al. Since the heat spreader 23 also functions as the die support, it is possible to realize the QFN having good heat radiation characteristics. In addition, in the case where the die support is constituted by the use of the heat spreader 23, it is possible to expose one surface of the heat spreader 23 on the surface of the plastic package 3 as shown in FIG. 50. By doing so, the heat radiation characteristics of the QFN can be further improved.

Note that, this embodiment is applied to the QFN having the terminals 8 formed by the half etching of the lead frame. However, it is needless to say that the application is not limited to this, and this embodiment can be applied to the various QFN having the terminals formed in accordance with the various methods described above.

Eighth Embodiment

Figure 51:
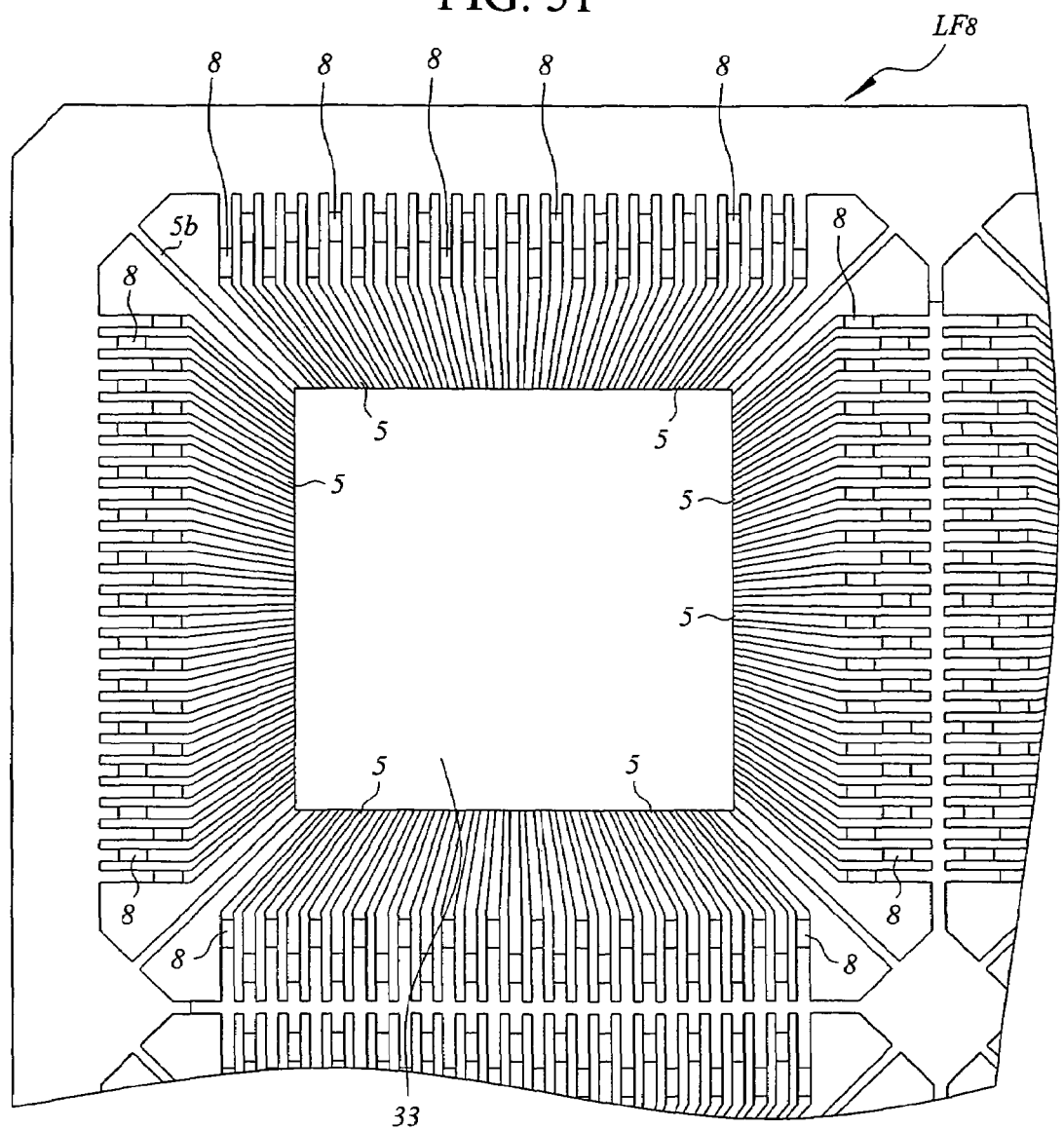
FIG. 51 is a plan view of the principal part of a lead frame used in the manufacturing method of a semiconductor device according to another embodiment of the present invention.
Figure 52:
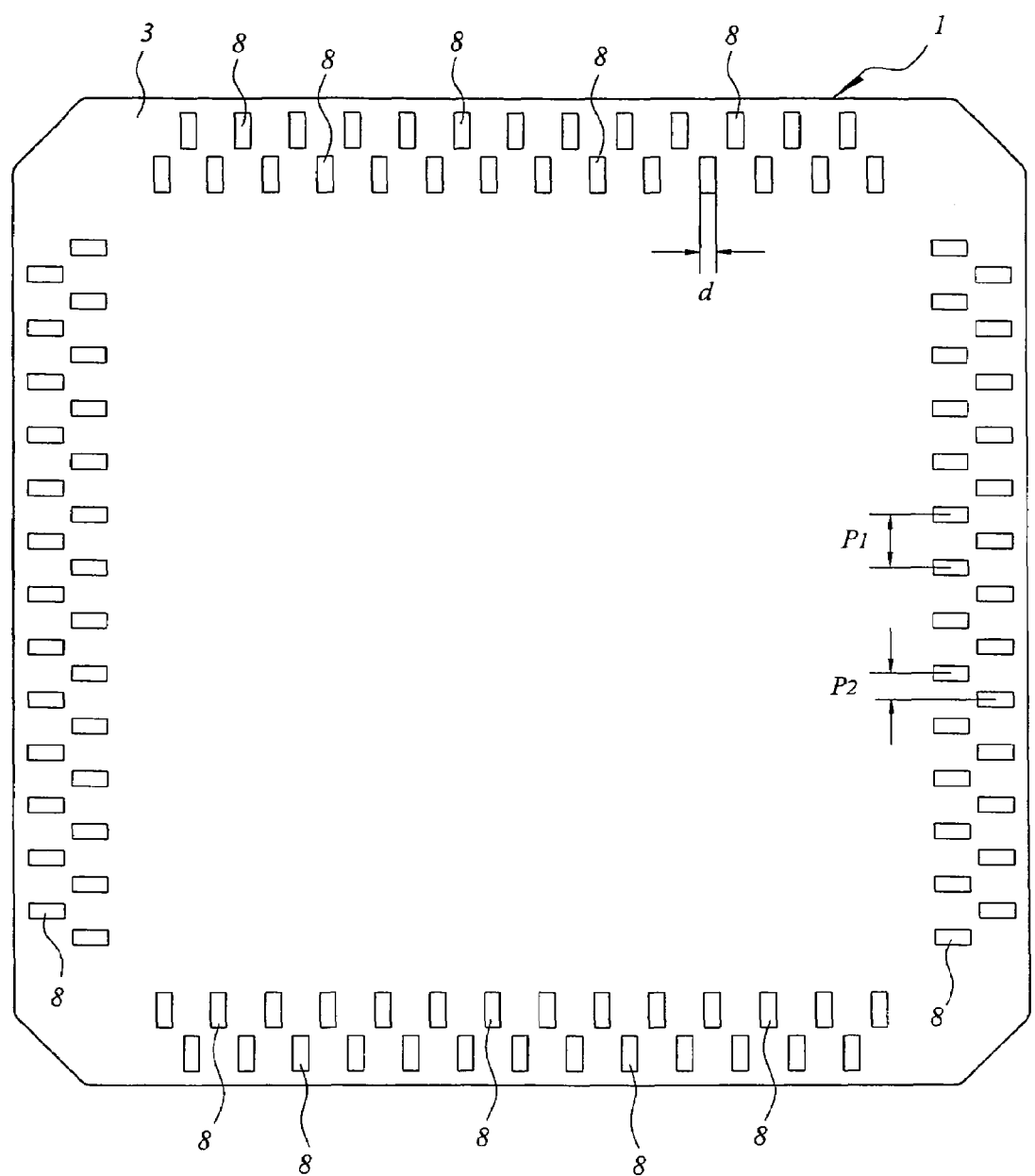
FIG. 52 is a plan view of an outward appearance (rear surface side) of a semiconductor device according to another embodiment of the present invention.

FIG. 51 is a plan view of a part of a lead frame $LF_8$ used in the manufacture of the QFN. FIG. 52 is a plan of an outward appearance (rear surface side) of the QFN manufactured by the use of the lead frame $LF_8$.

If the number of pins used in the QFN is increased while the package size of the QFN remains unchanged, the interval between the terminals 8 becomes extremely narrow. Therefore, if it is intended to make the width of the terminal 8 larger than that of the lead 5 like in the lead frame $LF_1$ used in the first embodiment, the process of the lead frame becomes extremely difficult.

For preventing the occurrence of such a case, it is desirable to make the width of the terminals 8 equal to those of the leads 5 like in the lead frame $LF_8$ in this embodiment. By doing so, it is possible to realize the QFN in which the pitch between the terminals is narrow and the number of pins used therein is very large. For example, the width d of the terminal 8 and lead 5 is 0.15 to 0.18 mm, and the interval $P_1$ between the adjoining terminals 8 in the same line is 0.5 mm, and the interval $P_2$ between the interstitial terminals in different lines is 0.25 mm.

Figure 53:
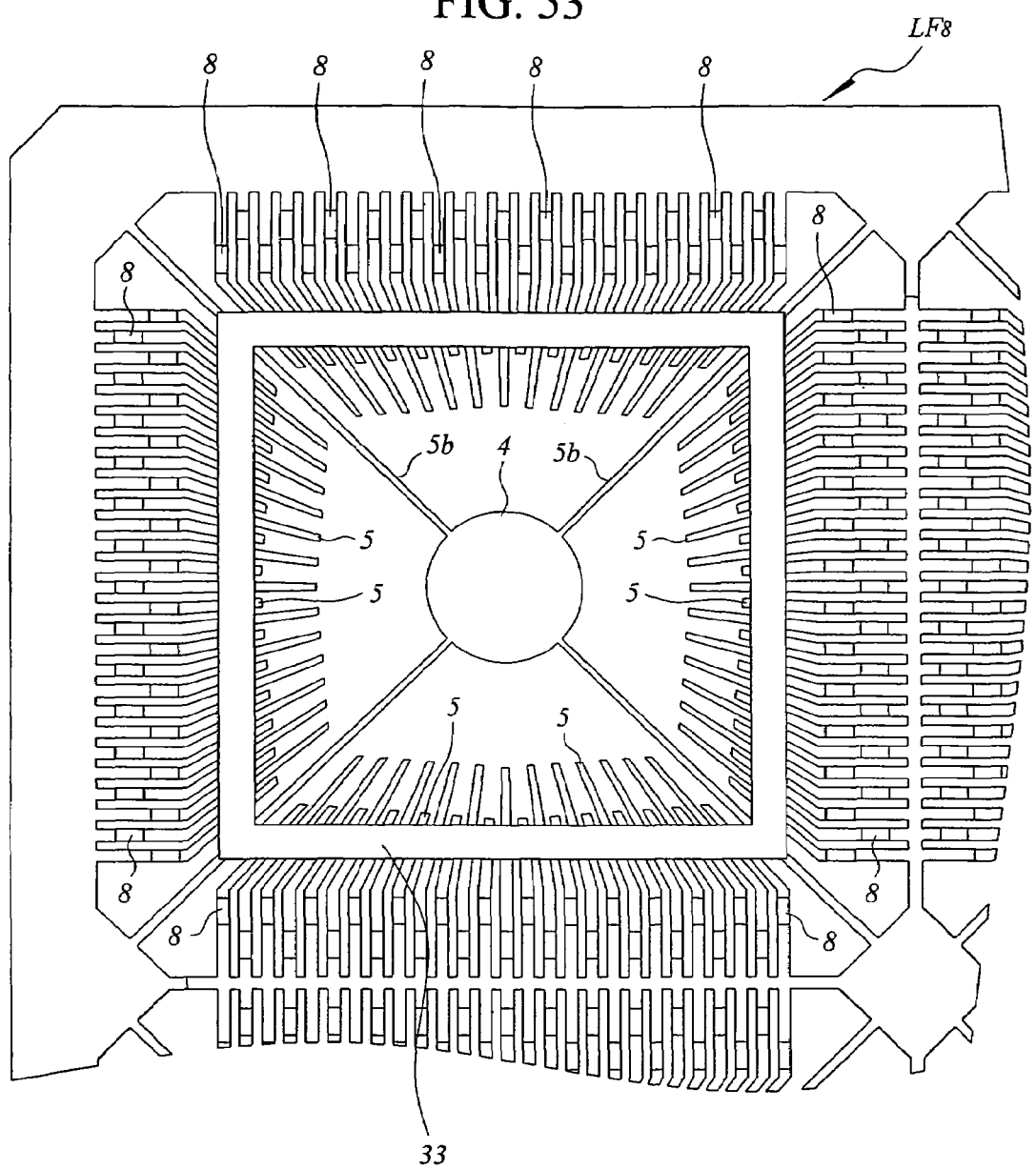
FIG. 53 is a plan view of the principal part of a lead frame used in the manufacturing method of a semiconductor device according to another embodiment of the present invention.
Figure 54:
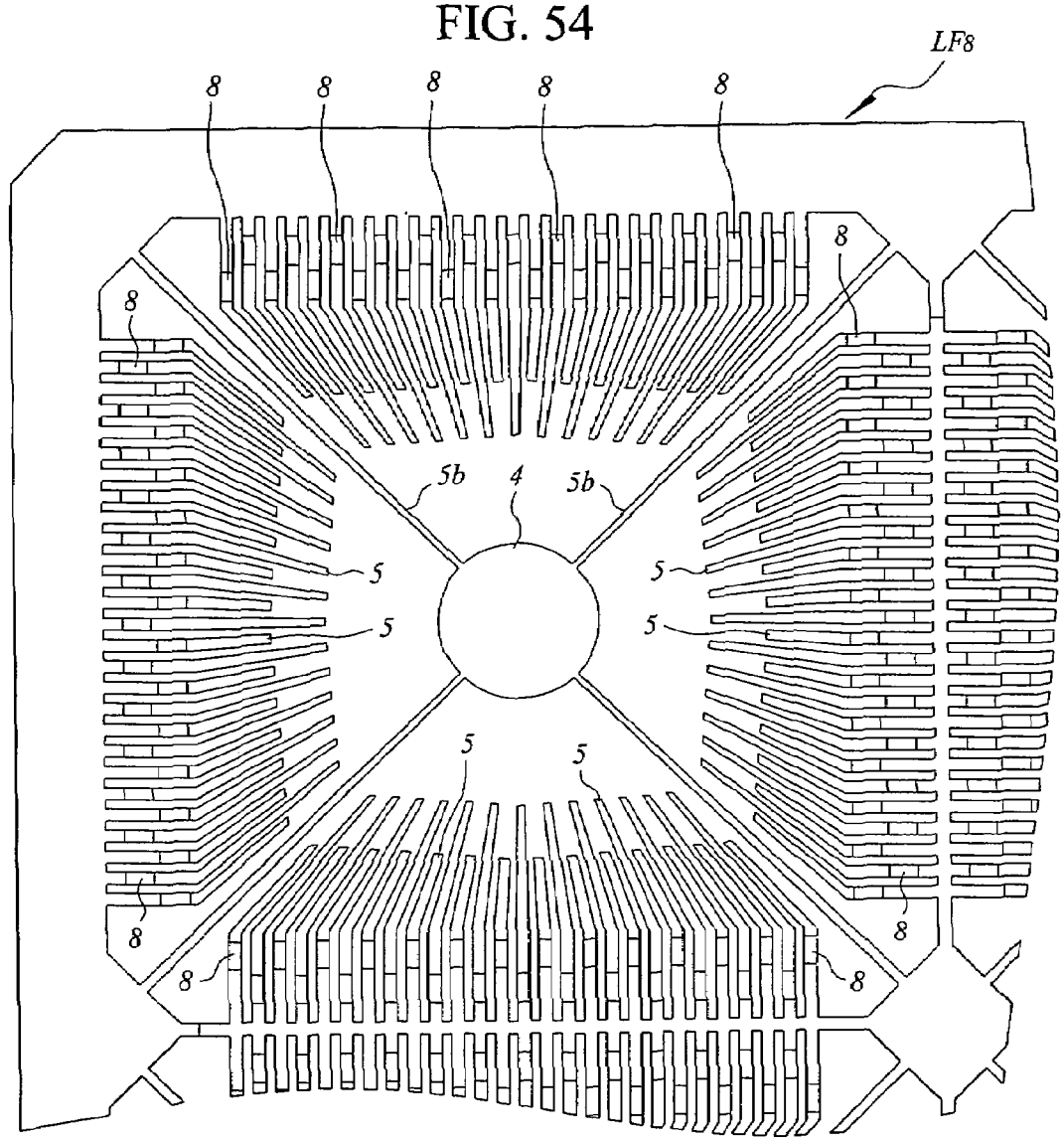
FIG. 54 is a plan view of the principal part of a lead frame used in the manufacturing method of a semiconductor device according to another embodiment of the present invention.
Figure 55:
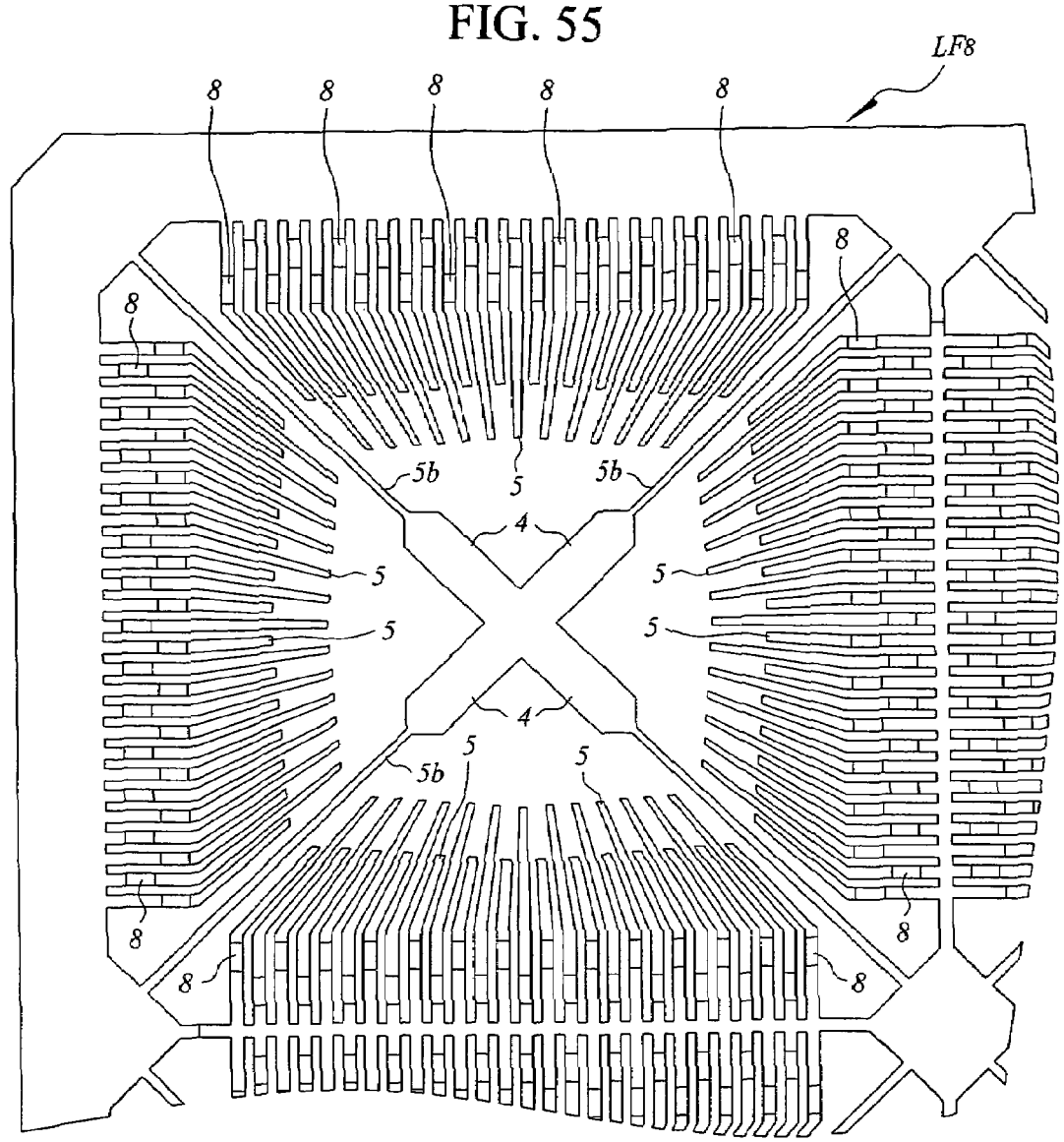
FIG. 55 is a plan view of the principal part of a lead frame used in the manufacturing method of a semiconductor device according to another embodiment of the present invention.

In this case, since the width of the terminal 8 becomes narrower, the size of the contact area between the terminal 8 and the mounting substrate is reduced, and thus, the connection reliability is deteriorated. Therefore, as compensation means thereof, it is desirable that the length of the terminal 8 is increased to prevent the reduction in size of the contact area. In addition, since the width of the lead 5 becomes narrower, the strength of the lead 5 is also reduced. Therefore, it is desirable that the die support 33 is adhered to the tip of the lead 5 and supports the lead 5 for the prevention of the deformation of the lead 5. The die support 33 can be provided in the middle portion of the lead 5 as shown in FIG. 53. As shown in FIGS. 54 and 55, the structure of the lead frame $LF_8$ in which the width of the terminal 8 and that of the lead 5 are made equal to each other can be of course applied to a lead frame not having the die support 33.

In the foregoing, the invention made by the inventors of this invention has been described in detail based on the embodiments. However, it goes without saying that the present invention is not limited to the above-described embodiments, and various changes and modifications of the invention can be made without departing from the spirit and scope of the invention.

For example, in the case described in the first embodiment where a plurality of semiconductor dies 2 mounted on one lead frame $LF_1$ are simultaneously resin-encapsulated by the use of the molding die 40, the lead frame $LF_1$ before dicing may be warped or deformed due to the difference in the thermal expansion coefficient between the lead frame $LF_1$ and the molding resin.

Figure 56:
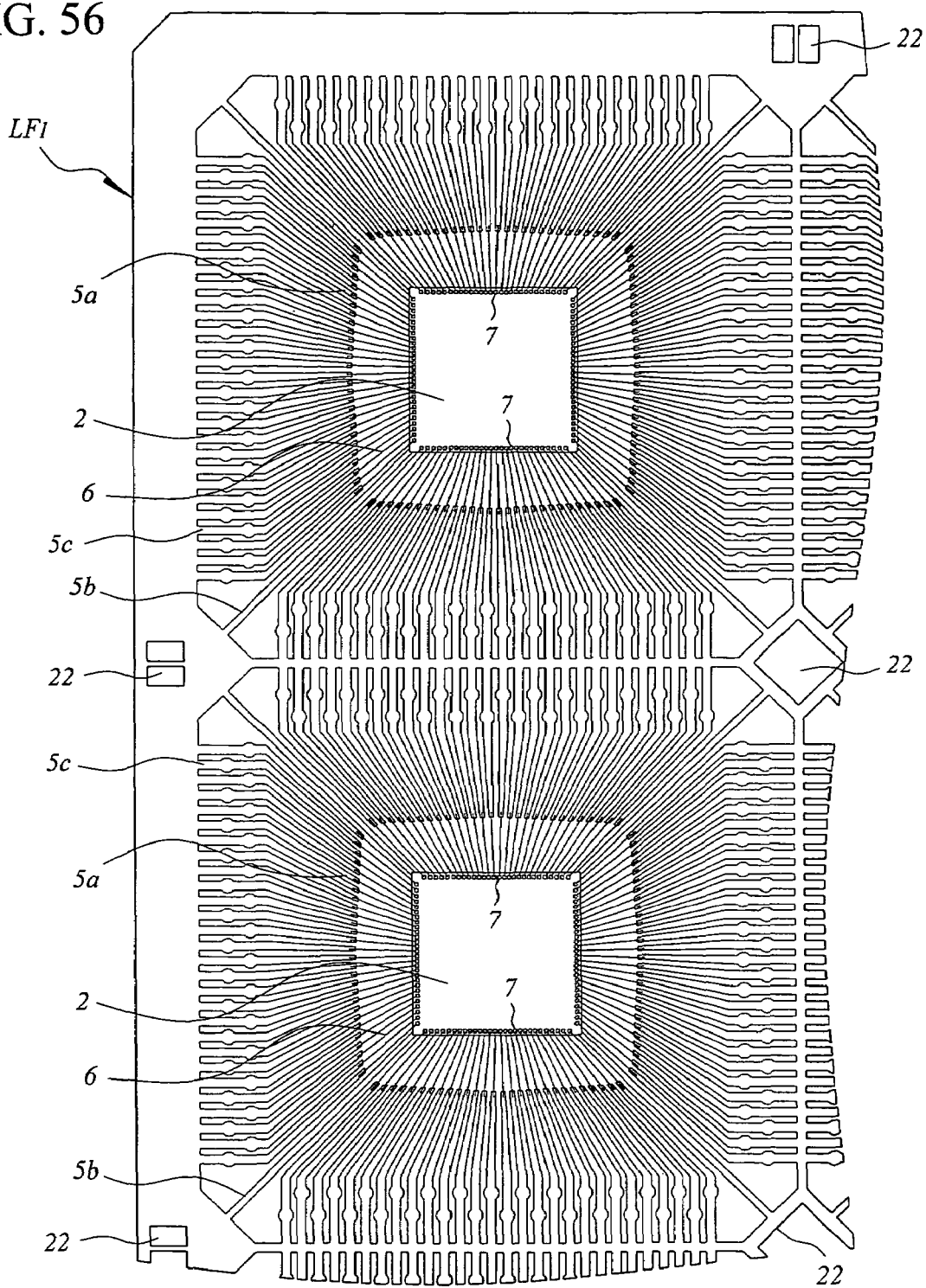
FIG. 56 is a plan view of the principal part of a lead frame used in the manufacture of a semiconductor device according to another embodiment of the present invention.

For its prevention, it is effective to provide slits 22 on the outer frame part of the lead frame $LF_1$ as shown in FIG. 56. It is also effective to change the amount of filler or the like contained in the molding resin that constitutes the plastic package 3 so as to control the thermal expansion coefficient of the plastic package 3 close to that of the lead frame $LF_1$.

Figure 57:
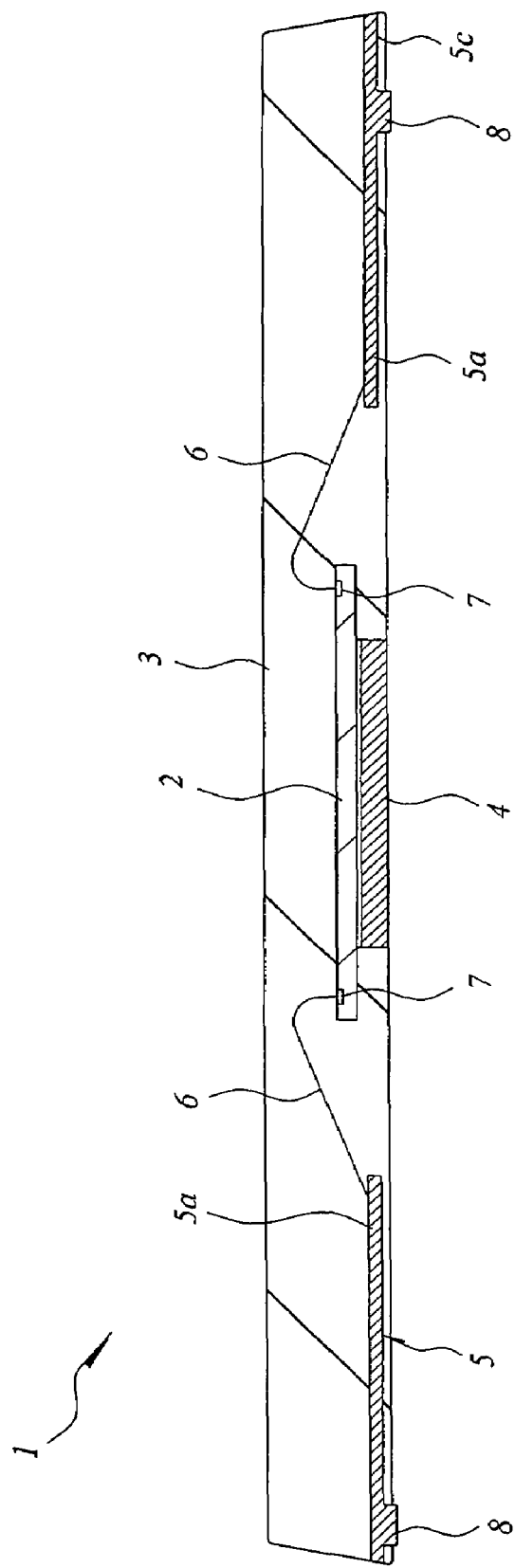
FIG. 57 is a sectional view of a semiconductor device according to another embodiment of the present invention.
Figure 58:
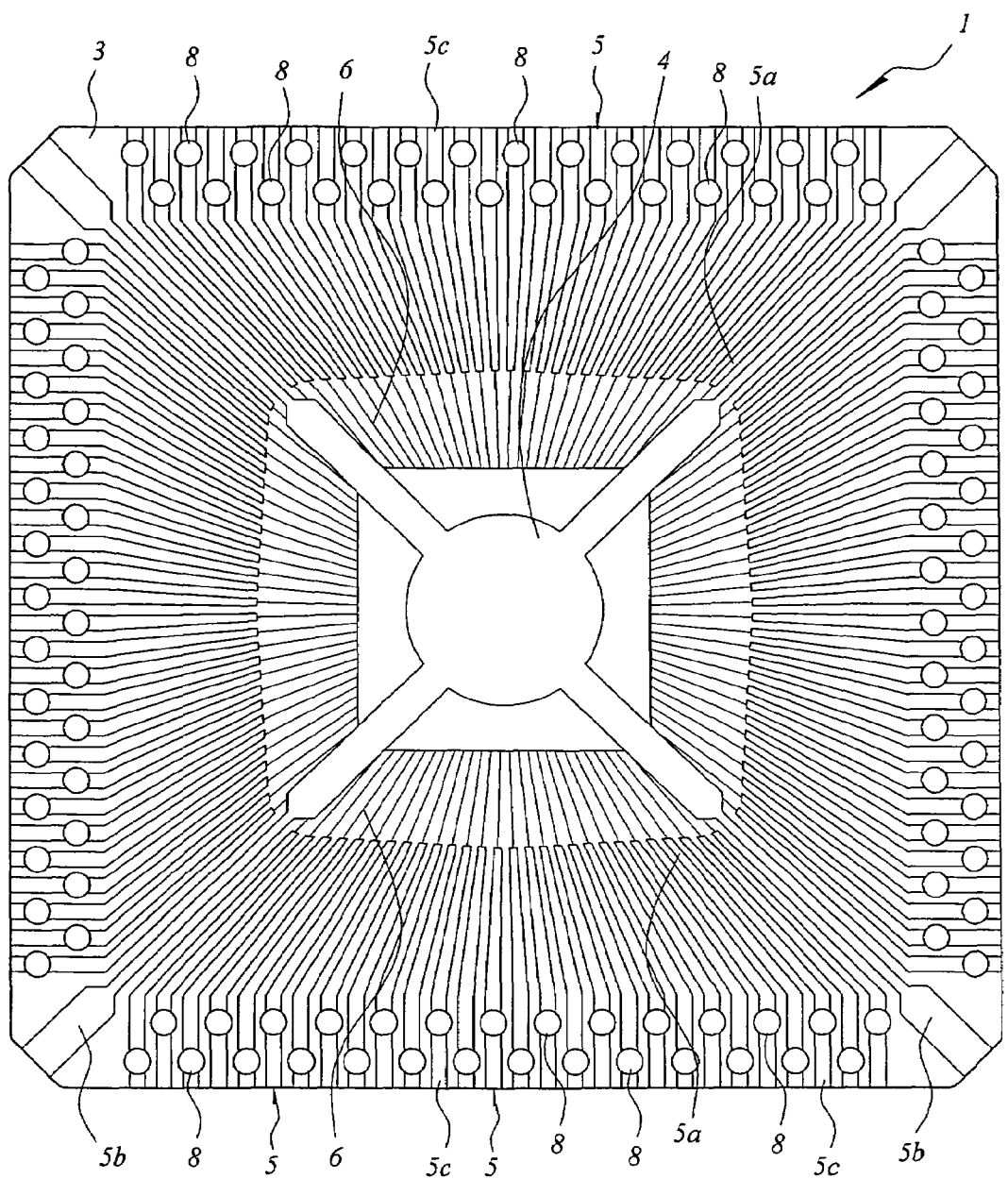
FIG. 58 is a plan view of an internal structure (rear surface side) of a semiconductor device according to another embodiment of the present invention.

Also, it is possible to realize the QFN 1 with high heat radiation characteristics by forming the die pad 4 exposed on the rear surface of the plastic package 3 as shown in FIG. 57. For forming the die pad 4 exposed on the rear surface of the plastic package 3, it is required to form a thick die pad 4 by coating the die pad 4 with a photoresist film when a thick metal sheet 10 is subjected to the half etching to form the thin leads 5 and the thin die pad supports 5b.

Also, the thin die pad 4, the thin leads 5 and the thin die pad supports 5b are formed by the half etching of the thick metal sheet 10 in the first embodiment. However, the strength of the die pad supports 5b becomes insufficient in some cases when a relatively large semiconductor die 2 is mounted on the thin die pad supports 5b. For preventing the occurrence of such a case, it is effective to form the die pad supports 5b having a large thickness without performing the half etching of the part or all of the die pad supports 5b. In this case, since the part of (or all of) the die pad supports 5b are exposed on the rear surface of the plastic package 3, the connection reliability between the QFN 1 and the wiring board and the heat radiation characteristics of the QFN 1 can be improved by soldering the exposed portion to the wiring board.

Figure 59:
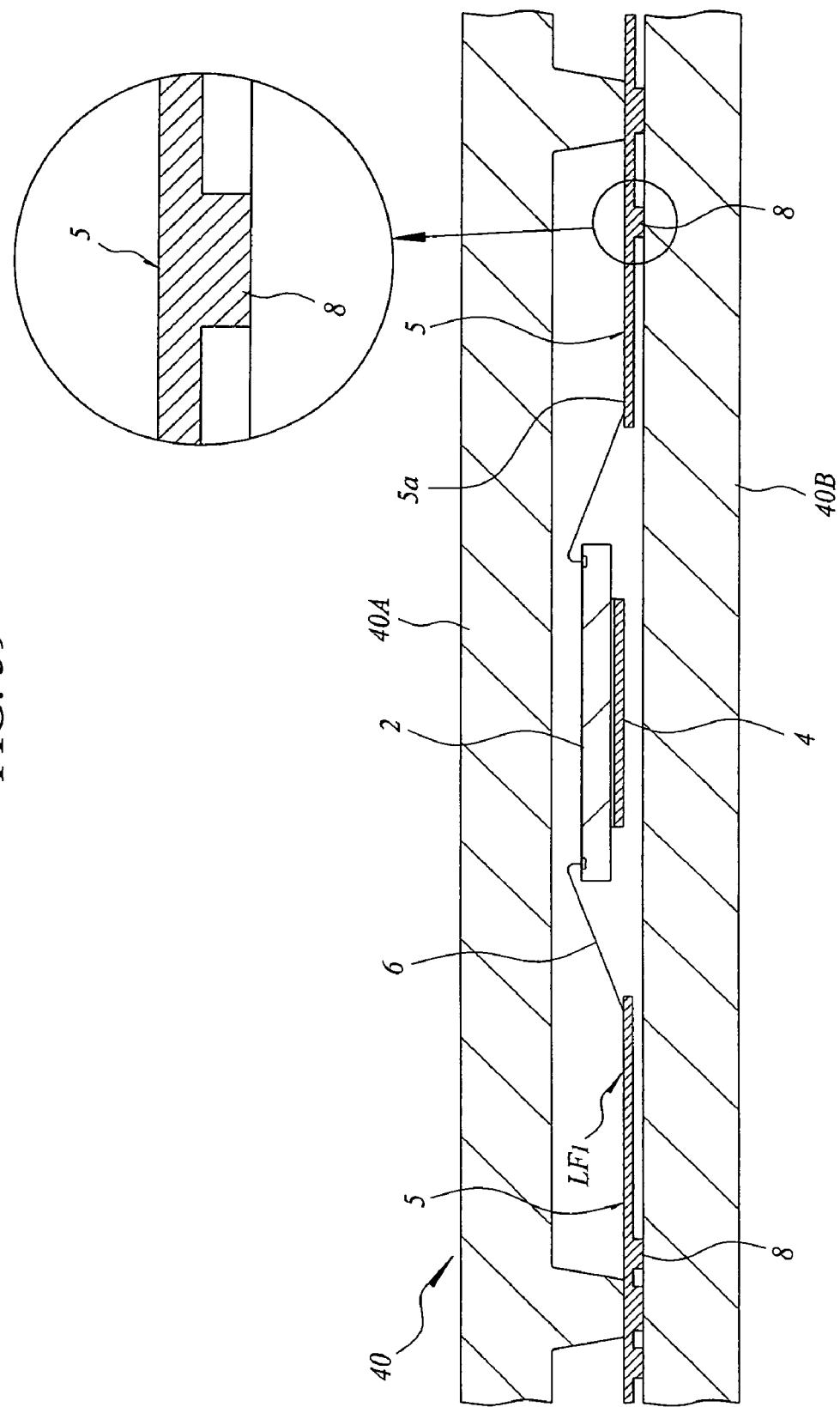
FIG. 59 is a sectional view of the principal part of a molding die for illustrating the manufacturing method of a semiconductor device according to another embodiment of the present invention.
Figure 60A:
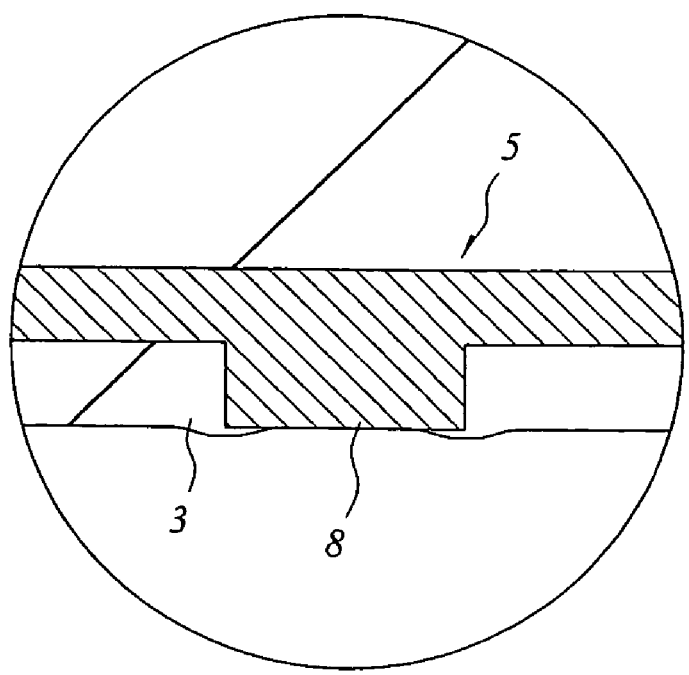
FIG. 60A is a partially enlarged sectional view of a plastic package separated from a molding die.
Figure 60B:
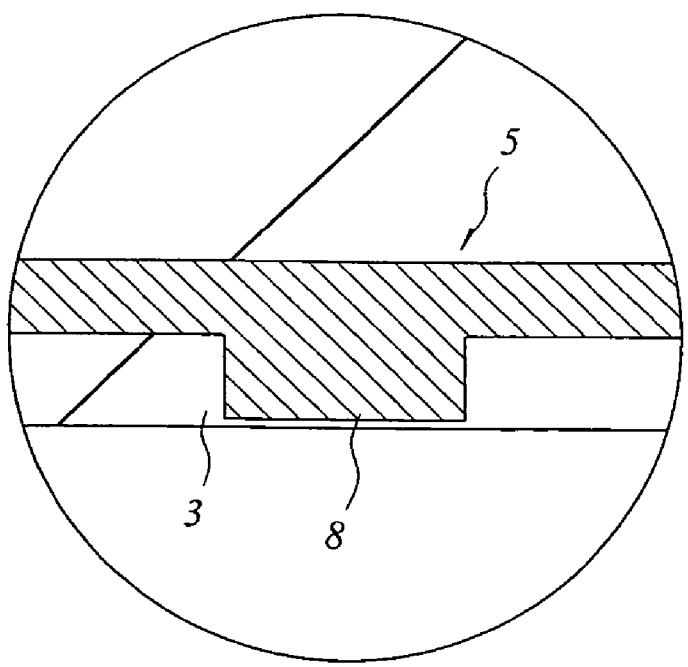
FIG. 60B is a partially enlarged sectional view of a plastic package separated from a molding die.
Figure 61:
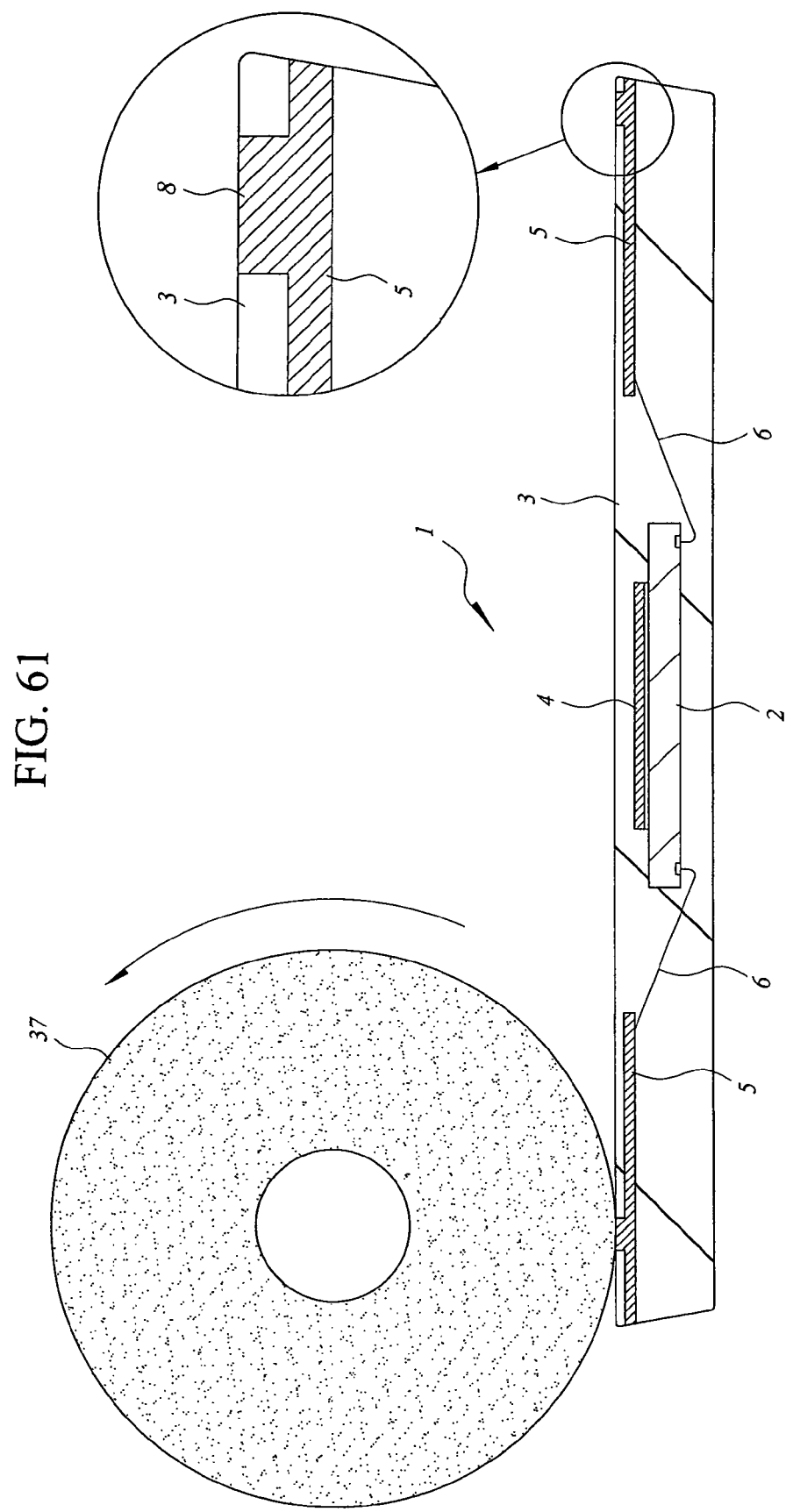
FIG. 61 is a sectional view for illustrating the manufacturing method of a semiconductor device according to another embodiment of the present invention.

Also, in the above-described embodiments, the molding method in which the resin film 41 is interposed between the molding die 40 (upper die 40A and lower die 40B) is used to form the plastic package 3. However, it is also possible to form the plastic package 3 in accordance with the molding method not using the resin film 41 as shown in FIG. 59. In this case, a part of the terminal 8 or the entire of the terminal 8 is covered with the resin in some cases as shown in FIGS. 60A and 60B when the plastic package 3 is separated from the molding die 40. Therefore, it is required to remove the resin burr on the surface of the terminal 8 by the use of a burr removal means 37 such as a grinder as shown in FIG. 61, and then, the metal layer is formed on the surface of the terminal 8 by the above-described printing method and the electroplating method.

The advantages achieved by the typical ones of the inventions disclosed in this application will be briefly described as follows.

Since lead tips on one side of a plurality of leads arranged around a semiconductor die are extended to a position close to a die pad, it is possible to reduce lengths of wires that connect the leads and bonding pads. Therefore, even if the pitch between the leads or the interval between the wires is narrowed due to the increase of the number of pins in use, it is possible to reduce the occurrence of defects such as short-circuit between the wires during the manufacturing process. As a result, it is possible to achieve the increase of the number of pins used in the QFN.

Appendix:

The typical ones of the inventions disclosed in the embodiments will be briefly described as follows.

1. A semiconductor device, comprising: a semiconductor die; a die pad on which the semiconductor die is mounted; a plurality of leads arranged around the semiconductor die; a plurality of wires for electrically connecting the semiconductor die and the leads; and a plastic package for encapsulating the semiconductor die, the die pad, the plurality of leads, and the plurality of wires, wherein the plurality of leads are formed so that intervals between the lead tips on one side near the semiconductor die are narrower than those between the lead tips on the other side opposite to the one side, and a terminal protruded from a rear surface of the plastic package to the outside is selectively provided to each of the plurality of leads.

2. The semiconductor device according to the above item 1, wherein the terminal is constituted of a part of the lead protruded from the rear surface of the plastic package to the outside.

3. The semiconductor device according to the above item 1, wherein the terminal is made of a conductive material which is different from that of the lead.

4. The semiconductor device according to the above item 1, wherein a rear surface of the die pad is exposed from the rear surface of the plastic package.

5. The semiconductor device according to the above item 1, wherein the terminals are arranged in two lines along each side of the plastic package in a zigzag pattern.

6. The semiconductor device according to the above item 5, wherein, of the plurality of leads, leads on which the terminals are arranged closer to the one side have a width larger than that of leads on which the terminals are arranged closer to the other side.

7. The semiconductor device according to the above item 1, wherein an area of the die pad is smaller than that of the semiconductor die.

8. The semiconductor device according to the above item 1, wherein the die pad is supported by a plurality of die pad supports.

9. A semiconductor device, comprising: a semiconductor die; a die pad support having a film shape on which the semiconductor die is mounted; a plurality of leads arranged around the semiconductor die; a plurality of wires for electrically connecting the semiconductor die and the leads; and a plastic package for encapsulating the semiconductor die, the die pad support, the plurality of leads, and the plurality of wires, wherein the plurality of leads are formed so that intervals between the lead tips on one side near the semiconductor die are narrower than those between the lead tips on the other side opposite to the one side, and a terminal protruded from a rear surface of the plastic package to the outside is electrically connected to each of the plurality of leads.

10. The semiconductor device according to the above item 9, wherein the die pad support is supported by the plurality of leads.

11. A method of manufacturing a semiconductor device, which comprises: a semiconductor die; a die pad on which the semiconductor die is mounted; a plurality of leads arranged around the semiconductor die; a plurality of wires for electrically connecting the semiconductor die and the leads; and a plastic package for encapsulating the semiconductor die, the die pad, the plurality of leads, and the plurality of wires, the method comprising the steps of:

(a) preparing a lead frame on which patterns including the die pad and the plurality of leads are successively formed, and a terminal protruded in a direction perpendicular to a surface of the lead is formed on each of the surfaces of the plurality of leads;

(b) mounting a semiconductor die on each of the plurality of die pads formed on the lead frame, and connecting the semiconductor die and the parts of the leads by the use of wires;

(c) preparing a molding die having an upper die and a lower die, coating a surface of the lower die with a resin film, and then, mounting the lead frame on the resin film, thereby bringing the terminal formed on the surface of the lead into contact with the resin film;

(d) pressing the resin film and the lead frame with the upper die and the lower die to push tip portions of the terminals into the resin film;

(e) injecting resin into spaces between the upper and lower dies, thereby encapsulating the semiconductor die, the die pad, the leads, and the wires, and separating the lead frame from the molding die after forming a plurality of plastic packages in which the tip portions of the terminals are protruded to the outside; and (f) dicing the lead frame to obtain pieces of plastic packages.

12. The method of manufacturing a semiconductor device according to the above item 11, wherein the step (a) includes the step of coating a part of a metal sheet with a photoresist film, and performing etching of parts of the metal sheet not coated with the photoresist film, thereby forming the plurality of leads, the die pad, and the terminals.

13. The method of manufacturing a semiconductor device according to the above item 12, wherein the plurality of leads are formed by the half etching of the metal sheet.

14. The method of manufacturing a semiconductor device according to the above item 11, wherein the plurality of leads are formed so that intervals between the lead tips on one side near the die pad are narrower than those between the lead tips on the other side opposite to the one side.

15. The method of manufacturing a semiconductor device according to the above item 11, wherein the terminal formed in the step (a) is a dummy terminal, and, after the step (e), the method further comprises the steps of: removing the dummy terminal; and forming a terminal whose tip portion is protruded to the outside of the plastic package on a surface of the lead in the area where the dummy terminal has been removed.

16. The method of manufacturing a semiconductor device according to the above item 12, wherein, in the etching of the metal sheet in the step (a), an area on the metal sheet where the die pad is to be formed is not etched.

17. The method of manufacturing a semiconductor device according to the above item 12, wherein, in the etching of the metal sheet in the step (a), an area on the metal sheet which contacts to the molding die in the step (d) is not etched.

18. The method of manufacturing a semiconductor device according to the above item 11, wherein slits are provided in an outer frame of the lead frame.

19. The method of manufacturing a semiconductor device according to the above item 11, wherein the terminals are arranged in two lines along each side of the plastic package in a zigzag pattern.

20. The method of manufacturing a semiconductor device according to the above item 19, wherein, of the plurality of leads, a lead on which the terminal is arranged closer to the die pad has a width larger than that of a lead on which the terminal is arranged apart from the die pad.

21. The method of manufacturing a semiconductor device according to the above item 11, wherein a jig to support the lead frame in the step (b) is provided with grooves at positions corresponding to the tip portions of the terminals.

22. The method of manufacturing a semiconductor device according to the above item 11, wherein the upper molding die of the molding die used in the step (c) contacts to an outer frame part of the lead frame and to a connection part between the leads, and spaces other than those are used as cavities into which the resin is injected.

23. The semiconductor device according to the above item 1, wherein the lengths of the plurality of the lead tips on the one side are alternately changed.

24. The semiconductor device according to the above item 23, wherein bonding pads formed on a main surface of the semiconductor die are arranged in two lines along each side of the semiconductor die in a zigzag pattern.

25. The semiconductor device according to the above item 1 or 9, wherein lead tips of the plurality of leads on the one side are bent in a thickness direction of the plastic package.

26. The semiconductor device according to the above item 1 or 9, wherein a diameter of the terminal is larger than a width of the lead.

27. The semiconductor device according to the above item 1 or 9, wherein a diameter of the terminal is equal to a width of the lead.

28. The semiconductor device according to the above item 9, wherein the die support is a heat spreader.

What is claimed:

1. A method of manufacturing a semiconductor device comprising the steps of:

(a) providing a lead frame formed with a plurality of patterns, wherein each of the plurality of patterns has a die pad and a plurality of leads arranged around the die pads;

(b) mounting a plurality of semiconductor chips over the plurality of die pads, respectively;

(c) electrically connecting each of the plurality of semiconductor chips and a corresponding plurality of leads through a plurality of wires, respectively;

(d) after the step (c), clamping a part between the plurality of patterns adjacent thereto by an upper molding die and a lower molding die, and injecting resin into a plurality of cavities through a connecting portion to form a plurality of resin sealing members, wherein the plurality of cavities and the connecting portion are formed on one of the upper molding die and the lower molding die;

wherein the plurality of cavities are corresponding to the plurality of patterns, respectively;

wherein the connecting portion is formed between the plurality of cavities adjacent thereto;

wherein the connecting portion is not clamped by the upper molding die and the lower molding die;

wherein one of the plurality of resin sealing members is connected to another resin sealing member via a jointing portion; and wherein the jointing portion is formed at a portion corresponding to the connecting portion; and (e) after the step (d), cutting the lead frame and the plurality of resin sealing members with a dicer to divide the plurality of resin sealing members into individual pieces.

2. A method of manufacturing a semiconductor device according to claim 1, wherein the lead frame has a terminal formed on each of the plurality of leads, and contact portion which forms a point contact with the upper molding die, the contact portion formed with the same thickness as the terminal, and wherein in the step (e), cutting is effected between the terminal and contact portion with the dicer to divide the plurality of resin sealing members into individual pieces.

3. A method of manufacturing a semiconductor device according to claim 2, wherein in the lead frame, a half-etching process is performed except at the terminal and the contact portion.

4. A method of manufacturing a semiconductor device according to claim 1, wherein in the step (d), the plurality of resin sealing members are arrayed.

5. A method of manufacturing a semiconductor device according to claim 1, wherein in the step (d), the plurality of resin sealing members are arrayed side-by-side as plural groups of serially arranged resin sealing members.

6. A method of manufacturing a semiconductor device according to claim 1, wherein at outside of the plurality of cavities, a plurality of gate portions are formed at one end side of the upper molding die, a plurality of dummy cavities and a plurality of air vents are formed at another, opposing side to the one end side of the upper molding die.

7. A method of manufacturing a semiconductor device according to claim 6, wherein the pluralities of gate portions and air vents are distributed as plural groups of gate portions and plural groups of air vents, respectively, each group of gate portions, a corresponding group of air vents and one of said dummy cavities are associated with a group of serially arranged resin sealing members, the plurality of resin sealing members being arrayed side-by-side as plural groups of serially arranged resin sealing members.

8. A method of manufacturing a semiconductor device according to claim 7, wherein each group of gate portions contains a pair of gates and each group of air vents contains a pair of air vents.

9. A method of manufacturing a semiconductor device according to claim 1, wherein the lead frame has a plurality of suspension leads, a projection formed on each of the plurality of suspension leads, and a contact portion formed as a point contact with the upper molding die, one end portion of each of the plurality of suspension leads is connected to the die pad, and the contact portion is formed with the same thickness as the projection, and wherein in the step (e), cutting is effected between the projection and contact portion with the dicer to divide the plurality of resin sealing members into individual pieces.

10. A method of manufacturing a semiconductor device according to claim 9, wherein in the lead frame, a process of half-etching is performed except at the projection and the contact portion.

* * * * *